US012062680B2

(12) United States Patent
Igarashi

(10) Patent No.: US 12,062,680 B2
(45) Date of Patent: Aug. 13, 2024

(54) SOLID-STATE IMAGING DEVICE, ELECTRONIC APPARATUS, AND METHOD FOR PRODUCING SOLID-STATE IMAGING DEVICE

(71) Applicant: SONY SEMICONDUCTOR SOLUTIONS CORPORATION, Kanagawa (JP)

(72) Inventor: Koichi Igarashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 625 days.

(21) Appl. No.: 17/250,239

(22) PCT Filed: May 16, 2019

(86) PCT No.: PCT/JP2019/019538
§ 371 (c)(1),
(2) Date: Dec. 21, 2020

(87) PCT Pub. No.: WO2020/003796
PCT Pub. Date: Jan. 2, 2020

(65) Prior Publication Data
US 2021/0273000 A1  Sep. 2, 2021

(30) Foreign Application Priority Data

Jun. 29, 2018 (JP) .................... 2018-124631

(51) Int. Cl.
*H01L 31/0232* (2014.01)
*H01L 27/146* (2006.01)

(52) U.S. Cl.
CPC .. *H01L 27/14632* (2013.01); *H01L 27/14618* (2013.01); *H01L 27/14636* (2013.01); *H01L 27/14687* (2013.01)

(58) Field of Classification Search
CPC ..... H01L 21/56; H01L 21/6835; H01L 24/19; H01L 24/24; H01L 2224/32225;
(Continued)

(56) References Cited

U.S. PATENT DOCUMENTS 7,833,810 B2 * 11/2010 Lin ................... H01L 27/14618
438/33
7,919,348 B2 * 4/2011 Akram ............. H01L 27/14636
257/E31.117
(Continued)

FOREIGN PATENT DOCUMENTS

CN  1830094 A  9/2006
CN  105793988 A * 7/2016 ....... H01L 27/14618
(Continued)

OTHER PUBLICATIONS

International Search Report and Written Opinion of PCT Application No. PCT/JP2019/019538, issued on Jul. 30, 2019, 11 pages of ISRWO.

*Primary Examiner* — Samuel Park
(74) *Attorney, Agent, or Firm* — CHIP LAW GROUP

(57) ABSTRACT

A package structure that includes a cavity between a solid-state imaging element and a cover member prevents damage caused due to an increase in the internal pressure in the cavity, for example, upon reflow. A solid-state imaging device includes a solid-state imaging element that includes a semiconductor substrate and of which a light-receiving side is a side of one of plate surfaces of the semiconductor substrate; a translucent cover member that is provided on the light-receiving side of the solid-state imaging element, and a support that is provided on the light-receiving side of the solid-state imaging element, and supports the cover member. The semiconductor substrate further includes a concave portion that is formed on another of the plate surfaces of the semiconductor substrate.

11 Claims, 23 Drawing Sheets

(58) Field of Classification Search
CPC . H01L 2224/12105; H01L 2224/73267; H01L 2224/04105; H01L 27/00; H01L 27/14632; H01L 27/14618; H01L 2924/15153; H01L 2924/15311; H01L 2924/01078; H01L 2924/1461; H01L 2924/12042; H01L 31/0203; H01L 33/486; H01L 23/3185; H01L 23/498; H01L 27/1462; H01L 27/14636; H01L 27/14685; H01L 27/14687; H04N 25/00; H04N 25/70; H04N 25/76; B81C 1/00301; B81B 2207/096
USPC ...... 438/33, 51, 55, 64, 67, 68, 69; 257/290, 257/291, 632, 772, E23.026, E31.127, 257/E21.001, E21.221, E21.508, E31.119, 257/E31.124, E21.546, E21.598, E31.118, 257/E31.04, E31.099, E31.102

See application file for complete search history.

(56) References Cited

U.S. PATENT DOCUMENTS

| | | | | |
|---|---|---|---|---|
| 8,013,927 | B2* | 9/2011 | Takagi | H01L 27/14627 438/69 |
| 8,623,689 | B2* | 1/2014 | Chang | H01L 27/14636 438/67 |
| 8,790,950 | B2* | 7/2014 | Suzuki | H01L 27/14618 438/64 |
| 2005/0064622 | A1* | 3/2005 | Atobe | H01L 21/0332 438/69 |
| 2006/0180887 | A1* | 8/2006 | Ono | H01L 27/14618 257/E31.118 |
| 2007/0007556 | A1 | 1/2007 | Shibayama | |
| 2008/0108168 | A1* | 5/2008 | Yang | H01L 27/14687 257/E21.001 |
| 2009/0263927 | A1* | 10/2009 | Lin | H01L 27/14618 257/E21.546 |
| 2011/0115955 | A1* | 5/2011 | Okutani | H01L 27/14683 257/E31.124 |
| 2011/0156191 | A1* | 6/2011 | Lin | H01L 31/0203 257/E31.119 |
| 2012/0009716 | A1* | 1/2012 | Chang | H01L 27/14632 257/E21.001 |
| 2012/0050590 | A1* | 3/2012 | Suzuki | H01L 27/14618 257/E31.127 |
| 2012/0147207 | A1* | 6/2012 | Itonaga | H01L 27/14618 348/222.1 |
| 2012/0299140 | A1* | 11/2012 | Sekine | H01L 27/14607 257/E31.127 |
| 2013/0065348 | A1 | 3/2013 | Chang | |
| 2013/0127022 | A1* | 5/2013 | Chien | B81C 1/00301 257/632 |
| 2014/0004647 | A1* | 1/2014 | Oganesian | H01L 21/76898 438/109 |
| 2014/0065755 | A1* | 3/2014 | Oganesian | H01L 24/19 438/65 |
| 2014/0070411 | A1* | 3/2014 | Okada | H01L 23/564 257/737 |
| 2014/0284670 | A1 | 9/2014 | Kawashima | |
| 2016/0118506 | A1* | 4/2016 | Liu | H10N 10/82 438/66 |
| 2018/0044971 | A1* | 2/2018 | Veerasamy | E06B 3/66357 |
| 2022/0238567 | A1* | 7/2022 | Yokogawa | H01L 31/03762 |

FOREIGN PATENT DOCUMENTS

| | | | | |
|---|---|---|---|---|
| CN | 107851647 | A | | 3/2018 |
| CN | 107946336 | A * | 4/2018 | ....... H01L 27/14629 |
| JP | 06-283702 | A | | 10/1994 |
| JP | H06283701 | A | | 10/1994 |
| JP | H07-321251 | A | | 12/1995 |
| JP | H09-129767 | A | | 5/1997 |
| JP | 2004-296453 | A | | 10/2004 |
| JP | 2005101338 | A | | 4/2005 |
| JP | 2005142575 | A * | 6/2005 | ....... H01L 27/14618 |
| JP | 2005203708 | A | | 7/2005 |
| JP | 2008-047665 | A | | 2/2008 |
| JP | 2010-021451 | A | | 1/2010 |
| JP | 2011-077170 | A | | 4/2011 |
| JP | 2011-187482 | A | | 9/2011 |
| JP | 2012151200 | A | | 8/2012 |
| JP | 2012182243 | A | | 9/2012 |
| JP | 2015141107 | A | | 8/2015 |
| JP | 2015-192074 | A | | 11/2015 |
| TW | 201535699 | A * | 9/2015 | ....... H01L 27/14618 |
| WO | 2010/007714 | A1 | | 1/2010 |
| WO | WO-2015111419 | A2 * | 7/2015 | ....... H01L 27/14618 |
| WO | 2015/146332 | A1 | | 10/2015 |
| WO | WO-2017169755 | A1 * | 10/2017 | ............ G01N 21/64 |
| WO | WO-2018225191 | A1 * | 12/2018 | ......... B23K 35/3613 |

* cited by examiner

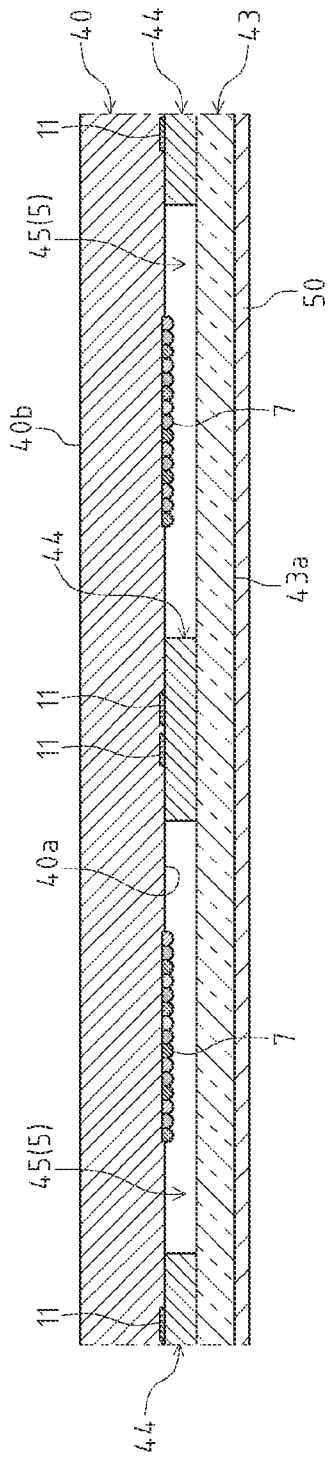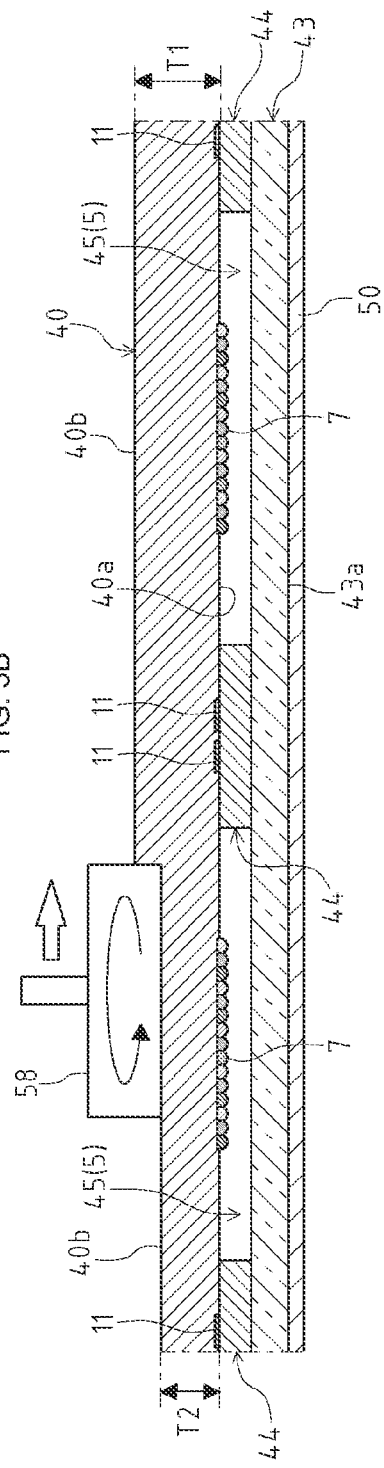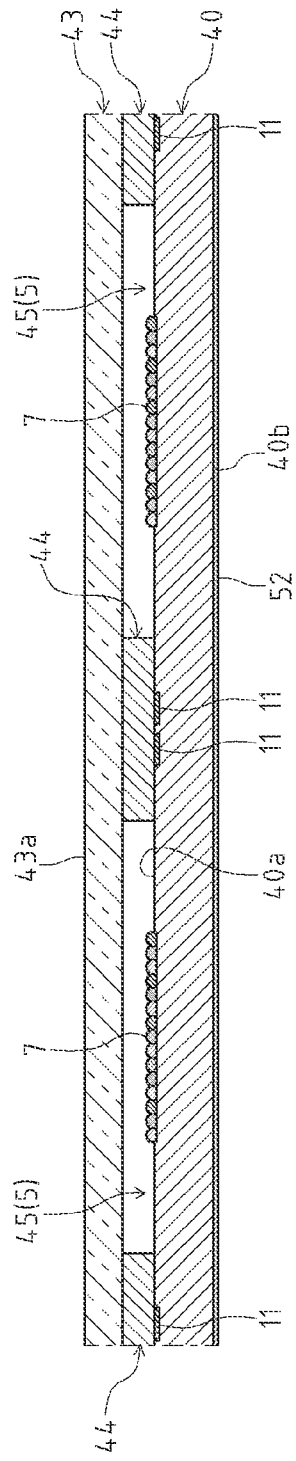

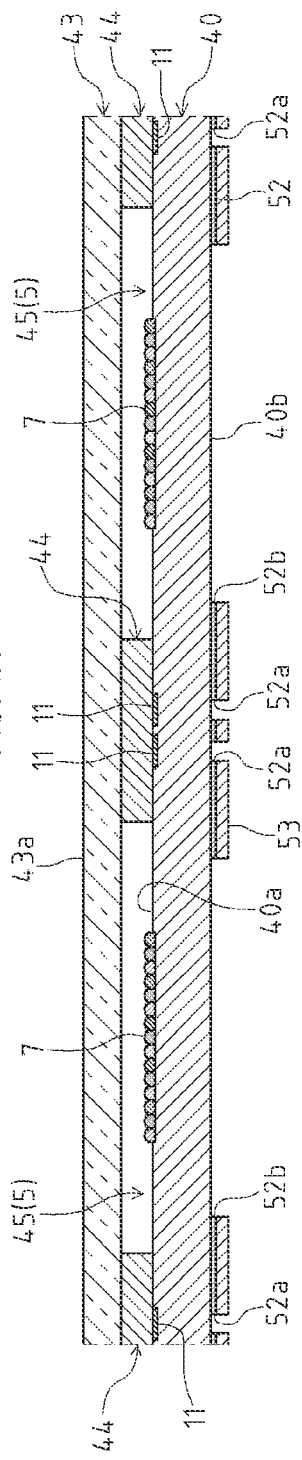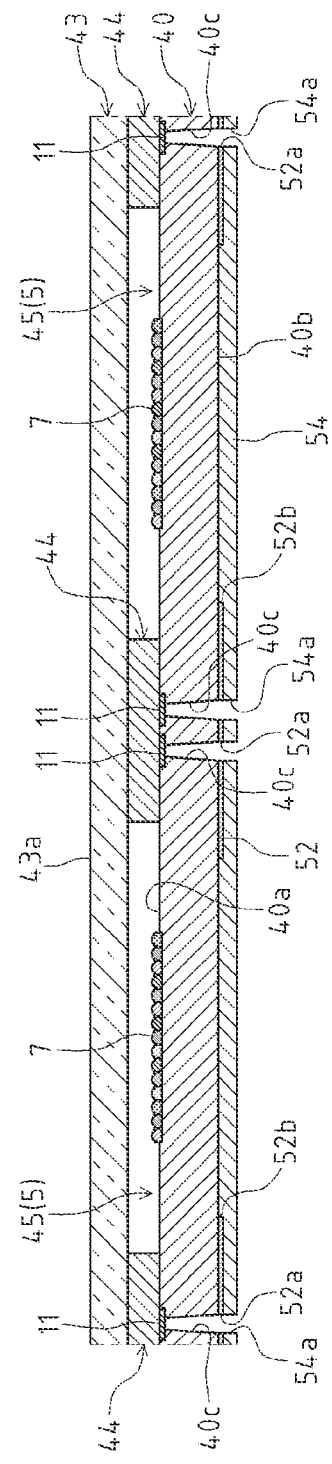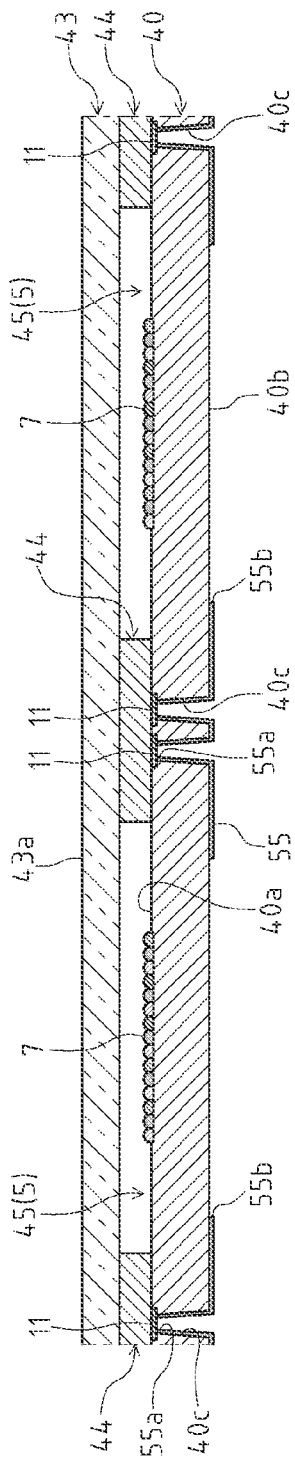

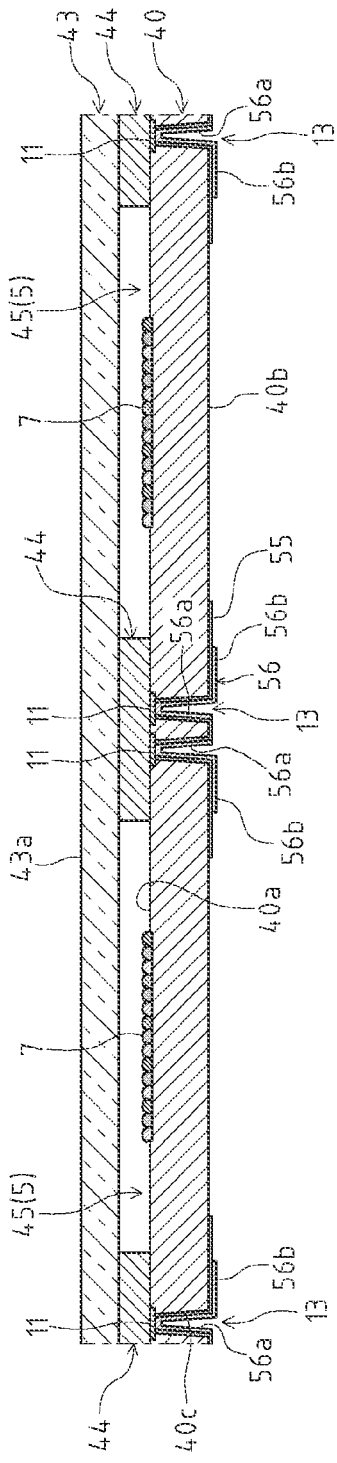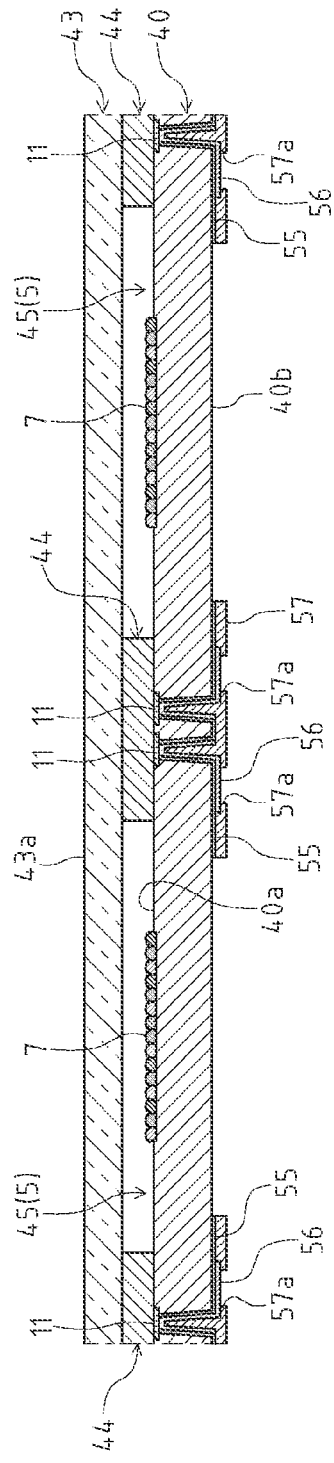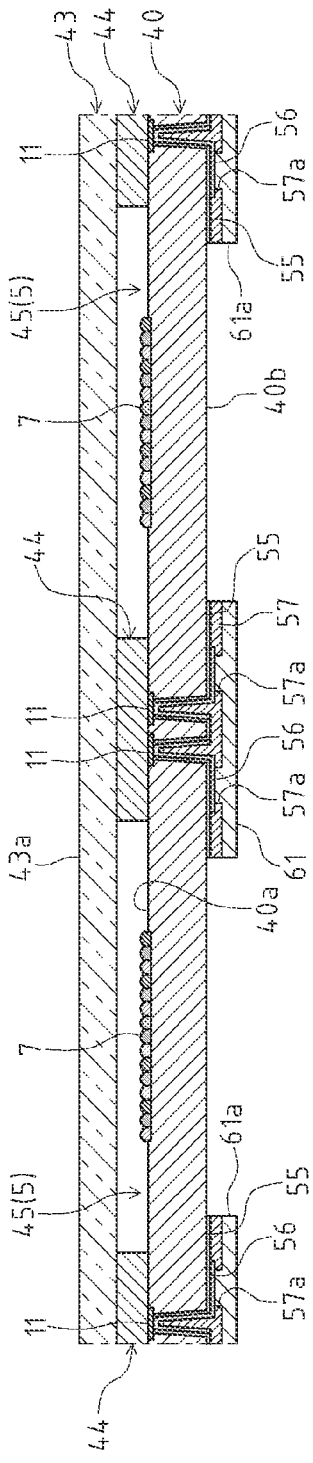

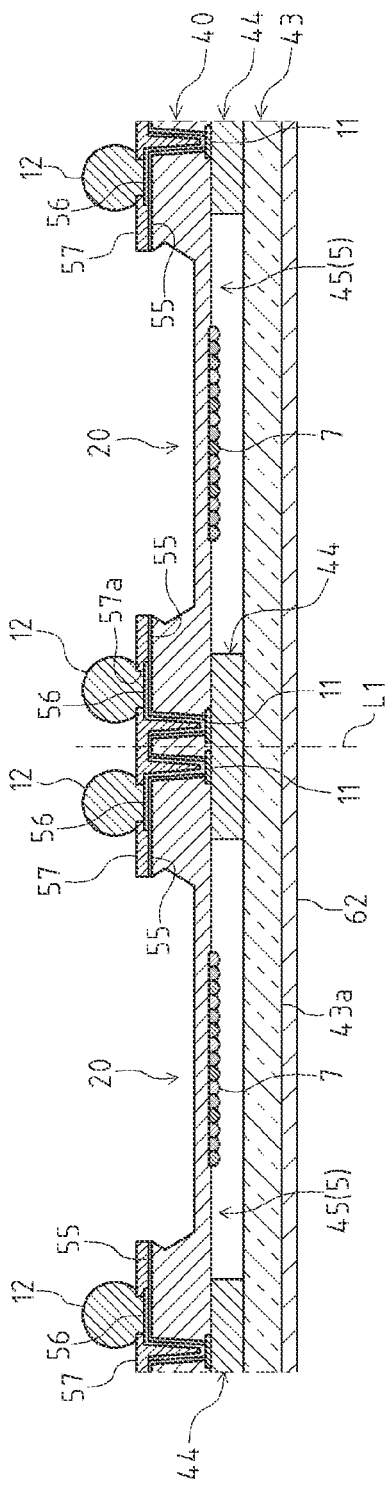
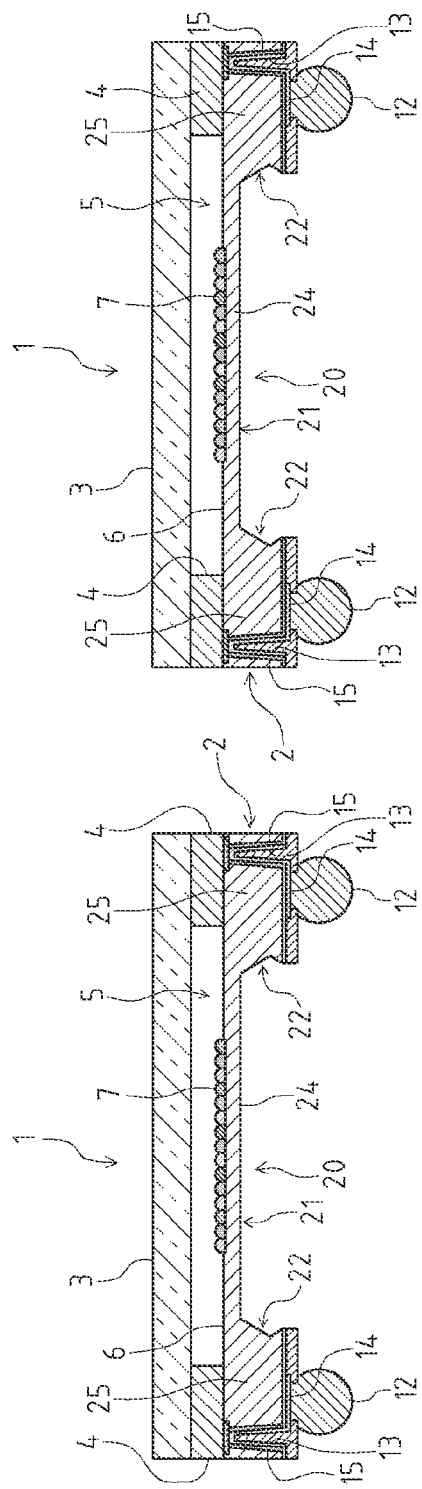
FIG. 7A
FIG. 7B

FIG. 8A
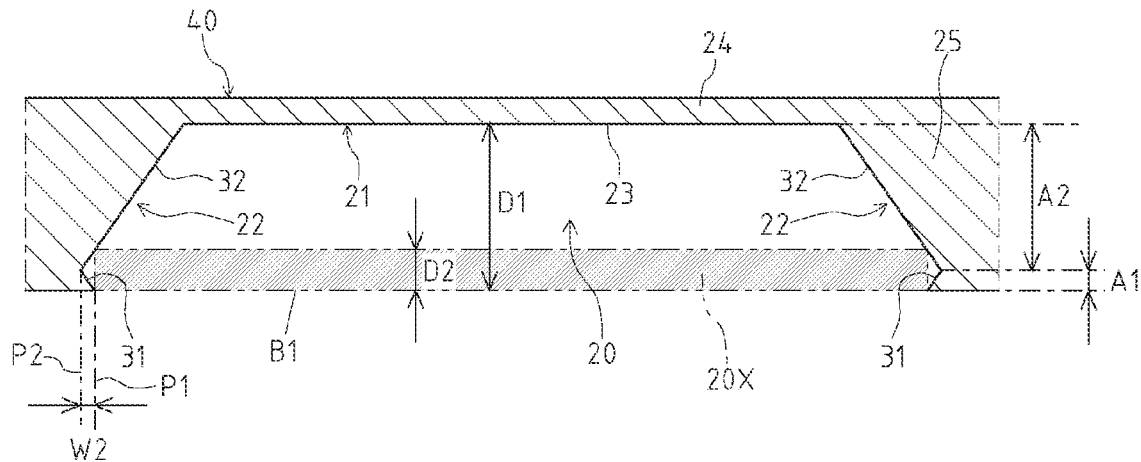
FIG. 8B
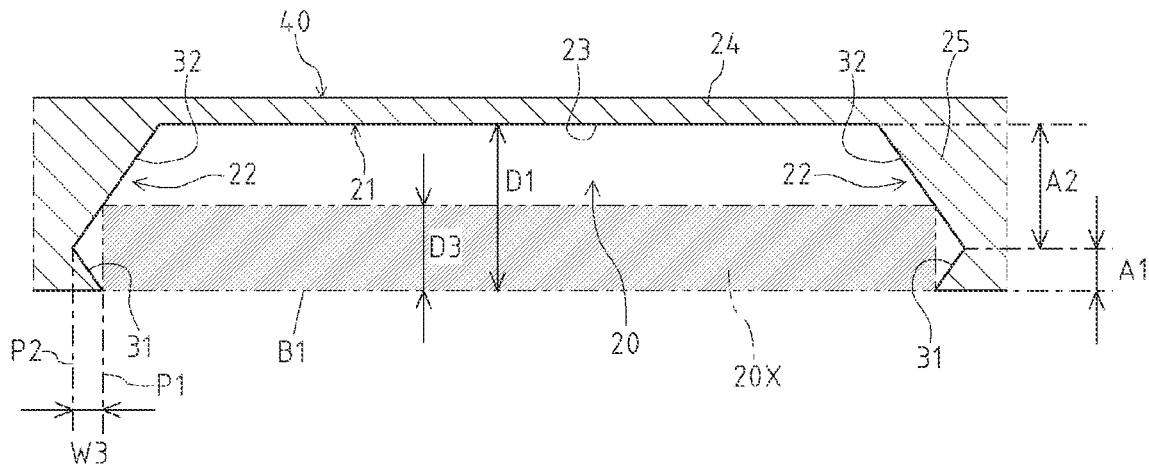
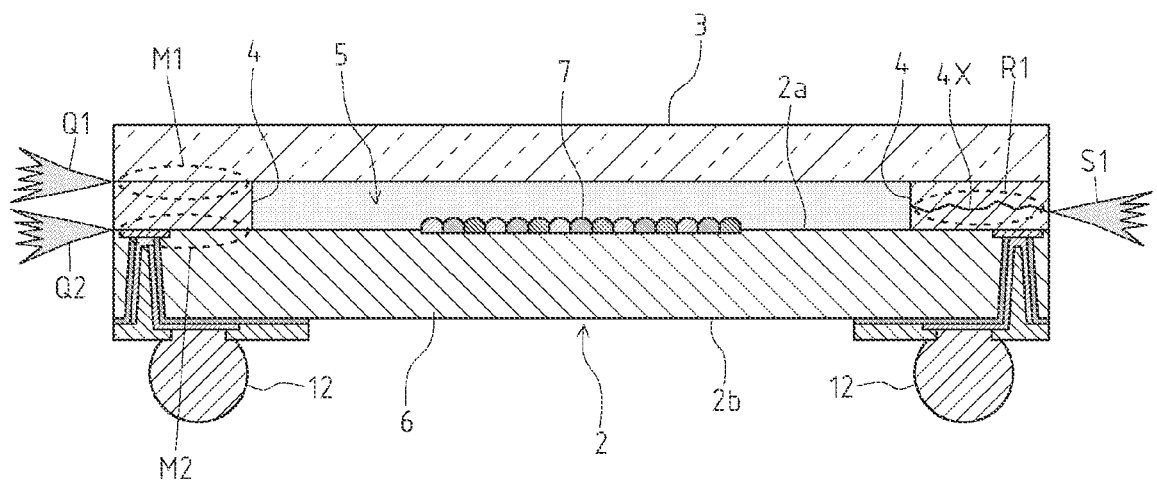
FIG. 9

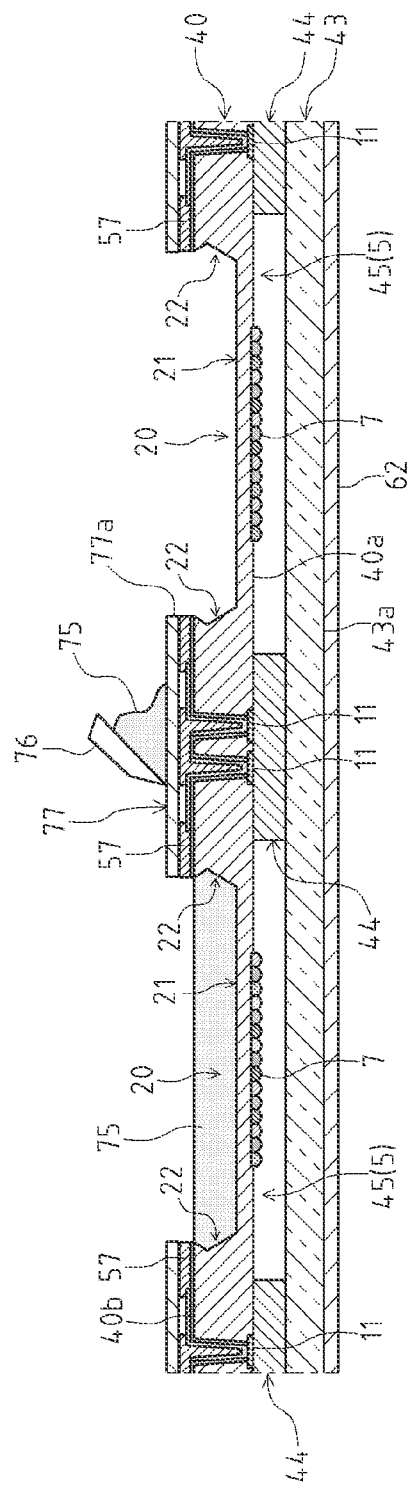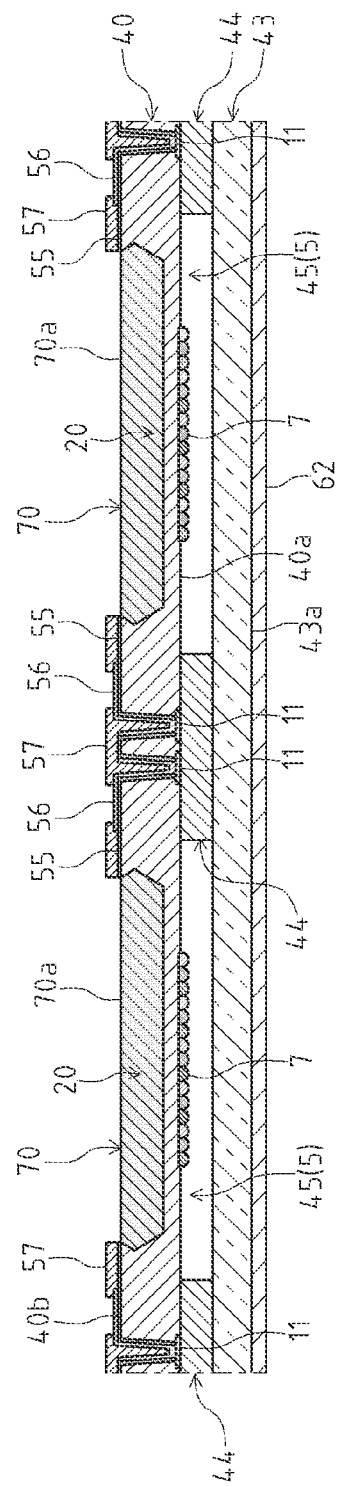

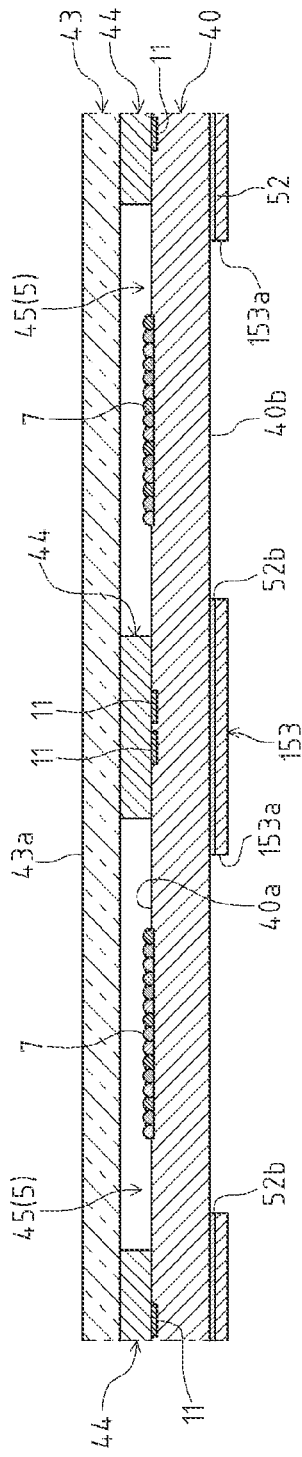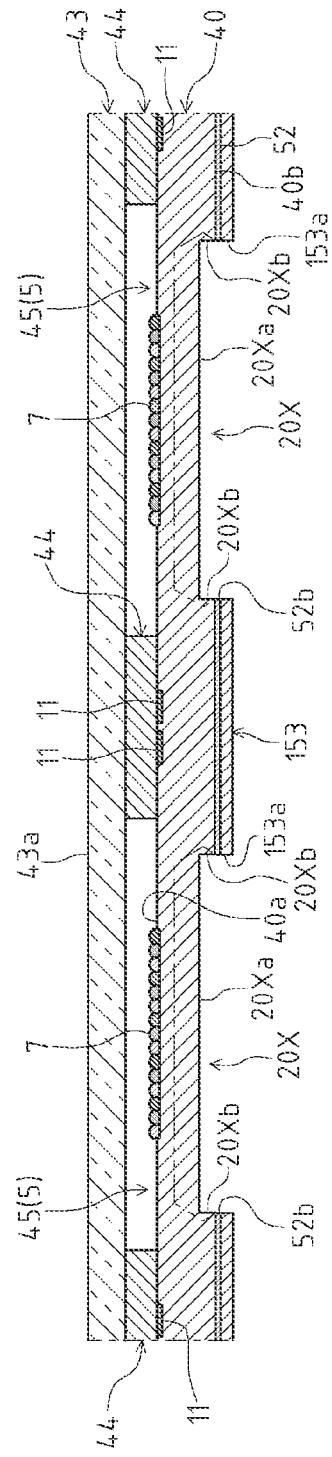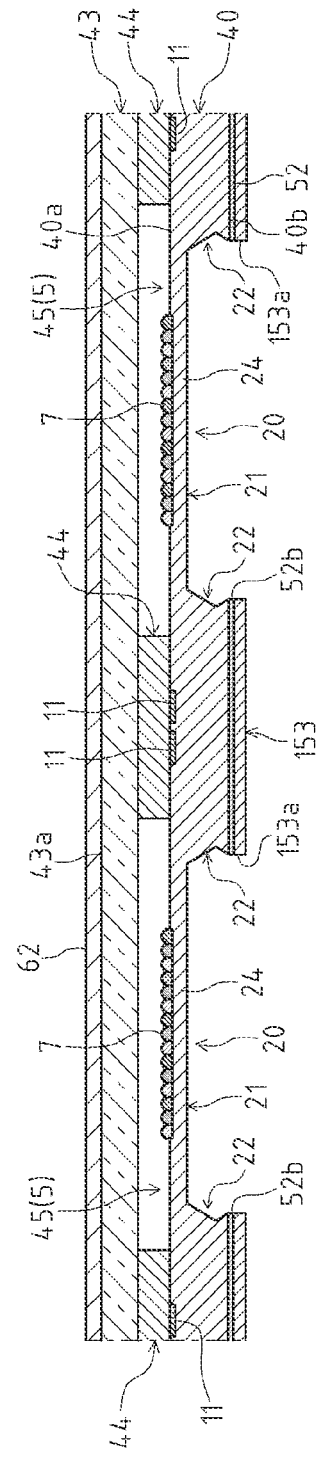

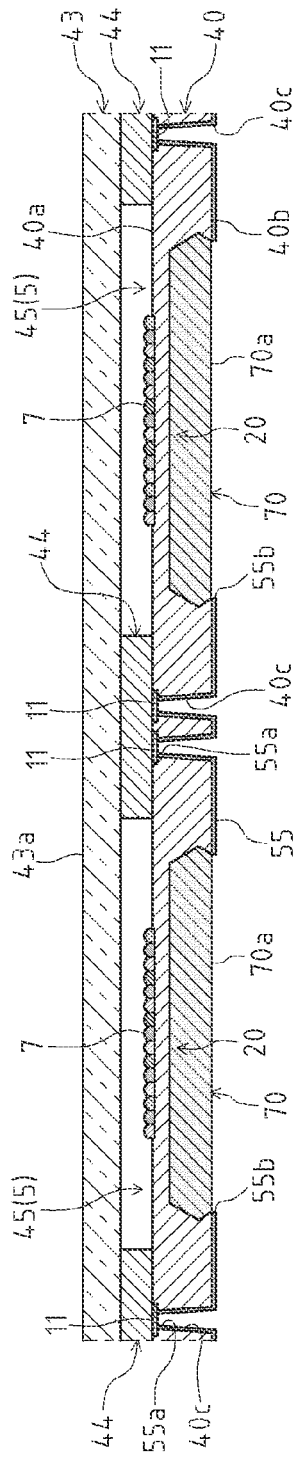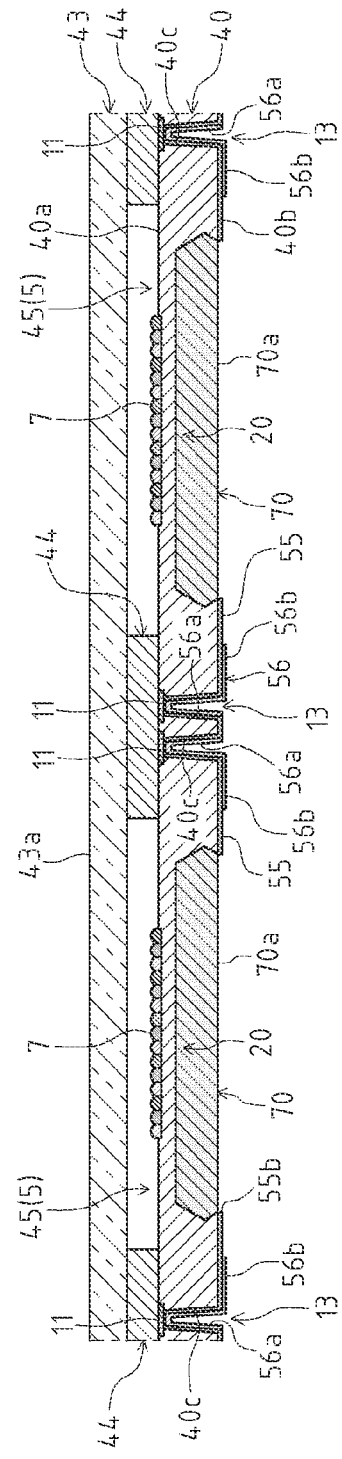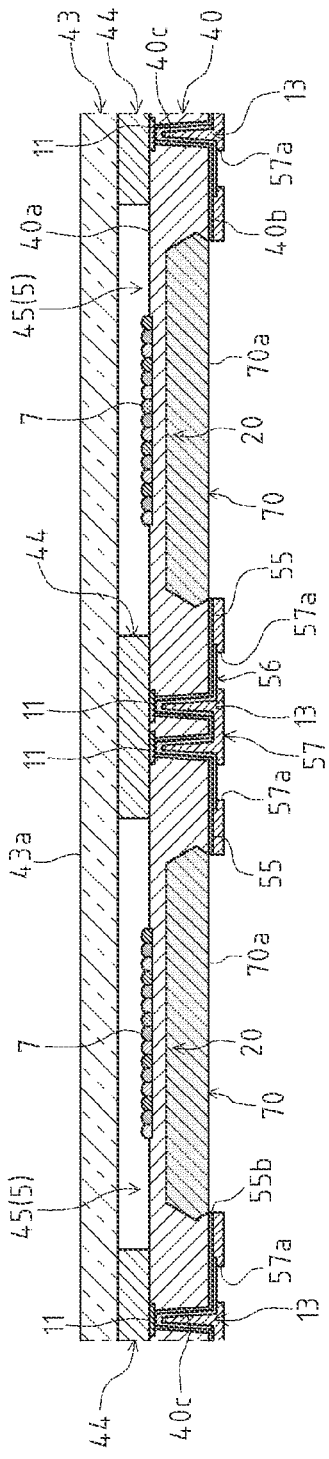

SOLID-STATE IMAGING DEVICE, ELECTRONIC APPARATUS, AND METHOD FOR PRODUCING SOLID-STATE IMAGING DEVICE

CROSS REFERENCE TO RELATED APPLICATIONS

This application is a U.S. National Phase of International Patent Application No. PCT/JP2019/019538 filed on May 16, 2019, which claims priority benefit of Japanese Patent Application No. JP 2018-124631 filed in the Japan Patent Office on Jun. 29, 2018. Each of the above-referenced applications is hereby incorporated herein by reference in its entirety.

TECHNICAL FIELD

The present technology relates to a solid-state imaging device, an electronic apparatus, and a method for producing the solid-state imaging device. In particular, the present technology relates to a solid-state imaging device and a method for producing the solid-state imaging device, the solid-state imaging device including a solid-state imaging element that includes a semiconductor substrate, a translucent cover member made of, for example, glass, and a support made of, for example, resin, the solid-state imaging device having a package structure in which a plurality of light-receiving elements is formed on the solid-state imaging element on the side of one of the plate surfaces of the semiconductor substrate, the cover member is provided on the solid-state imaging element through the support, and a cavity is included between the solid-state imaging element and the cover member.

BACKGROUND ART

An image sensor that converts light from a subject into a photoelectric signal to record an image is incorporated as a solid-state imaging element in main bodies of a digital camera and a video camera that have spread rapidly in recent years. Examples of the image sensor include those of a complementary metal-oxide semiconductor (CMOS) type and of a charge coupled device (CCD) type. The image sensor is a chip on which a plurality of light-receiving elements is formed on the side of one of the plate surfaces of a semiconductor substrate.

Conventionally, a solid-state imaging device including an image sensor has a package structure in which a translucent cover member made of, for example, glass is mounted on the image sensor through a support made of, for example, resin, and a cavity is included between the image sensor and the cover member. In such a configuration, the cover member is supported on the image sensor through the support provided on the side of a light-receiving surface of the image sensor such that the cover member faces the light-receiving surface, and a portion surrounding a space between the image sensor and the cover member is sealed with the support to form a cavity between the image sensor and the cover member (for example, refer to Patent Literature 1). In a solid-state imaging device having such a configuration, light transmitted through the cover member passes through the cavity, and is detected by being received by a light-receiving element forming each pixel arranged on the light-receiving surface of the image sensor.

In recent years, an image sensor is often adopted in a small apparatus such as a smartphone, and there is a need to make the package structure of an image sensor smaller in size and shorter in height. Thus, a structure called a wafer-level chip scale (or size) package (WCSP) has been widely used as a configuration of an image sensor. The WCSP greatly contributes toward downsizing, since the WCSP is not a structure obtained by performing cutting to obtain separate chips and then performing packaging, but is a structure obtained by creating a package in a wafer state and finally performing dicing to obtain a chip with an original size.

A solid-state imaging device having the package structure described above is subjected to reflow performed to melt solder used for joining, for example, when the solid-state imaging device is mounted on a substrate. Upon reflow, the solid-state imaging device is exposed to an atmosphere at a temperature of, for example, about 250° C. Thus, the gas containing moisture (water vapor) in a cavity is heated, and the internal pressure (vapor pressure) in the cavity is increased. Here, when a support that supports a cover member on an image sensor is made of resin, moisture passing through the support exists in the cavity.

The increase in the internal pressure in the cavity may cause damage such as a crack of a structural member of the solid-state imaging device such as a semiconductor substrate included in the image sensor, the cover member, or the support that supports the cover member; and unsticking of the stuck structural members. When such damage is caused, moisture, dust, or the like enters the cavity from a damaged portion, and this results in a reduction in a performance of the device. A technology indicated below may be used as a countermeasure against such a problem.

First, there exists a technology that includes, as a member that forms the cavity, a member that is deformed according to the internal pressure in the cavity, and prevents, due to deformation of the included member, an excessive increase in the internal pressure in the cavity (for example, refer to Patent Literature 2). Patent Literature 2 discloses a configuration in which a cap is included as a member that is deformed according to the internal pressure in a cavity, the cap forming the cavity with an insulating base substrate or the like. The cap is a plate-shaped member made of metal such as copper, and has a relatively thin curved portion that is a portion deformed according to the internal pressure in the cavity.

Further, there exists a technology that prevents an increase in the internal pressure in a cavity by providing an air passage to a member that forms a cavity, the air passage leading from the inside to the outside of the cavity (for example, refer to Patent Literature 3). Patent Literature 3 discloses a configuration in which an optical element is placed in a concave portion of a package, the concave portion is covered with a transparent member to form a hollow structure, and an air passage that causes the inside of the concave portion to communicate with the outside of the package is formed in the package.

Furthermore, there exists a technology that reduces moisture in a cavity and prevents an increase in the internal pressure in the cavity by providing, within or outside of the cavity, a moisture-absorption member or a moistureproof member that captures moisture (for example, refer to Patent Literature 4). Patent Literature 4 discloses a configuration in which a moisture absorbent obtained by mixing a granular moisture-absorption substance and a pasty resin that is a viscous substance, is applied to, for example, an inside of a member that forms a cavity.

CITATION LIST

Patent Literature

Patent Literature 1: Japanese Patent Application Laid-open No. 2004-296453
Patent Literature 2: Japanese Patent Application Laid-open No. 9-129767
Patent Literature 3: Japanese Patent Application Laid-open No. 2011-77170
Patent Literature 4: Japanese Patent Application Laid-open No. 7-321251

DISCLOSURE OF INVENTION

Technical Problem

The following are problems with the technologies described above. First, the technology in which a member that is deformed according to the internal pressure in a cavity is separately provided, and the technology in which a moisture-absorption member or the like is provided within or outside of a cavity result in a problem in which the package structure has a large outer size. Such a problem is particularly conspicuous in the WCSP used to achieve downsizing as described above. Further, when a separate member such as a moisture-absorption member is provided within a cavity, a malfunction may occur in a device or the device may exhibit poor characteristics due to the separate member falling off. Further, the technology in which an air passage leading from the inside to the outside of a cavity is provided may result in an image being affected due to dust or the like entering the cavity from the air passage.

Further, all of the technologies result in a complicated production method and in increased production costs. Thus, there may be an increase in a price of an end product including a solid-state imaging device having the package structure described above. As described above, there is a need for a new solution to a problem caused due to an increase in the internal pressure in a cavity, for example, upon reflow.

An object of the present technology is to provide a solid-state imaging device having a package structure that includes a cavity between a solid-state imaging element and a cover member, an electronic apparatus, and a method for producing the solid-state imaging device, the package structure making it possible to prevent damage such as a crack of a structural member of the solid-state imaging device and unsticking of the stuck structural members from being caused due to an increase in the internal pressure in the cavity, for example, upon reflow.

Solution to Problem

A solid-state imaging device according to the present technology includes a solid-state imaging element that includes a semiconductor substrate and of which a light-receiving side is a side of one of plate surfaces of the semiconductor substrate; a translucent cover member that is provided on the light-receiving side of the solid-state imaging element to be spaced from the solid-state imaging element at a specified interval; and a support that is provided on the light-receiving side of the solid-state imaging element, and supports the cover member on the solid-state imaging element to form a cavity between the solid-state imaging element and the cover member, the semiconductor substrate including a concave portion that is formed on another of the plate surfaces of the semiconductor substrate, the semiconductor substrate having a thickness partially reduced due to the formation of the concave portion.

Further, in another aspect of the solid-state imaging device according to the present technology, the solid-state imaging device further includes a filling resin portion that is made of a thermoplastic resin and provided to be filled into the concave portion, the filling resin portion being deformed with the semiconductor substrate.

Further, in another aspect of the solid-state imaging device according to the present technology, the solid-state imaging device further includes a solder portion that is provided on a side of a surface of the filling resin portion and used to mount the solid-state imaging element.

Further, in another aspect of the solid-state imaging device according to the present technology, the thermoplastic resin is a paste composition that contains, as a primary component, one of a polyetherimide resin, a polyetheramide resin, and a polyetheramide-imide resin.

Further, in another aspect of the solid-state imaging device according to the present technology, in the solid-state imaging device, the thermoplastic resin is a paste composition obtained by adding a segment having plastic properties to one of a polyimide resin, a polyamide resin, and a polyamide-imide resin.

Further, in another aspect of the solid-state imaging device according to the present technology, in the solid-state imaging device, the thermoplastic resin is a paste composition that contains, as a primary component, one of a polyimide resin, a polyamide resin, and a polyamide-imide resin, and further contains thermoplastic resin particles.

Further, in another aspect of the solid-state imaging device according to the present technology, in the solid-state imaging device, the concave portion includes a bottom face portion that is substantially parallel to the plate surface of the semiconductor substrate, and a lateral face portion that forms an inner surface of the concave portion; and the lateral face portion includes a first inclined surface and a second inclined surface, the first inclined surface being inclined in a specified direction with respect to the plate surface of the semiconductor substrate, the second inclined surface forming a bent shape with the first inclined surface in a cross-sectional view of the semiconductor substrate.

Further, in another aspect of the solid-state imaging device according to the present technology, in the solid-state imaging device, the concave portion includes a bottom face portion that is substantially parallel to the plate surface of the semiconductor substrate, and a lateral face portion that forms an inner surface of the concave portion; and the lateral face portion includes a (111) plane or an equivalent plane of crystal of the semiconductor substrate.

Further, in another aspect of the solid-state imaging device according to the present technology, the solid-state imaging device further includes a solder portion that is provided on the other of the plate surfaces of the semiconductor substrate and used to mount the solid-state imaging element; and an internal pressure in the cavity at a specified peak temperature upon reflow performed to melt the solder portion is less than an internal pressure that causes a crack of a member that forms the cavity or unsticking of the stuck members that form the cavity.

An electronic apparatus according to the present technology includes a solid-state imaging device that includes a solid-state imaging element that includes a semiconductor substrate and of which a light-receiving side is a side of one of plate surfaces of the semiconductor substrate; a translucent cover member that is provided on the light-receiving side of the solid-state imaging element to be spaced from the solid-state imaging element at a specified interval; and a support that is provided on the light-receiving side of the solid-state imaging element, and supports the cover member on the solid-state imaging element to form a cavity between the solid-state imaging element and the cover member, the semiconductor substrate including a concave portion that is formed on another of the plate surfaces of the semiconductor substrate, the semiconductor substrate having a thickness partially reduced due to the formation of the concave portion.

A method for producing a solid-state imaging device according to the present technology includes providing, thorough a wall, a translucent plate material on a side of one of plate surfaces of a semiconductor wafer to be spaced from the semiconductor wafer at a specified interval, the semiconductor wafer being a semiconductor wafer on which a group of pixels is formed on the side of the one of the plate surfaces of the semiconductor wafer, the semiconductor wafer being a semiconductor wafer in which a plurality of portions each being a solid-state imaging element is formed in a specified arrangement, the wall being formed along the specified arrangement to surround the group of pixels; forming a concave portion on another of the plate surfaces of the semiconductor wafer correspondingly to the solid-state imaging element, the semiconductor wafer having a thickness partially reduced due to the formation of the concave portion; and cutting a set of the semiconductor wafer, the wall, and the plate material into pieces such that the set is divided along the specified arrangement into portions that correspond to the respective solid-state imaging elements.

Further, in another aspect of the method for producing a solid-state imaging device according to the present technology, in the method for producing a solid-state imaging device, the forming the concave portion includes performing first etching including forming a semi-concave portion by removing a portion corresponding to the concave portion from the semiconductor wafer using dry etching; and, after the first etching, performing second etching including forming the concave portion by etching down into the semi-concave portion using anisotropic etching.

Further, in another aspect of the method for producing a solid-state imaging device according to the present technology, the method for producing a solid-state imaging device further includes, before the cutting the set into pieces, forming a filling resin portion in the concave portion by filling the concave portion with a thermoplastic resin, the filling resin portion being deformed with a semiconductor substrate that forms the solid-state imaging element.

Further, in another aspect of the method for producing a solid-state imaging device according to the present technology, the method for producing a solid-state imaging device further includes, before the cutting the set into pieces, placing a solder portion on a side of a surface of the filling resin portion, the solder portion being used to mount the solid-state imaging element.

Advantageous Effects of Invention

The present technology provides a configuration having a package structure that includes a cavity between a solid-state imaging element and a cover member, the package structure making it possible to prevent damage such as a crack of a structural member and unsticking of the stuck structural members from being caused due to an increase in the internal pressure in the cavity, for example, upon reflow.

BRIEF DESCRIPTION OF DRAWINGS

FIGS. 3A, 3B, and 3C are diagrams describing a method for producing the solid-state imaging device according to the first embodiment of the present technology.

FIGS. 4A, 4B, and 4C are diagrams describing the method for producing the solid-state imaging device according to the first embodiment of the present technology.

FIGS. 5A, 5B, and 5C are diagrams describing the method for producing the solid-state imaging device according to the first embodiment of the present technology.

FIGS. 7A and 7B are diagrams describing the method for producing the solid-state imaging device according to the first embodiment of the present technology.

FIGS. 8A and 8B illustrates a concave portion included in the solid-state imaging device according to the first embodiment of the present technology.

FIG. 9 illustrates a configuration of a solid-state imaging device of a comparative example that is compared to the present technology.

FIGS. 14A and 14B are diagrams describing a method for producing the solid-state imaging device according to the second embodiment of the present technology.

FIGS. 17A, 17B, and 17C are diagrams describing a modification of the method for producing the solid-state imaging device according to the second embodiment of the present technology.

FIGS. 19A, 19B, and 19C are diagrams describing the modification of the method for producing the solid-state imaging device according to the second embodiment of the present technology.

MODE (S) FOR CARRYING OUT THE INVENTION

In a configuration in which a cover member is provided on a solid-state imaging element through a support and a cavity is provided between the solid-state imaging element and the cover member, the present technology prevents damage caused due to an increase in the pressure in the cavity by devising, for example, the shape of a semiconductor substrate that is included in the solid-state imaging element.

Embodiments for implementing the present technology (hereinafter referred to as "embodiments") will now be described below with reference to the drawings. Note that the embodiments are described in the following order.

1. Configuration Example of Solid-State Imaging Device According to First Embodiment
2. Method for Producing Solid-State Imaging Device According to First Embodiment
3. Modification of Solid-State Imaging Device According to First Embodiment
4. Configuration Example of Solid-State Imaging Device According to Second Embodiment
5. Method for Producing Solid-State Imaging Device According to Second Embodiment
6. Modification of Method for Producing Solid-State Imaging Device According to Second Embodiment
7. Configuration Example of Solid-State Imaging Device According to Third Embodiment
8. Method for Producing Solid-State Imaging Device According to Third Embodiment
9. Configuration Example of Electronic Apparatus <Configuration Example of Solid-State Imaging Device According to First Embodiment>

Figure 1:
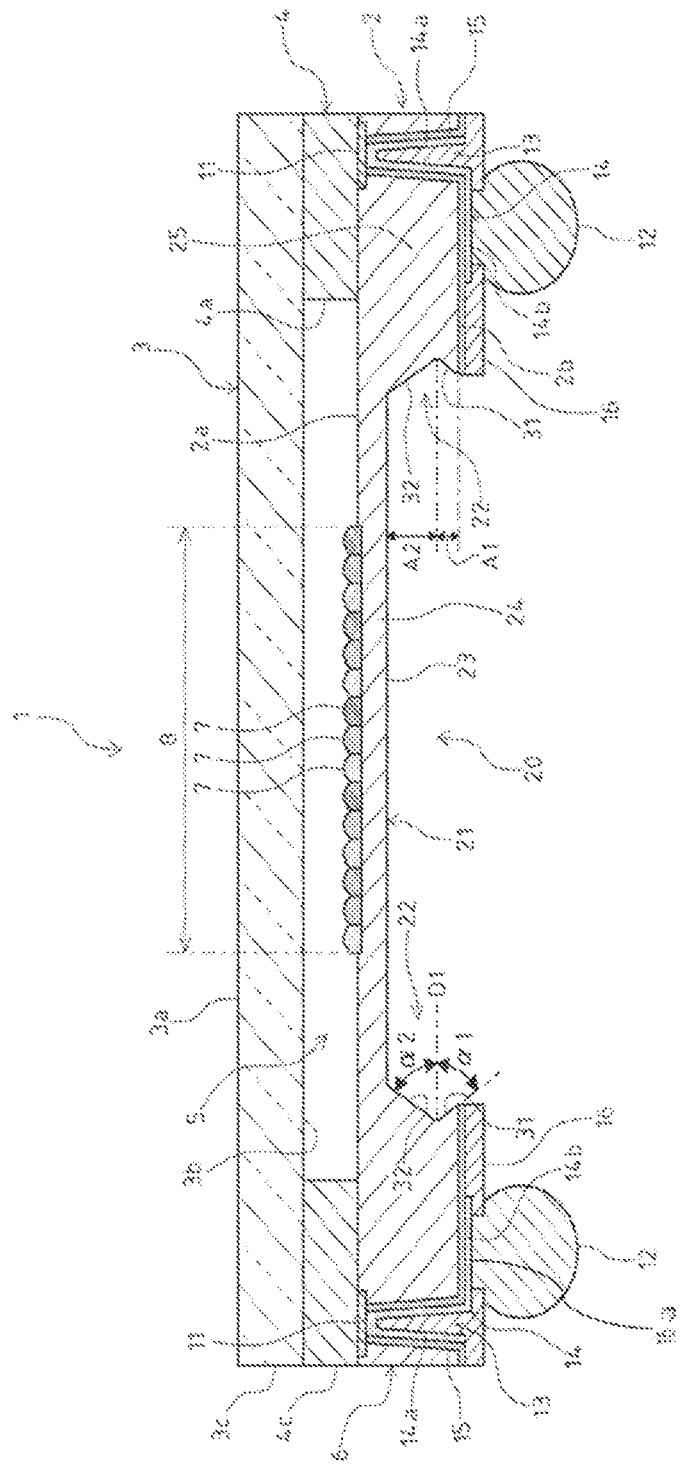
FIG. 1 is a cross-sectional view illustrating a configuration of a solid-state imaging device according to a first embodiment of the present technology.

A configuration of a solid-state imaging device 1 according to a first embodiment of the present technology is described with reference to FIGS. 1 and 2. As illustrated in FIG. 1, the solid-state imaging device 1 includes an image sensor 2 that is a solid-state imaging element, glass 3 that is a translucent cover member, and a partition wall 4 that is a support that supports the glass 3 on the image sensor 2.

The solid-state imaging device 1 has a package structure in which the glass 3 is mounted on the image sensor 2 through the partition wall 4 and a cavity 5 is included between the image sensor 2 and the glass 3. In the solid-state imaging device 1, the glass 3 is supported on the image sensor 2 through the partition wall 4 provided on a front surface 2a that is a surface on a light-receiving side of the image sensor 2, such that the glass 3 faces the front surface 2a. A portion surrounding a space between the image sensor 2 and the glass 3 is sealed with the partition wall 4 to form the empty cavity 5 between the image sensor 2 and the glass 3. The solid-state imaging device 1 according to the present embodiment is a solid-state imaging device to which a so-called WCSP structure is applied as a package structure.

The image sensor 2 includes a silicon-based semiconductor substrate 6 that is made of silicon (Si) and is an example of a semiconductor, and the light-receiving side of the image sensor 2 is a side of the front surface 2a corresponding to one of the plate surfaces of the semiconductor substrate 6 (an upper side in FIG. 1). The image sensor 2 is a rectangular-plate-shaped chip and includes a plurality of light-receiving elements formed on the front surface 2a, and the glass 3 is placed on the image sensor 2 through the partition wall 4 provided on a light-receiving side of the semiconductor substrate 6. The image sensor 2 according to the present embodiment is a CMOS image sensor. However, the image sensor 2 may be a CCD image sensor.

Most of the image sensor 2 is formed of the semiconductor substrate 6. An image sensor element is formed on a front surface of the semiconductor substrate 6. In other words, the image sensor 2 includes a pixel region 8 on the front surface 2a as a light-receiving portion, the pixel region 8 being, for example, a light-receiving region including a plurality of pixels 7 formed in a specified arrangement such as a Bayer arrangement. The image sensor 2 includes, on the front surface 2a, a region surrounding the pixel region 8 is a peripheral region. The pixel region 8 includes an effective pixel region used to generate a signal charge by photoelectric conversion performed in each pixel 7, to amplify the signal charge, and to read the signal charge.

The pixel 7 includes a photodiode that is a photoelectric converter including a photoelectric conversion function, and a plurality of pixel transistors. The photodiode includes a light-receiving surface that receives light entering from the front surface 2a of the image sensor 2, and generates an amount of signal charge depending on an amount (intensity) of light entering the light-receiving surface. Pixel transistors of the plurality of pixel transistors each include a MOS transistor each responsible for amplifying, transferring, selecting, or resetting a signal charge generated by the photodiode. Note that the plurality of pixels 7 may have a pixel-sharing structure in which a photodiode and a transfer transistor that form a plurality of pixels in a unit share other individual pixel transistors.

On the side of the front surface 2a of the image sensor 2, a color filter and an on-chip lens are formed correspondingly to each pixel 7 on the semiconductor substrate 6 through an antireflective film formed of, for example, an oxide film or a planarized film or the like made of an organic material. Light entering the on-chip lens is received by the photodiode through the color filter and the planarized film or the like.

The following are representative examples of the structure of the image sensor 2 to which the present technology can be applied. In other words, the examples include a frontside-illumination image sensor in which the pixel region 8 is formed on the side of the front surface of the semiconductor substrate 6; a backside-illumination image sensor in which a photodiode and the like are arranged in reverse order such that a side of a back surface of the semiconductor substrate 6 is a side of a light-receiving surface, in order to improve the light transmittance; and an image sensor in the form of a single chip obtained by stacking peripheral circuits of a group of pixels. However, the image sensor 2 according to the present technology is not limited to the image sensors having these structures.

The glass 3 is provided on the light-receiving side of the image sensor 2 to be spaced from the image sensor 2 at a specified interval. The glass 3 is an example of a cover member, and is a rectangular-plate-shaped member that has substantially the same size as the image sensor 2. The glass 3 is provided such that the outer shape of the glass 3 substantially coincides the outer shape of the image sensor 2 in a plan view, and is provided parallel to the image sensor 2. The glass 3 includes a lower surface 3*b* that is a plate surface situated on a side facing the image sensor 2, and an upper surface 3*a* that is a surface opposite to the lower surface 3*b*. Light transmitted through the glass 3 enters a light-receiving surface of the image sensor 2.

Various pieces of light entering from an optical system such as a lens normally situated above the glass 3, are transmitted through the glass 3, and the glass 3 transmits the various pieces of light to the light-receiving surface of the image sensor 2 facing the glass 3 through the cavity 5. The glass 3 includes a function of protecting the side of the light-receiving surface of the image sensor 2, and includes a function of blocking, in conjunction with the partition wall 4, moisture (water vapor), dust, or the like from entering the cavity 5 from the outside.

In addition to a glass plate, for example, a plastic plate, a silicon plate through which only infrared light is transmitted, or the like is applicable as the cover member according to the present technology. Note that, for example, in consideration of circumstances when the image sensor 2 is used, any type of filter film for wavelength is formed on the surface of the glass 3, or the glass 3 on which any type of filter film for wavelength is formed may be coated with an antireflective film used to prevent reflection caused within or outside of the cavity 5.

The partition wall 4 is provided on the light-receiving side of the image sensor 2, and supports the glass 3 on the image sensor 2 to form the cavity 5 between the image sensor 2 and the glass 3. The partition wall 4 is provided in the peripheral region on the front surface 2*a* of the image sensor 2 to surround the pixel region 8, the peripheral region being a region obtained by excluding the pixel region 8 from the front surface 2*a*.

The partition wall 4 is situated between the front surface 2*a* of the image sensor 2 and the lower surface 3*b* of the glass 3, and serves as a sealing portion with which the image sensor 2 and the glass 3 are sealed. In other words, together with the glass 3, the partition wall 4 blocks moisture, dust, or the like from entering the cavity 5 from the outside.

The partition wall 4 is formed on a portion all around the glass 3 along the outer shape of the glass 3, and is provided to have a rectangular frame shape in a plan view. The partition wall 4 is provided within a range of the outer shape of the glass 3 along an outer edge of the glass 3 in the plan view. For example, the partition wall 4 is provided such that an outer surface 4*c* of the partition wall 4 is substantially flush with an outer surface 3*c* of the glass 3.

A material of the partition wall 4 is, for example, a photosensitive adhesive made of, for example, a UV (ultraviolet) curable resin that is an acrylic resin, a thermosetting resin such as an epoxy resin, or a mixture thereof. The partition wall 4 is formed on the front surface 2*a* of the image sensor 2 by, for example, performing applying using a dispenser or performing patterning using a photolithography technology. A photosensitive resin on which a pattern can generally be freely formed using a photolithography technology is favorably used as the material of the partition wall 4.

When the partition wall 4 is made of a resin material, the partition wall 4 serves as an adhesive used to bond the image sensor 2 and the glass 3 in a state of being spaced from each other. However, the partition wall 4 is not limited to being made of resin. For example, the partition wall 4 may be a structure that is made of ceramic such as glass or an inorganic material such as metal or silicon and is attached to the image sensor 2 and to the glass 3 using, for example, an adhesive. The partition wall 4 that is a structure made of glass or the like can be expected to provide an effect of preventing moisture permeation.

The cavity 5 is a flat rectangular space portion situated between the image sensor 2 and the glass 3. Specifically, the cavity 5 is formed by the front surface 2*a* of the image sensor 2, the lower surface 3*b* of the glass 3, and an inner surface 4*a* of the partition wall 4. The inside of the cavity 5 is a space portion, on the image sensor 2, that is completely isolated and protected from the outside.

An incident angle of light that enters the glass 3 from the outside is once changed by being affected by the refractive index of a material of the glass 3. However, with respect to light entering the on-chip lens formed in the pixel 7, the original incident angle of the light entering the glass 3 is replicated since the cavity 5 is an airspace having a refractive index of 1.

Further, the solid-state imaging device 1 includes a plurality of electrode pads 11 formed on the side of the front surface 2*a* of the image sensor 2, the plurality of electrode pads 11 being a terminal used to transmit/receive a signal to/from the outside. For example, an aluminum material or the like is used as a material of the electrode pad 11. Furthermore, the image sensor 2 includes a group of solder balls 12 each corresponding to a solder portion used to mount the image sensor 2 and is provided on the side of a back surface 2*b* that is the other plate surface (a surface opposite to the front surface 2*a*) of the semiconductor substrate 6. The electrode pad 11 is electrically connected to the solder ball 12. Note that the image sensor 2 is mounted on, for example, a substrate such as an interposer substrate in a product.

The electrode pad 11 is formed in a portion immediately below the partition wall 4 on the side of the front surface 2*a* of the image sensor 2. Further, the electrode pad 11 is connected to the solder ball 12 through a wiring layer 14 extending to be embedded in a through via (a through silicon via: TSV) that is formed from the side of the back surface 2*b* of the image sensor 2.

The through via 13 is formed by embedding an in-hole wiring portion 14*a* in an inner surface of a hole through an insulation film 15, the in-hole wiring portion 14*a* forming the wiring layer 14, the hole being formed to pass through the semiconductor substrate 6. The in-hole wiring portion 14*a* forms the wiring layer 14 with a planar wiring portion 14*b* formed on the side of the back surface 2*b* of the semiconductor substrate 6, and the planar wiring portion 14*b* is connected to the solder ball 12. For example, deep reactive ion etching (DRIE) that is a process for a semiconductor device and makes it possible to form a narrow, deep opening, that is, a hole with a so-called high aspect ratio is used to form the through via 13.

Such an electrical connection results in maintaining a signal quality in a short connection path. However, for example, the electrode pad 11 may be connected to the solder ball 12 through a bonding wire from the side of the front surface 2*a* of the image sensor 2. In such a configuration, for example, the electrode pad 11 is formed outside of the partition wall 4 on the side of the front surface 2*a* of the image sensor 2.

For example, the wiring layer 14 is made of a low-resistance metallic material, such as copper (Cu), that exhibits a low resistance value and is advantageous for transmission of a high-speed signal. Note that, in addition to copper (Cu), the wiring layer 14 can be made of tungsten (W), titanium (Ti), tantalum (Ta), a titanium tungsten alloy (TiW), polysilicon, or the like. A portion, in the image sensor 2, in which the wiring layer 14 is formed is covered with the insulation film 15 made of, for example, an oxide film or a nitride film, the insulation film 15 being formed in the form of an underlay of the wiring layer 14 such that the wiring layer 14 is not in direct contact with the semiconductor substrate 6. In other words, the insulation film 15 is situated between the wiring layer 14 and the semiconductor substrate 6.

Further, a solder resist (solder mask) 16 made of an insulating resin is formed on the side of the back surface 2b of the image sensor 2 to cover the entire back surface 2b, the solder resist 16 including an opening 16a with which only a portion in which the solder ball 12 is brought into contact with the wiring layer 14, is opened. The solder resist 16 is also embedded in the through via 13, and is formed to cover the in-hole wiring portion 14a and the planar wiring portion 14b of the wiring layer 14. The solder resist 16 defines the area of contact between the wiring layer 14 and the solder ball 12, and includes a function of preventing a short circuit caused between the adjacent solder balls 12. Further, the wiring layer 14 is provided on an inner side of the solder resist 16 on the side of the back surface 2b of the image sensor 2. This results in covering wiring with certainty, and in preventing, for example, a short circuit caused in wiring due to conductive foreign matter.

The plurality of solder balls 12 is a portion that serves as an external terminal, and is arranged as appropriate according to, for example, the number of signals of the image sensor 2 or a substrate of a product. In the present embodiment, the group of solder balls 12 is arranged on the side of the back surface 2b of the image sensor 2 along an outer shape of a rectangular chip of the image sensor 2 (refer to FIG. 2).

Reflecting recent environmental problems, a lead-free material is often used as a material of the solder ball 12. Its material composition is selected as appropriate according to the purpose of use of a product, necessary costs, and the like. A process including placing the solder balls 12 in the opening 16a of the solder resist 16 with a high degree of positional accuracy, the solder balls 12 having a uniform size in a state in which flux is applied to the solder balls 12, or a process including printing a solder paste on the opening 16a of the solder resist 16 using a printing technology and then performing reflow to form the solder into a ball shape is adopted as a process for providing the solder balls 12.

As described above, the solid-state imaging device 1 having a WCSP structure has a configuration without wiring by wire bonds, by an electrode being formed using the through via 13 passing through the front surface 2a and the back surface 2b of the image sensor 2. In other words, in the solid-state imaging device 1, the wiring layer 14 extending through the through via 13 from the electrode pad 11 is connected to the solder ball 12 on the side of the back surface 2b of the image sensor 2, the electrode pad 11 being a signal-connection end of the image sensor 2, the through via 13 passing through the front surface 2a and the back surface 2b of the image sensor 2.

Such a configuration results in downsizing and reduced costs due to there being no need for a connection area for wire bond, compared to a chip-on-board (COB) package structure in which there is a need for the connection area for wire bond in the periphery of a chip of the image sensor 2. Further, the WCSP structure makes it possible to perform assembling using a so-called wafer process in a cream room. Thus, a dustless state is expected to be achieved, and this results in contributing toward improving a performance of the image sensor 2.

The following are examples of the dimensions of the respective components in the solid-state imaging device 1 according to the present embodiment. The thickness of the image sensor 2 is from 300 to 600 μm. The thickness of the glass 3 is from 100 to 500 μm. The thickness (height) of the partition wall 4 is 10 to 50 μm. The thickness of the solder resist 16 is 10 to 30 μm. Note that these dimensions are merely examples, and appropriate dimensions depending on the device structure, the pixel size, and the like of the solid-state imaging device 1 are adopted as the dimensions of the respective components.

The solid-state imaging device 1 according to the present embodiment having the configuration described above is subjected to reflow performed to melt the solder ball 12 used for joining, for example, when the solid-state imaging device 1 is mounted on a substrate of a product. During reflow, the solid-state imaging device 1 is exposed to an atmosphere at a temperature of, for example, about 250° C. Thus, the gas containing moisture (water vapor) in the cavity 5 is heated, and the internal pressure (vapor pressure) in the cavity 5 is increased. Here, when the partition wall 4 that supports the glass 3 on an image sensor 2 is made of resin, moisture passing through the glass 3 exists in the cavity 5.

The increase in the internal pressure in the cavity 5 may cause damage such as a crack of a structural member of the solid-state imaging device 1 such as the semiconductor substrate 6 included in the image sensor 2, the glass 3, or the partition wall 4 that supports the glass 3; and unsticking of the stuck structural members. When such damage is caused, moisture, dust, or the like enters the cavity 5 from a damaged portion, and this results in a reduction in a performance of the device. Thus, the solid-state imaging device 1 according to the present embodiment has the following configuration.

Figure 2:
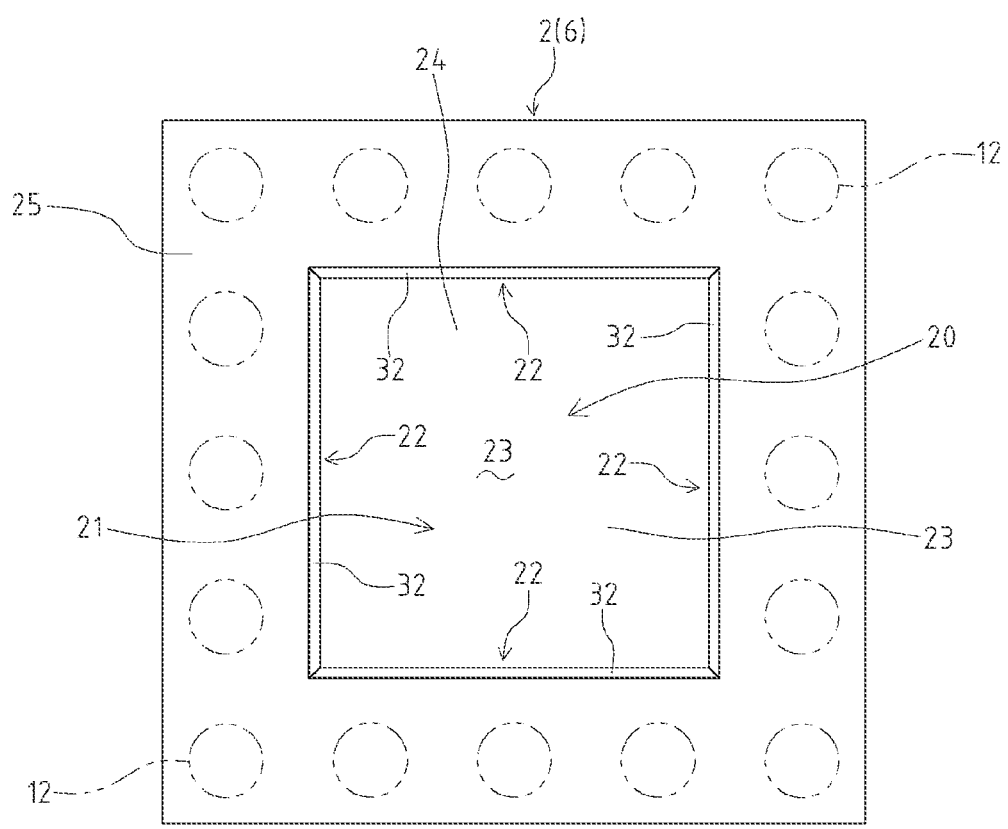
FIG. 2 illustrates the side of a back surface of a semiconductor substrate according to the first embodiment of the present technology.

As illustrated in FIGS. 1 and 2, in the solid-state imaging device 1 according to the present embodiment, the semiconductor substrate 6 includes a concave portion 20 that is formed on the side of the back surface 2b of the semiconductor substrate 6, and the thickness of the semiconductor substrate 6 is partially reduced due to the formation of the concave portion 20. The concave portion 20 is a recessed portion formed in the image sensor 2 that is a rectangular-plate-shaped chip, such that the recessed portion is opened on the side of the back surface 2b.

The concave portion 20 includes a bottom face portion 21 that is substantially parallel to the plate surface of the semiconductor substrate 6, and a lateral face portion 22 that forms an inner surface of the concave portion 20. The bottom face portion 21 is a portion that forms a bottom surface 23, in the image sensor 2, that is a horizontal surface situated opposite to the front surface 2a. The lateral face portion 22 is a face portion that is formed between the bottom face portion 21 and the back surface 2b.

The concave portion 20 has a shape along the outer shape of the image sensor 2 in a bottom view. Thus, the concave portion 20 is a rectangular concave portion formed in a rectangular or square shape in a bottom view of the image sensor 2 (refer to FIG. 2). Therefore, in the concave portion 20, the bottom face portion 21 is formed in a rectangular shape along the outer shape of the image sensor 2, and the lateral face portion 22 is formed along four sides of the bottom face portion 21. The semiconductor substrate 6 including such a concave portion 20 has a picture-frame shape, and an opening side of the semiconductor substrate 6 is the side of the back surface 2b.

A range of a region in which the concave portion 20 is formed is, for example, a range including the pixel region 8. Further, the concave portion 20 is formed to be situated within, for example, a range in which the cavity 5 is formed, that is, a range of a region situated inward of the partition wall 4.

According to the concave portion 20, a portion of the image sensor 2 in which the concave portion 20 is formed is made thin, and becomes a portion in the form of a diaphragm, the portion in which the concave portion 20 is formed is the image sensor 2 from which a peripheral portion of the image sensor 2 is excluded. Specifically, the image sensor 2 includes, in the semiconductor substrate 6, a thin plate portion 24 and a thick plate portion 25, the thin plate portion 24 being rectangularly formed correspondingly to the range in which the concave portion 20 is formed, the thick plate portion 25 being formed into a frame shape to surround an outer periphery of the thin plate portion 24, the thick plate portion 25 being made thicker than the thin plate portion 24 on the side of the back surface 2b.

Correspondingly to the range in which the concave portion 20 is formed, the thick plate portion 25 includes linear portions that respectively follow four sides of a rectangular. Due to the linear portions, the thick plate portion 25 has a rectangular-frame shape in a bottom surface view. The thickness of the thin plate portion 24 obtained due to the concave portion 20 is, for example, about ⅓ to ¼ of the thickness of the thick plate portion 25 having a normal thickness of the semiconductor substrate 6. Further, in the configuration in which the concave portion 20 is included, a lower surface of the thick plate portion 25 surrounding the concave portion 20 is the back surface 2b of the image sensor 2.

In principle, the concave portion 20 is formed by etching. However, a method for forming the concave portion 20 is not limited to etching, and any method that makes it possible to partially remove the semiconductor substrate 6 may be used. Note that the method for forming the concave portion 20 will be described later.

The lateral face portion 22 that forms the concave portion 20 is described. In the present embodiment, the lateral face portion 22 includes a first inclined surface 31 that is inclined in a specified direction with respect to the plate surface of the semiconductor substrate 6, and a second inclined surface 32 that forms a bent shape with the first inclined surface 31 in a cross-sectional view of the semiconductor substrate 6.

As illustrated in FIG. 1, the first inclined surface 31 is a face that forms a portion situated on the side of the back surface 2b (hereinafter also referred to as a "lower side") of the lateral face portion 22, and the second inclined surface 32 is a face that forms the side of the front surface 2a (hereinafter also referred to as an "upper side") of the lateral face portion 22. Due to the first inclined surface 31 and the second inclined surface 32, the lateral face portion 22 has a face that is bent to form a generally sidewise V-shape having a convex portion on an outer side of the concave portion 20 (outer sides on the left and on the right in FIG. 1) in a cross-sectional view of the solid-state imaging device 1.

In other words, with respect to a direction vertical to the plate surface of the semiconductor substrate 6 (an up-and-down direction in FIG. 1), the first inclined surface 31 is inclined from an inner side to an outer side in a left-and-right direction from the lower side to the upper side. The second inclined surface 32 is inclined with respect to the vertical direction from the outer side to the inner side in the left-and-right direction from the lower side to the upper side. Further, an upper end of the second inclined surface 32 is connected to the bottom surface 23 of the bottom face portion 21 to form a corner portion of an obtuse angle with the bottom surface 23.

In the above-described lateral face portion 22 having a bent face portion due to the first inclined surface 31 and the second inclined surface 32, the first inclined surface 31 and the second inclined surface 32 each form an acute angle with a horizontal direction O1 in parallel with the plate surface of the semiconductor substrate 6. In other words, an angle $\alpha 1$ that the first inclined surface 31 forms with the horizontal direction O1 and an angle $\alpha 2$ that the second inclined surface 32 forms with the horizontal direction O1 are both acute angles.

In the present embodiment, a region dimension A1 of the first inclined surface 31 is smaller than a region dimension A2 of the second inclined surface 32 in a depth direction of the concave portion 20. However, which of a dimension of a region in which the first inclined surface 31 is formed and a dimension of a region in which the second inclined surface 32 is formed is larger in the depth direction of the concave portion 20 (which of the dimension A1 and the dimension A2 is larger) is not particularly limited.

Further, the lateral face portion 22 of the concave portion 20 includes a (111) plane or an equivalent plane of crystal of the semiconductor substrate 6 (hereinafter collectively referred to as a {111} plane). The semiconductor substrate 6 is a silicon substrate. The {111} plane is based on a crystalline structure of silicon, and is a crystal plane formed by anisotropic etching performed on a silicon substrate.

In the present embodiment, the first inclined surface 31 and the second inclined surface 32 that form the lateral face portion 22 of the concave portion 20 both have the {111} plane. In other words, the first inclined surface 31 and the second inclined surface 32 both have a crystal plane of silicon that is formed by anisotropic etching. When both the first inclined surface 31 and the second inclined surface 32 are faces formed by anisotropic etching as described above, the angle $\alpha 1$ and the angle $\alpha 2$ to the horizontal direction O1 are both about 55 degrees (54.7 degrees), and are substantially the same as each other.

Anisotropic etching is a type of wet etching, and is a technology commonly used in the process of producing micro electro mechanical systems (MEMS). In this technology, a desired opening pattern is formed on a processing-target surface of a semiconductor substrate such as a silicon substrate, using, for example, an oxide film, a nitride film, or an alkali-proof resist, and the semiconductor substrate is immersed in a strong alkali solution such as KOH (potassium hydroxide) using the pattern as a mask to perform etching. According to the anisotropic etching, the shape of an opening is uniquely determined in a state in which the {111} plane is exposed due to a crystal orientation of the semiconductor substrate. In general, a substrate of single-crystal silicon with a (100) surface orientation is often used as a semiconductor that forms an image sensor. In this case, when a rectangular aperture mask of an oxide film, a nitride film, or a resist is formed on a back surface of a silicon substrate, an opening is formed that has an etching shape gradually becoming wider or narrower in a depth direction from the opening with an inclination of about 55 degrees.

The solid-state imaging device 1 according to the present embodiment described above is formed as a WCSP structure having the following configuration. In other words, the solid-state imaging device 1 includes the semiconductor substrate 6, the wiring layer 14, the solder ball 12, the partition wall 4, and the glass 3. The concave portion 20 is formed on the side of the back surface of the semiconductor substrate 6, and the image sensor element is formed on the side of the front surface of the semiconductor substrate 6. The wiring layer 14 is formed on a flat portion situated outside of the concave portion 20 of the semiconductor substrate 6. The wiring layer 14 is connected to the electrode pad 11 and provided to extend. The solder ball 12 is formed on the wiring layer 14 through a land portion (of which an illustration is omitted). The partition wall 4 is formed to surround the image sensor element of the semiconductor substrate 6, and isolates, from the outside and as the cavity 5, a space situated above a portion in which the image sensor element is formed. The glass 3 is bonded on the partition wall 4.

<2. Method for Producing Solid-State Imaging Device According to First Embodiment>

An example of a method for producing the solid-state imaging device 1 according to the first embodiment of the present technology is described with reference to FIGS. 3A, 3B, 3C, 4A, 4B, 4C, 5A, 5B, 5C, 6A, 6B, 6C, 7A, and 7B.

In the process of producing the solid-state imaging device 1, first, a silicon wafer 40 on which the pixels 7 are formed is provided, as illustrated in FIG. 3A. The silicon wafer 40 is a silicon wafer on which various processes for forming the image sensor 2 have been performed. In other words, the silicon wafer 40 is a semiconductor wafer on which a group of pixels 7 is formed on the side of one of the plate surfaces of the semiconductor wafer, and a plurality of portions each being the image sensor 2 is formed in the silicon wafer 40 in a specified arrangement. In recent years, an 8-inch wafer or a 12-inch wafer is primarily used as the silicon wafer 40.

A wall 44 that corresponds to the partition wall 4 is formed on the silicon wafer 40, and a glass plate 43 that corresponds to the glass 3 is attached to the silicon wafer 40. Here, the wall 44 may be formed on a front surface 40a of the silicon wafer 40, and then the glass plate 43 is attached to the wall 44. Further, the wall 44 that has been formed on the glass plate 43 in advance may be attached to the front surface 40a of the silicon wafer 40.

The glass plate 43 is an example of a translucent plate material. The wall 44 is formed along the specified arrangement of a plurality of image sensors 2 to surround the group of pixels 7. In other words, correspondingly to a rectangular region finally formed as the solid-state imaging device 1, the walls 44 are formed in a grid pattern in a plan view.

For example, patterning using the photolithography technology, screen printing, etching, coating using a dispenser, and the like are used as a method for forming the wall 44. A cavity 45 that corresponds to the cavity 5 is formed in each solid-state imaging device 1 by joining the silicon wafer 40 and the glass plate 43 through the wall 44.

Note that, when the partition wall 4 is a structure made of, for example, glass or metal, the structures formed in a grid pattern are attached to the silicon wafer 40 and to the glass plate 43 using a specified adhesive. In this case, it is favorable that the process of attaching the structure be performed in a high-cleanliness clean room such that dust does not enter the cavity 45.

As described above, in the method for producing the solid-state imaging device 1 according to the present embodiment, a process of providing the glass plate 43 on the side of the front surface 40a of the silicon wafer 40 at a specified interval through the wall 44 is performed, the side of the front surface 40a being a side of one of the plate surfaces of the silicon wafer 40, the walls 44 being formed in a grid pattern to surround groups of pixels 7.

After the cavity 45 (5) corresponding to each solid-state imaging device 1 is provided in a wafer state by performing partitioning using the walls 44, as described above, a protective sheet 50 is attached to a front surface 43a of the glass plate 43, as illustrated in FIG. 3A. The protective sheet 50 is used to protect the front surface 43a of the glass plate 43 from handling in the process of shaving off the silicon wafer 40 from the side of a back surface 40b of the silicon wafer 40.

In general, various thin films formed in previously performed various processes are stacked on the back surface 40b of the silicon wafer 40. Further, a fine scratch and dust may be attached to the back surface 40b due to handling performed during the processes. Thus, in some cases, the stacked thin films are removed to expose a silicon surface. Further, in recent years, there is a great demand for thinner and smaller smartphone and digital camera, and thus, it is also necessary to make a sensor device itself as thin as possible.

Thus, a backgrinding (BG) process of shaving off the silicon wafer 40 from the side of the back surface 40b is performed such that, in the wafer state, the silicon wafer 40 has a desired thickness that does not affect the device characteristics, as illustrated in FIG. 3B. In this process, the front surface 43a of the glass plate 43 is protected from handling using the protective sheet 50. In the BG process, for example, a backgrinding foil 58 such as diamond foil is used to polish the silicon wafer 40. Due to the BG process, the thickness of the silicon wafer 40 is changed from an original thickness T1 to a desired thickness T2 that is thinner than the original thickness T1.

The protective sheet 50 is attached to the entire front surface 43a of the glass plate 43 using equipment such as a laminator device. With respect to a removal of the protective sheet 50, for example, the type of protective sheet of which an adhesive strength is made weaker by being irradiated with UV light, the type of protective sheet of which an adhesive strength is made weaker by being heated, or the like is used as the protective sheet 50. Further, in order to increase the surface roughness of the back surface 40b of the silicon wafer 40, a mirror finishing process such as chemical polishing or dry polishing may be performed after the BG process.

Next, a process of forming a first insulation film 52 such as a nitride film made of, for example, Si3N4 or an oxide film made of, for example, SiO2 on the back surface 40b of the silicon wafer 40 is performed, as illustrated in FIG. 3C. It is favorable that, for example, plasma-enhanced chemical vapor deposition (PECVD) that makes it possible to form a film at a low temperature be used in general in order to form the first insulation film 52. However, the film-formation method is not limited to this, and high-frequency sputtering used to form an insulation film or another method for forming a film may be used.

In the process of forming the first insulation film 52, the first insulation film 52 may be formed in a state in which the protective sheet 50 used in the previous processes remains attached in order to protect the glass plate 43 from a scratch produced during handling and various reactant gas atmospheres during the PECVD process. Alternatively, another protective sheet that replaces the protective sheet 50 may be attached. Further, it is possible to form the first insulation film 52 without the protective sheet 50 when equipment that provides an environment in which there is no need to worry about, for example, damage of the glass plate 43 caused during handling or contamination of the glass plate 43 that is caused during PECVD, is available.

Next, patterning is performed on the first insulation film 52, as illustrated in FIG. 4A. That is, patterning is performed on the first insulation film 52 formed in the previous process to form a desired pattern, and a process of photolithography (a photolithography process) for exposing the underlying silicon wafer 40 is performed. In this process, the first insulation film 52 is partially removed using a technology such as reactive ion etching (RIE), such that an opening 52a of a fine pattern and an opening 52b are formed in the first insulation film 52, the opening 52a being used to open a through hole 40c (refer to FIG. 4B) for the through via 13 formed to pass through the silicon wafer 40 from the side of the back surface 40b of the silicon wafer 40 to the electrode pad 11, the opening 52b being used to make the silicon wafer 40 thin to form the concave portion 20.

With respect to the patterning performed on the first insulation film 52, a photoresist 53 made of a specified photosensitive material is used to perform patterning, and the photoresist 53 is removed after the first insulation film 52 is partially removed by, for example, RIE. Specifically, the following processes are sequentially performed as the patterning process. That is, the patterning process includes, for example, applying the photoresist 53 used as a mask and drying the applied photoresist 53, exposing the mask to perform patterning, removing, using a developer, a portion of the mask that corresponds to the openings 52a and 52b, performing plasma cleaning as necessary to remove a residue remaining in the removed portion using argon or oxygen, etching an opening of the mask by RIE, removing an unnecessary photoresist 53, and performing plasma cleaning as necessary to remove a residue remaining in the removed portion using argon or oxygen.

Next, the process of forming the through hole 40c for the through via 13 is performed, as illustrated in FIG. 4B. In this process, first, patterning is performed using a photolithography technology to form a photoresist 54 on the first insulation film 52 formed in the previous process, such that a portion of the photoresist 54 that corresponds to the opening 52a is opened. In other words, the photoresist 54 includes an opening 54a that is continuous with the opening 52a of the first insulation film 52.

Thereafter, etching is performed to form the through hole 40c in the silicon wafer 40 through the opening 52a of the first insulation film 52 and the opening 54a of the photoresist 54. Here, the process of forming the through-hole 40c is a process of forming a through-hole with a so-called high aspect ratio. Thus, for example, DRIE, an etching process exhibiting directivity higher than that of the normal RIE, is used to form the through-hole 40c. Compared to the case of the normal RIE, a high-density plasma is used to perform DRIE. Thus, the photoresist 54 having a relatively high resistance to plasma is used. After the through hole 40c is formed, the photoresist 54 is removed.

Next, a second insulation film 55 is formed to cover the entire surface including an inner surface of the through-hole 40c (FIG. 4C). A problem regarding an operation of a device such as current leakage caused due to a silicon surface of the silicon wafer 40 being exposed, is solved by covering the inner surface of the through hole 40c with the second insulation film 55.

The second insulation film 55 is formed in the entire surface, and thus a portion including the inner surface of the through hole 40c and the opening 52b of the first insulation film 52 is a portion of a single-layer insulation film formed of the second insulation film 55. Further, a portion in which there exists the first insulation film 52 is a portion of an insulation film of a two-layer structure that is formed of the first insulation film 52 and the second insulation film 55, and this results in achieving excellent insulating properties. As described above, an insulation film structure including a single-layer portion formed of the second insulation film 55 and a two-layer portion formed of the first insulation film 52 and the second insulation film 55 is the insulation film 15 in the solid-state imaging device 1. Note that an illustration of the first insulation film 52 is omitted in FIG. 4C.

The second insulation film 55 is formed to cover a contact portion on a back surface of the electrode pad 11 that faces an upper portion of the through hole 40c, and a portion, in the silicon wafer 40, in which the concave portion 20 is formed. Thus, patterning is performed using a photolithography technology to remove a portion, from among the second insulation film 55, that corresponds to the contact portion on the back surface of the electrode pad 11 and the portion in which the concave portion 20 is formed, as illustrated in FIG. 4C. Accordingly, a contact hole 55a that causes the back surface of the electrode pad 11 to be exposed, and an opening 55b used to form the concave portion 20 are formed in the second insulation film 55.

In the process of partially removing the second insulation film 55, first, coating is formed on the second insulation film 55 by, for example, applying a resist to the second insulation film 55 including a portion situated in the through-hole 40c. Here, it is necessary to adjust the viscosity of a resist and a coating method in order to not cause the resist to only enter a deep through hole 40c. Further, with respect to a process of exposing the resist, an exposure apparatus is used that makes it possible to broaden the depth of focus, or a method for performing exposure twice for the bottom of the through hole 40c and for the other portions is used as appropriate.

Next, a copper wiring layer 56 that corresponds to the wiring layer 14 in the solid-state imaging device 1 is formed on the side of the back surface 40b of the silicon wafer 40, as illustrated in FIG. 5A. The copper wiring layer 56 is used to form the solder ball 12 on the side of the back surface 40b of the silicon wafer 40 in a WCSP structure. The copper wiring layer 56 extends from the back surface of the electrode pad 11 to pass through the through hole 40c, and the solder ball 12 is connected to an extension portion of the copper wiring layer 56. The copper wiring layer 56 includes an in-hole wiring portion 56a that corresponds to the in-hole wiring portion 14a (refer to FIG. 1), and a planar wiring portion 56b that is formed along the back surface 40b and corresponds to the planar wiring portion 14b (refer to FIG. 1).

Before the copper wiring layer 56 is formed, a seed layer that is a thin film made of, for example, titanium (Ti) or copper (Cu) is formed in advance by a film-formation method such as sputtering. The seed layer is used as an electrode used when the copper wiring layer 56 is embedded in the through hole 40c by electroplating. Note that, before the copper wiring layer 56 is formed, a barrier metal film that is made of, for example, tantalum (Ta) or titanium (Ti) to be used to prevent diffusion of the in-hole wiring portion 56a may be formed by, for example, sputtering.

Patterning is performed by the photolithography process to form, in a specified region on the seed layer, a resist pattern that corresponds to a wiring pattern. Thereafter, by electroplating performed using the seed layer as an electrode, the copper wiring layer 56 is formed in a portion in which the seed layer is exposed by performing patterning. Accordingly, the in-hole wiring portion 56a and the planar wiring portion 56b that form the through via 13 are formed.

The copper wiring layer 56 is generally formed to have a thickness of about 10 μm. However, the thickness of the copper wiring layer 56 is increased or decreased as appropriate according to, for example, the type of a signal of the solid-state imaging device 1 or the number of signals of the solid-state imaging device 1. Further, after the copper wiring layer 56 is formed by electroplating, an unnecessary resist pattern is removed using, for example, a specialized removal solution or rinse, and the seed layer is removed by, for example, wet etching.

Next, a process of forming a solder resist 57 is performed, as illustrated in FIG. 5B. The solder resist 57 is formed to prevent a short circuit caused in wiring of the copper wiring layer 56 and to define a position on which the solder ball 12 is placed. In the solder resist 57, a land opening 57a from which the copper wiring layer 56 is exposed is formed in a portion on which the solder ball 12 is placed, such that the land opening 57a fits the size of the solder ball 12.

For example, a photosensitive resin using, for example, an epoxy resin as a base resin is used as the solder resist 57. This makes it possible to freely design the land opening 57a using a photomask used in the photolithography process. The following processes are sequentially performed as the photolithography process. That is, the photolithography process includes, for example, applying the solder resist 57 and drying the applied solder resist 57, exposing a mask corresponding to the land opening 57a to perform patterning, removing, using a developer, a portion of the solder resist 57 that corresponds to the land opening 57a, and performing plasma cleaning as necessary to remove a residue remaining in the removed portion using argon or oxygen.

A formation pattern of the solder resist 57 has a shape that does not cause the solder resist 57 to interfere with the portion on which the solder ball 12 is placed and the portion in which the concave portion 20 is formed. Further, the solder resist 57 is embedded in the through hole 40c in which the in-hole wiring portion 56a is formed.

Next, a process of forming the concave portion 20 correspondingly to each image sensor 2 on the side of the back surface 40b is performed, the back surface 40b being the other plate surface of the silicon wafer 40, in which the thickness of the silicon wafer 40 is partially reduced due to the formation of the concave portion 20. In other words, the concave portion 20 corresponding to each solid-state imaging device 1 is formed by partially removing, from the side of the back surface 40b, a portion of the silicon wafer 40 that corresponds to the image sensor 2.

In the present embodiment, the process of forming the concave portion 20 includes a first etching process and a second etching process, and the concave portion 20 is formed by a two-stage etching process. The process of forming the concave portion 20 is described below in detail.

First, upon performing etching for forming the concave portion 20, a process of forming a photoresist 61 on the side of the back surface 40b of the silicon wafer 40 such that the photoresist 61 covers a portion other than the portion in which the concave portion 20 is formed, is performed, as illustrated in FIG. 5C. The photoresist 61 is formed by the photolithography process described above. In other words, the photoresist 61 is applied and the applied photoresist 61 dried, the photoresist 61 is exposed to perform patterning, a portion of an opening 61a in a rectangular or square shape that corresponds to the portion in which the concave portion 20 is formed, is removed using a developer, and cleaning is performed as necessary to remove a residue remaining in the removed portion.

The photoresist 61 covers the solder resist 57, and covers the planar wiring portion 56b of the copper wiring layer 56 exposed from the land opening 57a. The photoresist 61 may be the same type of resist as the photoresists 53 and 54 described above, or may be another type of resist having a viscosity and physical properties that are different from those of the photoresists 53 and 54. However, it is favorable that the photoresist 61 have resistance to strong alkalis since a strong alkali solution is used when the concave portion 20 is formed. This will be described later.

After the photoresist 61 is formed, the first etching process of forming a semi-concave portion 20X by removing, from the silicon wafer 40, a portion corresponding to the concave portion 20 by dry etching is performed.

Figure 6A:
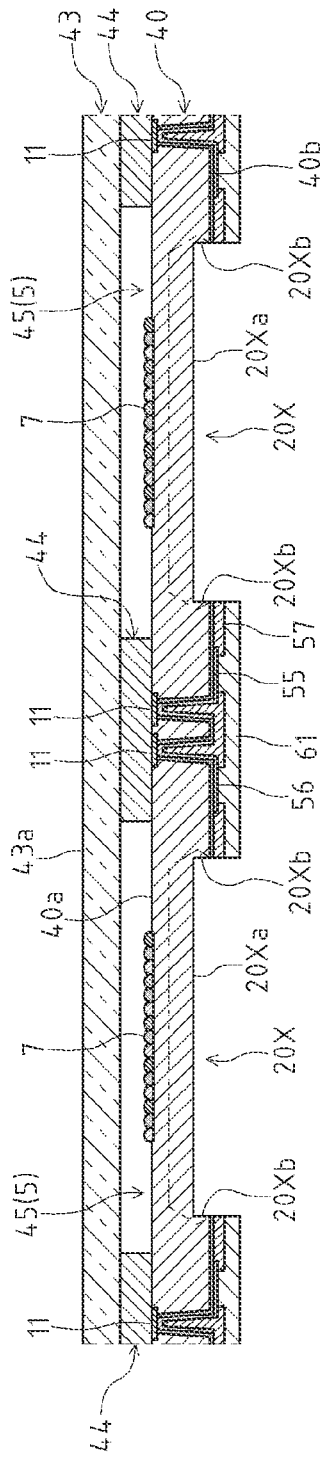
FIGS. 6A, 6B, and 6C are diagrams describing the method for producing the solid-state imaging device according to the first embodiment of the present technology.

As illustrated in FIG. 6A, in the first etching process, etching is performed on a silicon portion up to a necessary depth, using RIE, which is a type of dry etching, the silicon portion being exposed from the opening 61a of the photoresist 61 on the side of the back surface 40b of the silicon wafer 40. Accordingly, the semi-concave portion 20X is formed.

The semi-concave portion 20X has a rectangular or square shape in a bottom view. The semi-concave portion 20X includes, as etching faces, a bottom face 20Xa that is substantially parallel to the front surface 40a, and a lateral face 20Xb that is substantially orthogonal to the bottom face 20Xa. In other words, due to the bottom face 20Xa and the lateral face 20Xb surrounding the bottom face 20Xa, the semi-concave portion 20X has a shape along a substantially quadrate shape in a side cross-sectional view, and has a rectangular, flat concave shape in a plan view. As described above, the first etching process is to create a hole in a depth direction (a longitudinal direction) that is orthogonal to the plate surface of the silicon wafer 40.

The depth of the semi-concave portion 20X affects the bent form of a generally sidewise V-shape of the lateral face portion 22 of the final concave portion 20 in a cross-sectional view. Thus, the depth of the semi-concave portion 20X is determined according to a desired shape of the lateral face portion 22 of the concave portion 20.

Figure 6B:
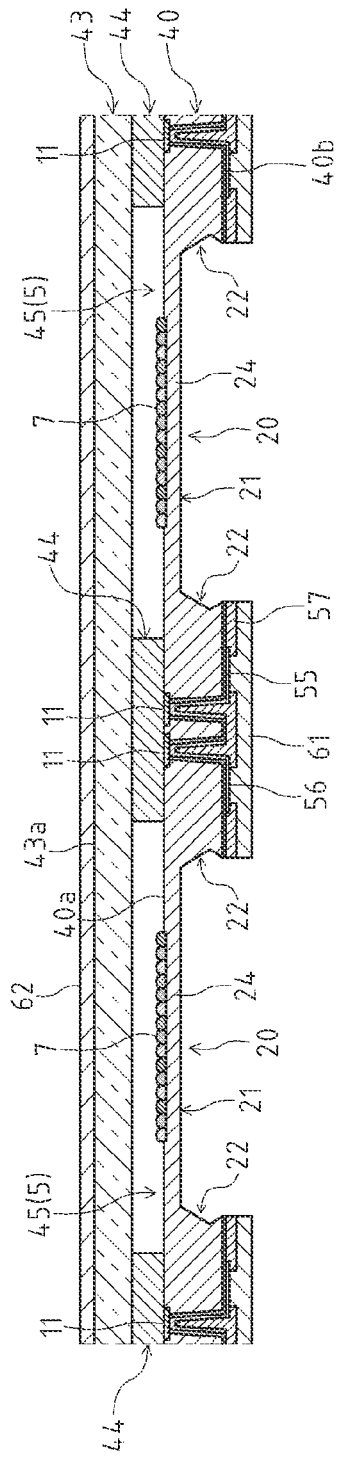

After the first etching process, the second etching process of forming the concave portion 20 by etching down into the semi-concave portion 20X by anisotropic etching is performed, as illustrated in FIG. 6B.

In the second etching process, the silicon wafer 40 in which the semi-concave portion 20X is formed by RIE is put into a strong alkali solution such as potassium hydroxide (KOH), and anisotropic etching is performed on silicon. Before the silicon wafer 40 is put into the strong alkali solution, a protective sheet 62 is attached to the front surface 43a of the glass plate 43 using dedicated equipment in order to protect the front surface 43a of the glass plate 43.

In anisotropic etching, for example, a so-called batch wet etching apparatus is used that deal with a plurality of silicon wafers 40 at a time. According to the wet etching apparatus, a wafer is put into a KOH solution heated to about 60° ° C. to 80° C., and etching is performed for a specified period of time while rotating and swinging the wafer such that the etching is uniformly performed over the surface of the wafer. The period of time for etching and the temperature of the KOH solution are accurately controlled, and this results in being able to obtain a desired amount of etching. Note that examples of a solution used when anisotropic etching is performed include tetramethylammonium hydroxide (TMAH) and ethylenediamine pyrocatechol (EDP) in addition to KOH.

Figure 6C:
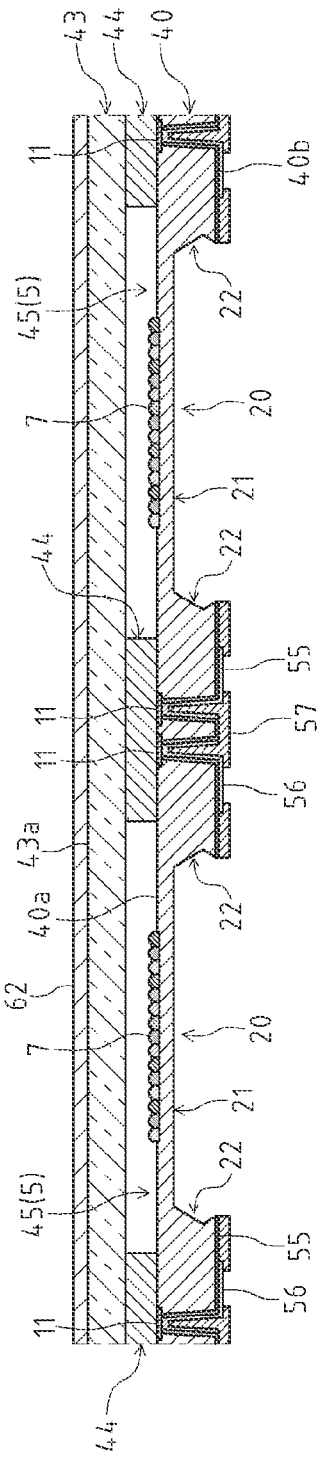

After the anisotropic etching is performed, an unnecessary portion of the photoresist 61 is removed, as illustrated in FIG. 6C. Here, cleaning is performed as necessary to remove a residue remaining in the removed portion of the photoresist 61 is performed by, for example, plasma cleaning. Note that, after the anisotropic etching is performed, the alkali solution may be washed away by a method such as quick dump rinse (QDR) and then water drying may be performed as necessary.

When the second etching process is performed as described above, the concave portion 20 is formed, the silicon wafer 40 is partially made thin from the side of the back surface 40b, in a portion corresponding to each image sensor 2, and a diaphragm shape is formed by the concave portion 20.

Here, a correlation between the depth of the semi-concave portion 20X and the shape of the lateral face portion 22 of the concave portion 20 is described. When anisotropic etching is performed on a silicon substrate of a (100) plane orientation that is widely used when producing an image sensor or LSI, etching performed on the (100) plane progresses to expose a (111) plane that forms an angle of about 55 degrees with an end plane in a plane direction. Thus, a dogleg shape (a sidewise V-shape), in a cross-sectional view, that is formed in a (111) plane orientation is larger if the depth of etching performed to form the semi-concave portion 20X is deeper. In other words, if the depth of the semi-concave portion 20X is deeper, the region dimension A1 of the first inclined surface 31 and the region dimension A2 of the second inclined surface 32 in the depth direction of the concave portion 20 are closer in proportion (refer to FIG. 1).

Specifically, as illustrated in FIGS. 8A and 8B, when the depth of the concave portion 20 is a constant depth D1, a proportion of the area of the first inclined surface 31 from among the faces forming the lateral face portion 22 of the concave portion 20 is larger (the proportion of the area of the second inclined surface 32 is smaller) if the etching depth of the semi-concave portion 20X (D2, D3) is deeper. In other words, the region dimension A1 of the first inclined surface 31 in the depth direction is larger if the depth of the semi-concave portion 20X is deeper. Note that, in FIGS. 8A and 8B, a region portion that is removed to form the semi-concave portion 20X in the silicon wafer 40 is indicated by a rectangular hatched portion B1 surrounded by a dot-dot-dash line.

Compared to the case illustrated in FIG. 8A in which the depth of the semi-concave portion 20X is a relatively shallow depth D2, the concave portion 20 has a larger width in a lateral direction when the depth of the semi-concave portion 20X is a relatively deep depth D3, as illustrated in FIG. 8B. In other words, a width dimension W3 in the lateral direction when the depth of the semi-concave portion 20X is the deep depth D3, is larger than a width dimension W2 in the lateral direction when the depth of the semi-concave portion 20X is the shallow depth D2, as illustrated in FIG. 8A. Here, the width dimension (W2, W3) in the lateral direction is a dimension between a position P1 and a position P2. The position P1 is each of a left end and a right end of the semi-concave portion 20X in a direction (a left-and-right direction in A and FIGS. 8A and 8B) in parallel with the plate surface of the silicon wafer 40 in a cross-sectional view of the silicon wafer 40. The position P2 is an apex of a corner portion formed by the first inclined surface 31 and the second inclined surface 32 of the lateral face portion 22 of the concave portion 20.

As described above, in the second etching process performed to form the concave portion 20 using anisotropic etching, the etching depth of the semi-concave portion 20X formed by the first etching process in advance makes it possible to control a bent shape formed by the first inclined surface 31 and the second inclined surface 32 of the lateral face portion 22 of the final concave portion 20. Thus, for example, when there is a need to make the bent shape of the lateral face portion 22 of the concave portion 20 relatively large, as illustrated in FIG. 8B, it is sufficient if the semi-concave portion 20X is relatively deeply formed in the first etching process.

For example, the size of the thin plate portion 24 having a diaphragm structure necessary for the image sensor 2 is a factor used to determine the depth of the semi-concave portion 20X. In other words, if the etching depth of the semi-concave portion 20X is deeper, the width in the lateral direction is larger when anisotropic etching is performed, and the area of the thin plate portion 24 is closer to the area of an opening situated at a lower end of the concave portion 20. With respect to the thin plate portion 24, there is a possibility that a difference between the pixels 7 in stress due to the thin plate portion 24 being deformed will be generated. Thus, it is favorable that the concave portion 20 be formed such that the entire pixel region 8 is in a range of the thin plate portion 24 corresponding to a bending portion.

Now return to the description of the method for producing the image-capturing apparatus 1. Next, the solder ball 12 is formed on a lower side of the solder resist 57 (on an upper side in FIG. 7A), as illustrated in FIG. 7A. The solder ball 12 is formed to be electrically connected to the planar wiring portion 56b of the copper wiring layer 56 through the land opening 57a of the solder resist 57.

The following are two examples of a method for forming the solder ball 12. One of the example methods includes selectively transferring flux to the land opening 57a of the solder resist 57 using a method such as printing; accurately placing the solder ball 12 formed into a desired size, using specialized equipment for placement; performing reflow at about 250° C. to 260° C.; and connecting the solder ball 12 to the copper wiring layer 56 through the land opening 57a. The other example method includes selectively transferring a flux-containing solder paste to the land opening 57a using a method such as printing; performing reflow at about 250° ° C. to 260° ° C. to form a solder into a ball shape; and connecting the solder used as the solder ball 12 to the copper wiring layer 56 through the land opening 57a. In both of the methods, cleaning is performed as necessary to remove the flux after the solder ball 12 is formed.

After the processes described above are performed, dicing is performed along a specified dicing line L1. In other words, a process of cutting a set of the silicon wafer 40, the wall 44, and the glass plate 43 into pieces such that the set is divided along a specified arrangement into portions that correspond to the respective image sensors 2.

A set of the silicon wafer 40 corresponding to the image sensor 2, the glass plate 43 corresponding to the glass 3, the wall 44 corresponding to the partition wall 4, and the like is divided by performing dicing. A plurality of chips (the solid-state imaging devices 1) created by performing dicing are picked up from the protective sheet 62 using, for example, specialized equipment. This results in obtaining a plurality of solid-state imaging devices 1 each having a package structure that includes the image sensor 2 including the concave portion 20 formed on the side of the back surface 2b, the glass 3, the partition wall 4, and the cavity 5 between the image sensor 2 and the glass 3, as illustrated in FIG. 7B.

Note that, in the method for the solid-state imaging device 1 described above, a method for forming the concave portion 20 in the silicon wafer 40 after the glass plate 43 is attached to the silicon wafer 40, is adopted. However, the concave portion 20 may be formed before the glass plate 43 is attached to the silicon wafer 40. In this case, there is a need to protect a pixel surface of the silicon wafer 40 with, for example, an alkali-proof resist or film when anisotropic etching is performed to form the concave portion 20, such that the pixel surface is not affected.

According to the solid-state imaging device 1 and the method for producing the solid-state imaging device 1 according to the present embodiment as described above, a package structure having the cavity 5 between the image sensor 2 and the glass 3 makes it possible to prevent damage such as a crack of a structural member and unsticking of the stuck structural members from being caused due to an increase in the internal pressure in the cavity 5, for example, upon reflow. Specifically, the following are effects provided by the solid-state imaging device 1 and the method for producing the solid-state imaging device 1 according to the present embodiment.

Here, a configuration in which the concave portion 20 is not formed in the semiconductor substrate 6 is assumed as a configuration of a comparative example that is compared to the solid-state imaging device 1 according to the present embodiment, as illustrated in FIG. 9. In the configuration of the comparative example, the back surface 2b of the image sensor 2 is a planar surface entirely parallel to the front surface 2a, and the image sensor 2 has a generally uniform thickness.

In the configuration of the comparative example, there is an increase in the internal pressure in the cavity 5 due to reflow performed to melt the solder ball 12. This results in there being a possibility that stress will be concentrated in a relatively weak portion of a package structure and thus damage will be caused. Examples of the relatively weak portion include junctions of the partition wall 4 with the image sensor 2 and the glass 3, and the partition wall 4 itself. The following are modes with respect to damage caused in a package structure.

First, there is a mode in which the partition wall 4 comes unstuck at a junction of the partition wall 4 with the image sensor 2 or the glass 3, that is, in, for example, portions indicated by reference signs M1 and M2 in FIG. 9. A resin material is often used as a material of the partition wall 4. Thus, the image sensor 2 having the front surface 2a made of an inorganic film such as SiN or SiO$_2$ and the partition wall 4 unstick from each other at their interface, or the glass 3 and the partition wall 4 unstick from each other at their interface. When the partition wall 4 comes unstuck, the internal pressure in the cavity 5 is released from the unsticking portion (refer to reference signs Q1 and Q2).

Further, there is a mode in which a crack 4X is produced in the partition wall 4 in, for example, a portion indicated by a reference sign R1 in FIG. 9. For example, when the partition wall 4 is made of a resin material, the material itself becomes fragile due to moisture absorption and a high temperature, and a cohesive failure occurs in the partition wall 4 itself due to stress caused by an increase in the internal pressure in the cavity 5. If the crack 4X is produced in the partition wall 4, the internal pressure in the cavity 5 is released from a portion of the crack (refer to a reference sign S1). Further, as the mode with respect to damage, there may also be a mode obtained by combining the above-described mode of unsticking and the above-described mode in which a crack is produced.

If a breakage in the mode described above is caused, a gap that connects the cavity 5 to the outside will be produced, and this may result in moisture, dust, or the like entering the cavity 5 through the gap. The moisture, the dust, or the like that has entered the cavity 5 may result in a reduction in the image quality and the performance of the solid-state imaging device 1. Further, with respect to the influence due to an increase in the internal pressure in the cavity 5, the glass 3 may be separated due to the partition wall 4 being broken, or the component itself such as the image sensor 2 or the glass 3 may be broken. This may result in a serious problem in terms of the reliability of the solid-state imaging device 1 itself.

Here, a phenomenon associated with an increase in the internal pressure in the cavity 5 is described. In principle, dry air is encapsulated in the cavity 5 in the production process. Water vapor in an atmosphere before the glass plate 43 is placed, or water vapor that passes through the wall 44 itself after the cavity 5 is formed (sealed) or through an adhesive used to bond the wall 44 to the silicon wafer 40 and to the glass plate 43, enters the cavity 5 at the same time.

It is known that, in general, an internal pressure $P_0$ in the cavity 5 (hereinafter referred to as a "cavity internal pressure") at room temperature is a sum of a dry air pressure $P_{A0}$ and a water-vapor partial pressure Pro at room temperature, where $P_0 = P_{A0} + P_{B0}$ (the Dalton's law of partial pressures). It has been confirmed that, when there is an increase in temperature, different partial pressures are caused at respective temperature according to the Boyle-Charles law with respect to $P_{A0}$ and according to the law of Tetens (the Tetens equation) with respect to $P_{B0}$.

In the configuration of the comparative examples illustrated in FIG. 9, the respective partial pressures are increased as a temperature upon reflow performed to perform mounting on, for example, a mother board (a peak temperature $T_P$: 240° ° C. to 260° C.) is increased. Consequently, a cavity internal pressure $P_P$ at the peak temperature $T_P$ may be greater than a breaking-limit pressure $P_D$ of the package structure. In this case, as described above, stress is concentrated on a relatively weak portion of the package structure, and damage is caused.

In particular, the dry air pressure $P_{A0}$ is inversely proportional to the volume of the cavity 5 at each temperature (hereinafter referred to as a "cavity volume"). Thus, when there is an increase in temperature, the cavity internal pressure $P_P$ is greater than the breaking-limit pressure $P_D$ unless the cavity volume is caused to be increased according to the temperature. Further, the water-vapor partial pressure $P_{B0}$ also tends to be rapidly increased as the temperature is increased in accordance with the law of Tetens. This accelerates an increase in the cavity internal pressure corresponding to the sum of $P_{A0}$ and $P_{B0}$.

The solid-state imaging device 1 according to the present embodiment includes a package structure in the form of a diaphragm, the package structure including the concave portion 20 in the image sensor 2. This makes it possible to increase the cavity volume due to bending of the semiconductor substrate 6 when there is an increase in the cavity internal pressure. This results in being able to suppress an excessive increase in cavity internal pressure, and thus to prevent damage such as a crack of a member situated around the cavity 5 and unsticking of the stuck members from being caused upon reflow.

Figure 10:
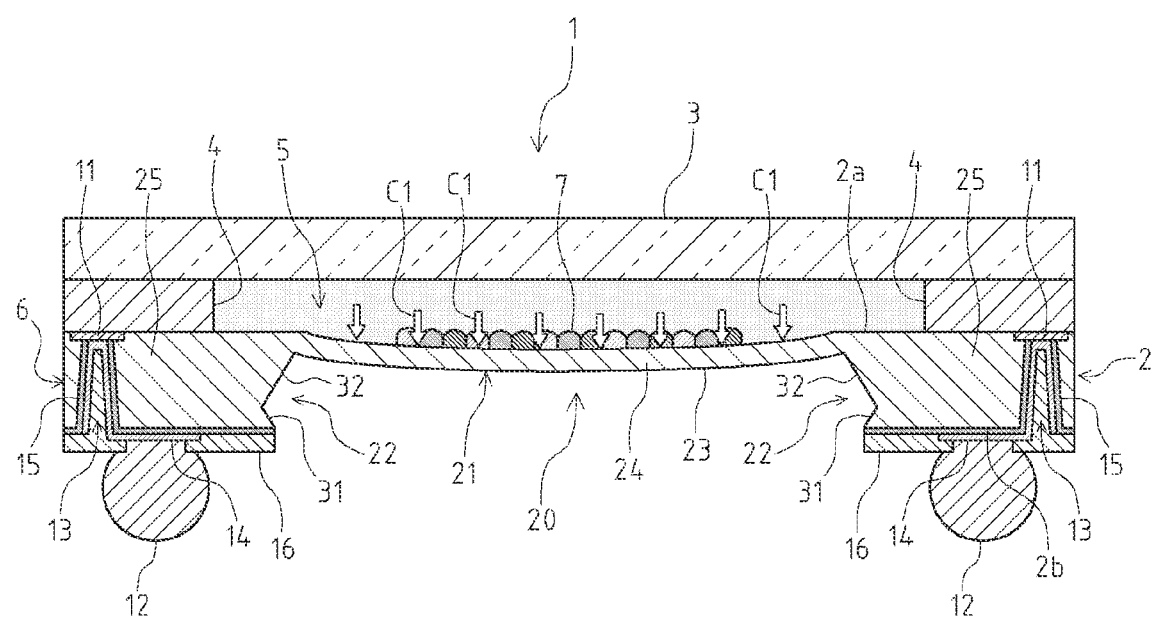
FIG. 10 is a diagram describing an action in the solid-state imaging device according to the first embodiment of the present technology.

Specifically, pressure is imposed on the side of the front surface 2a of the image sensor 2 when there is an increase in cavity internal pressure upon reflow, as illustrated in FIG. 10 (refer to an arrow C1). The thin plate portion 24 formed due to the concave portion 20 is a primary deformation portion in the image sensor 2, and due to the imposed pressure, the thin plate portion 24 is elastically deformed in a curved shape to expand outward (on the side of back surface 2b). In other words, the thin plate portion 24 is a primary portion, in the image sensor 2, that serves as a diaphragm portion having a restoring force, and this portion is bent outward with an increase in the cavity internal pressure.

Due to the image sensor 2 being deformed to expand outward as described above, it is possible to increase the cavity volume with an increase in cavity internal pressure that is caused upon reflow. This results in being able to suppress an excessive increase in the cavity internal pressure, and thus to prevent damage such as a crack of a structural member of the solid-state imaging device 1 and unsticking of the stuck structural members from being caused. Consequently, it is possible to prevent a reduction in a performance of the solid-state imaging device 1.

Further, in the solid-state imaging device 1 according to the present embodiment, the concave portion 20 is formed to have a rectangular shape in a bottom view, and the image sensor 2 is formed to have a frame structure due to the concave portion 20. Such a configuration makes it possible to define a portion that is deformed to be bent with an increase in the cavity internal pressure and to maintain the strength of a structure, compared to when an entire silicon substrate is simply made thin. Further, it is possible to keep the original outer size of the image sensor 2, and thus to prevent the outer size of the package structure from becoming larger.

In particular, when an entire silicon substrate is simply made thin, an external terminal in the image sensor 2 is easily moved, and this may result in being structurally unstable. Further, there is a problem in which there is a difficulty in replacing an existing structure. Thus, a structure, such as the solid-state imaging device 1 according to the present embodiment, in which a silicon substrate is partially made thin due to the concave portion 20 makes it possible to ensure a structural stability. Further, a portion having an original thickness of the silicon substrate exists in such a structure. Consequently, it is possible to easily replace an existing structure.

Further, the thin plate portion 24 that is a primary deformation portion in the image sensor 2 is a portion situated inward of the peripheral portion in which the solder ball 12 is arranged. Thus, for example, the contact portion for the solder ball 12 can be less affected by the deformation of the image sensor 2 due to an increase in the cavity internal pressure. This brings an advantage when, for example, an increase in the cavity internal pressure becomes larger than usual due to, for example, a large amount of moisture being absorbed into the cavity 5, since a bending deformation of the thin plate portion 24 is permitted to a large extent.

Further, in the solid-state imaging device 1 according to the present embodiment, there is no need to provide, to the cavity 5, a portion that communicates with the outside in order to prevent an increase in the cavity internal pressure. This makes it possible to prevent dust or the like from entering the cavity 5 as much as possible, and thus to prevent property degradation due to the image quality being affected by dust or the like.

Furthermore, in the solid-state imaging device 1 according to the present embodiment, there is no need to change a structure in the cavity 5 in order to prevent an increase in the cavity internal pressure. Thus, it is possible to prevent a malfunction in a device or poor characteristics of the device due to a separate member such as a moisture-absorption member falling off in a cavity. The malfunction in a device may occur or the device may exhibit poor characteristics in a configuration in which the separate member is provided within the cavity.

With respect to the cavity internal pressure, the solid-state imaging device 1 according to the present embodiment is configured to satisfy the following condition. In other words, the solid-state imaging device 1 is configured such that the cavity internal pressure $P_P$ at a specified peak temperature $T_P$ upon reflow performed to melt the solder ball 12 is less than an internal pressure, that is, the breaking-limit pressure $P_D$ that causes a crack of a member that forms the cavity 5 or unsticking of the stuck members that form the cavity 5.

In other words, the following condition is fulfilled with respect to the solid-state imaging device 1. When the cavity internal pressure reaches the cavity internal pressure $P_P$ at the peak temperature $T_P$ in the image sensor 2, the thin plate portion 24 formed due to the concave portion 20 is deformed to be bent, and the deformation results in an increase in cavity volume. When $V_1$ represents an increased volume and $V_0$ represents an original cavity volume (at room temperature), a cavity volume $V_2$ at the peak temperature $T_P$ is represented by $V_0+V_1$ ($V_2=V_0+V_1$). Further, the image-capturing apparatus 1 is configured such that the cavity internal pressure $P_2$ when the cavity volume reaches $V_2$ is smaller than a cavity internal pressure at a temperature $T_D$ that causes any damage to a cavity structure, that is, the breaking-limit pressure $P_D$ ($P_2<P_D$). As described above, the solid-state imaging device 1 is configured such that the effect of reducing a cavity internal pressure is provided by the semiconductor substrate 6 being bent due to the concave portion 20.

Further, in the solid-state imaging device 1 according to the present embodiment, the concave portion 20 includes the bottom face portion 21 and the lateral face portion 22, and the lateral face portion 22 having a bent shape formed by the first inclined surface 31 and the second inclined surface 32, the bent shape having a convex portion on the outer side of the concave portion 20, the bent shape being situated on the left and on the right. such a configuration makes it possible to cause the image sensor 2 to be stably deformed to be bent when there is an increase in cavity internal pressure, while maintaining the strength of the image sensor 2.

Furthermore, in the solid-state imaging device 1 according to the present embodiment, the lateral face portion 22 of the concave portion 20 is formed by a {111} plane in a silicon substrate. In other words, the first inclined surface 31 and the second inclined surface 32 forming the lateral face portion 22 both have a {111} plane. Such a configuration makes it possible to cause the image sensor 2 to be stably deformed to be bent when there is an increase in cavity internal pressure, while maintaining the strength of the image sensor 2. Further, it is possible to easily form the concave portion 20 by, for example, anisotropic etching by utilizing a crystal structure of the semiconductor substrate 6.

Moreover, in the method for producing the solid-state imaging device 1 according to the present embodiment, a two-stage etching process that includes the first etching process using dry etching, and the second etching process using anisotropic etching is adopted as a method for forming the concave portion 20. such a method makes it possible to obtain an accurate etching depth, that is, an accurate thickness of a leaving-target portion of the semiconductor substrate 6 by finely controlling, for example, an etching time in each etching process, a temperature of an etching solution in anisotropic etching, and a method for holding and swinging a substrate in an etching apparatus. Further, as described above, the adjustment of a depth of the semi-concave portion 20X formed by the first etching process makes it possible to control a bent shape formed by the first inclined surface 31 and the second inclined surface 32 included in the lateral face portion 22 of the concave portion 20.

<3. Modification of Solid-State Imaging Device According to First Embodiment>

Modifications of the solid-state imaging device 1 are described. A modification described below is a modification of a shape of the concave portion 20 in a cross-sectional view.

(First Modification)

Figure 11A:
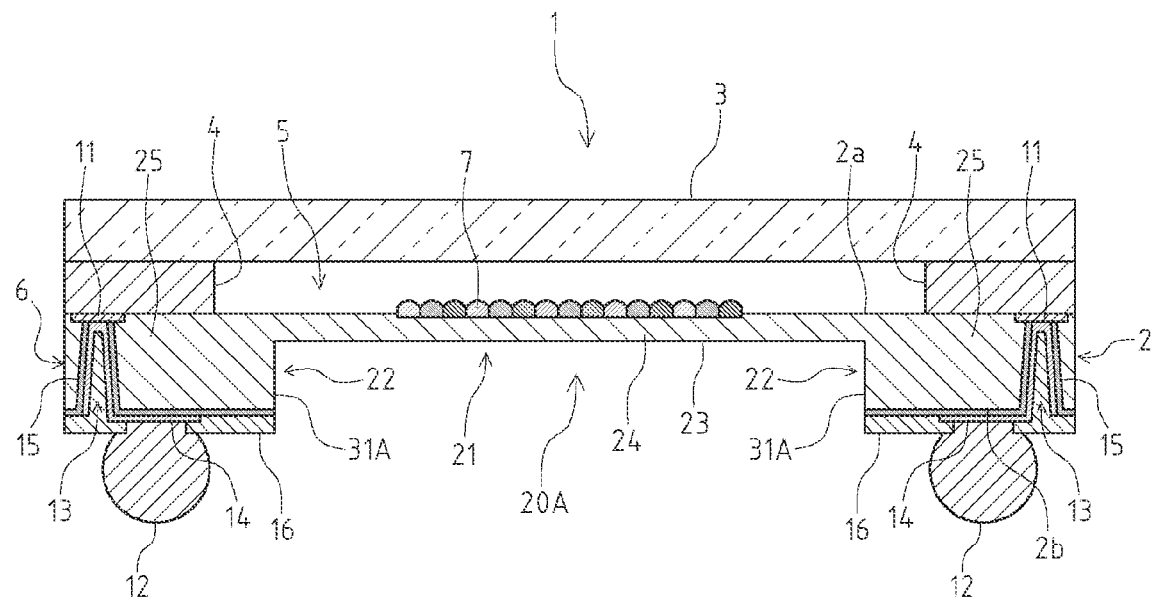
FIGS. 11A and 11B are set of cross-sectional views each illustrating a configuration of a modification of the solid-state imaging device according to the first embodiment of the present technology.

In a first modification, a concave portion 20A includes an opening shape along a rectangular shape in a side cross-sectional view, as illustrated in FIG. 11A. In other words, the concave portion 20A of the first modification includes, as a face forming the lateral face portion 22, an inner surface 31A that is a face vertical to the bottom surface 23 of the bottom face portion 21. An upper end of the inner surface 31A is connected to the bottom surface 23 of the bottom face portion 21 to form a corner portion of a right angle with the bottom surface 23. As described above, the concave portion 20A of the first modification is formed by the rectangular bottom surface 23 and the inner surface 31A formed on every side of the bottom surface 23. For example, the concave portion 20A of the first modification is formed by dry etching such as RIE as in the first etching process described above.

(Second Modification)

Figure 11B:
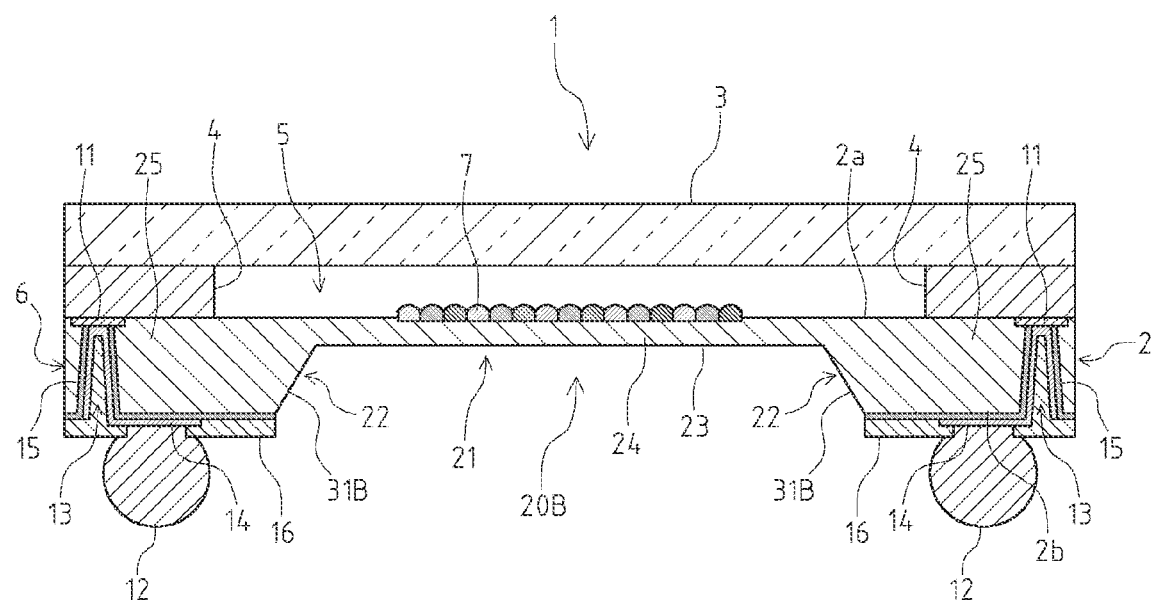

In a second modification, a concave portion 20B includes an opening shape along a trapezoidal shape in a side cross-sectional view, as illustrated in FIG. 11B. In other words, the concave portion 20B of the second modification includes, as a face forming the lateral face portion 22, an inclined surface 31B that is a face inclined with respect to the up-and-down direction from the outer side to the inner side in the left-and-right direction from the lower side to the upper side. An upper end of the inclined surface 31B is connected to the bottom surface 23 of the bottom face portion 21 to form a corner portion of an obtuse angle with the bottom surface 23. As described above, the concave portion 20B of the second modification is formed by the rectangular bottom surface 23 and the inclined surface 31B formed on every side of the bottom surface 23. For example, the concave portion 20B of the second modification is formed by anisotropic etching utilizing a crystalline structure of silicon as in the second etching process described above.

The configurations of the modifications also make it possible to prevent damage such as a crack of a structural member and unsticking of the stuck structural members from being caused due to an increase in cavity internal pressure. In other words, the shape of the concave portion 20 is not particularly limited. It is sufficient if it is possible to include, in the image sensor 2, a diaphragm structure including a portion deformed to be bent as the cavity internal pressure is increased, in order to prevent an excessive increase in the cavity internal pressure, for example, upon reflow. Further, each of the configurations of the modifications described above makes it possible to relatively easily form the concave portion 20A, 20B by a single etching process.

<4. Configuration Example of Solid-State Imaging Device According to Second Embodiment>

A second embodiment of the present technology is described. Note that a structural component in common with the first embodiment is denoted by the same reference numeral as the first embodiment, and a description thereof is omitted as appropriate.

Figure 12:
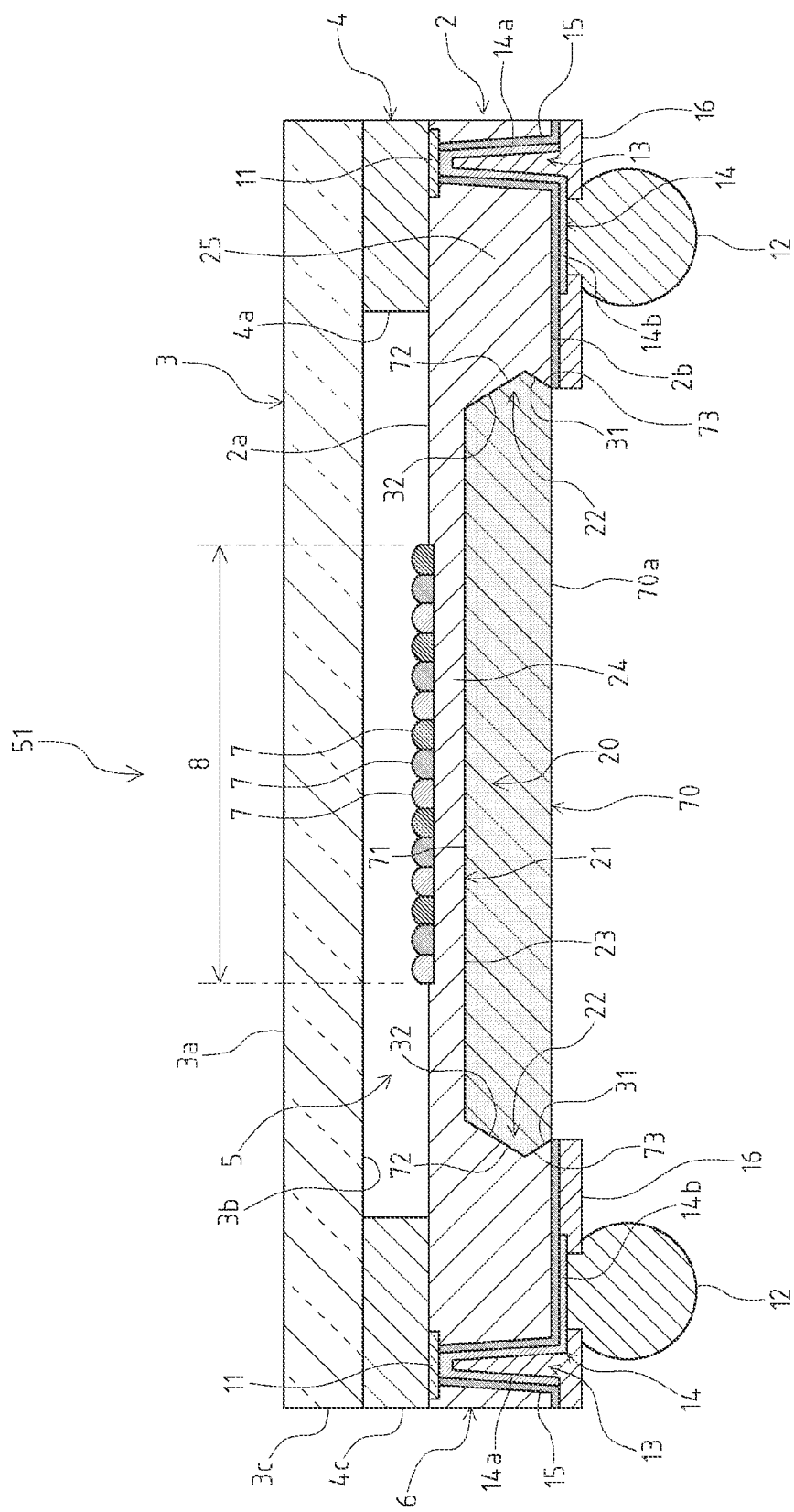
FIG. 12 is a cross-sectional view illustrating a configuration of a solid-state imaging device according to a second embodiment of the present technology.
Figure 13:
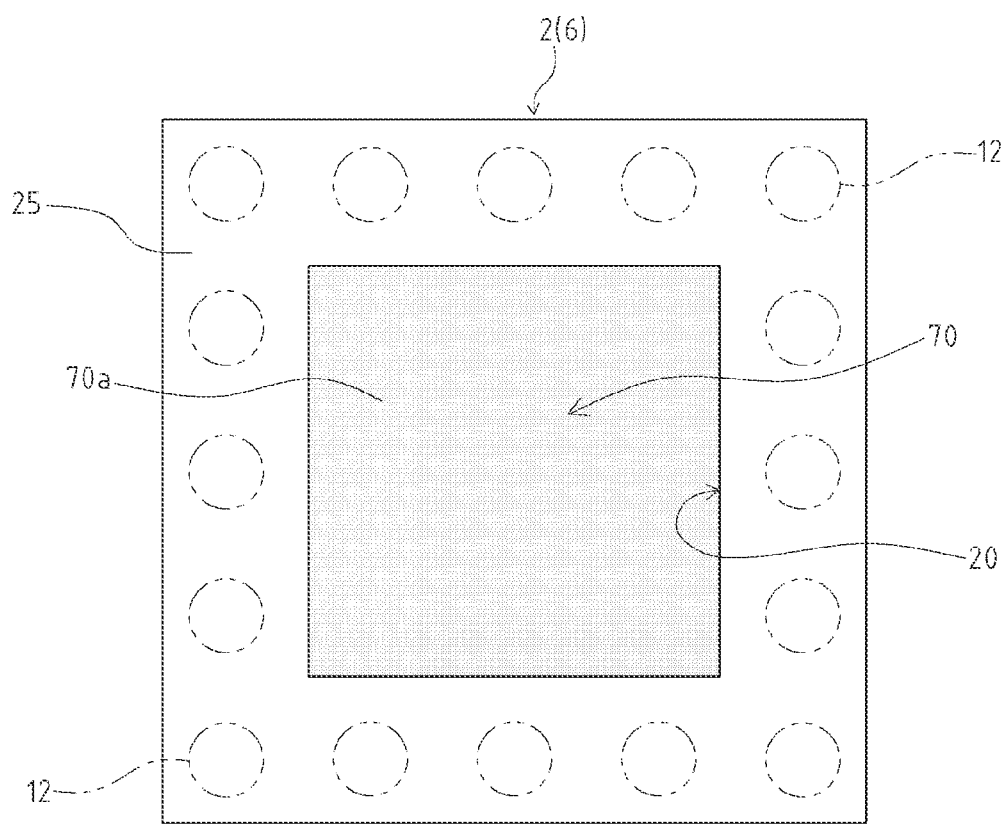
FIG. 13 illustrates the side of a back surface of a semiconductor substrate according to the second embodiment of the present technology.

As illustrated in FIGS. 12 and 13, a solid-state imaging device 51 according to the present embodiment includes a filling resin portion 70 that is a sealing resin portion provided in a state of being held in the concave portion 20. The filling resin portion 70 is provided to be filled into the concave portion 20, and is made of a thermoplastic resin. The filling resin portion 70 is a portion that is deformed with the semiconductor substrate 6 when there is an increase in cavity internal pressure, for example, upon reflow, as described above.

The filling resin portion 70 is formed to be filled into the concave portion 20, and includes a bottom surface 70a that is flush with the back surface 2b that is a flat portion situated outside of the concave portion 20 of the image sensor 2. In other words, the bottom surface 70a of the filling resin portion 70 faces the opening of the concave portion 20 on the side of the back surface 2b of the image sensor 2 (refer to FIG. 13).

Thus, the filling resin portion 70 has an outer shape that coincides surface shapes of the bottom face portion 21 and the lateral face portion 22 that form the concave portion 20, and has an overall outer shape in the form of a flat plate. In other words, in the formation of the concave portion 20, the filling resin portion 70 has a shape that coincides a portion removed by etching from the image sensor 2 in the form of a flat plate having a substantially constant thickness.

Specifically, in addition to the bottom surface 70a, the filling resin portion 70 includes an upper surface 71 that is a surface brought into contact with the bottom surface 23 of the concave portion 20, an upper inclined surface 72 that is a surface brought into contact with the second inclined surface 32, and a lower inclined surface 73 that is a surface brought into contact with the first inclined surface 31. As a result of including the filling resin portion 70 embedded in the concave portion 20, the image sensor 2 forms an integrated plate-shaped body with the filling resin portion 70, the integrated plate-shaped body having a substantially constant thickness.

The filling resin portion 70 has the property of being highly elastic at room temperature, and reinforces the strength of the image sensor 2 including the concave portion 20. Further, since the filling resin portion 70 has thermoplastic properties, the filling resin portion 70 has the property of being less elastic at a high temperature, for example, upon reflow, and is deformed with a deformation of the image sensor 2, such as a bending deformation of, for example, the thin plate portion 24, in order to avoid interfering with the deformation of the image sensor 2. It is favorable that, for example, a thermoplastic resin that exhibits a Young's modulus of about 500 MPa to 1 GPa at room temperature and exhibits a Young's modulus of about 10 MPa to 100 MPa at a high temperature, for example, upon reflow be used as a material of the filling resin portion 70 having the properties described above.

The material of the filling resin portion 70 is described. As described above, a material that has the property of being highly elastic at room temperature while maintaining the strength and has the property of being less elastic at a high temperature in order to avoid a deformation of a silicon substrate, is used as the material of the filling resin portion 70. Further, a paste material is used as the material of the filling resin portion 70 such that a printing process is applicable. Specifically, the following materials are used.

It is favorable that a paste composition that contains, as a primary component, one of a polyetherimide resin, a polyetheramide resin, and a polyetheramide-imide resin be used as a thermoplastic resin that is the material of the filling resin portion 70.

The polyetherimide resin, the polyetheramide resin, and the polyetheramide-imide resin are materials respectively obtained by adding the properties of polyether having flexibility to thermoplastic resins such as an imide resin, an amide resin, and an amide-imide resin, and are widely used for, for example, a portion to which a thermal stress is applied, or a joining portion of members of different linear expansions. It is favorable that, for example, "HIMAL (trade name)", which is a polyetheramide resin manufactured by Hitachi Chemical Co., Ltd., or a HIMAL-based paste resin be used as a thermoplastic resin used to form the filling resin portion 70.

Further, the thermoplastic resin used to form the filling resin portion 70 may be a paste composition obtained by adding a segment having plastic properties to one of a polyimide resin, a polyamide resin, and a polyamide-imide resin.

Specifically, for example, a material obtained by adding siloxane imide of a soft segment to an imide resin (aromatic polyimide) of a hard segment is used as the material of the filling resin portion 70. The hard segment has a structure having the property of being highly elastic and highly thermally resistant, and the soft segment has a structure having the property of being less elastic and flexible. Thus, when a material obtained by adding siloxane imide to an imide resin is used as a material of the filling resin portion 70, as described above, this makes it possible to obtain the filling resin portion 70 having both the property of being highly elastic and highly thermal resistant and the property of being less elastic and flexible.

Furthermore, the thermoplastic resin used to form the filling resin portion 70 may be a paste composition that contains, as a primary component, one of a polyimide resin, a polyamide resin, and a polyamide-imide resin, and further contains thermoplastic resin particles.

With respect to such a paste composition, a resin filler having the property of not dissolving in a solvent at room temperature but dissolving by being heated is used to obtain a material in the form of a paste. Specifically, a material obtained by kneading a polyetheramide resin used as a base resin with a resin filler having an adjusted elastic modulus can be used as the material of the filling resin portion 70. Such a material is used as a base paste, and, for example, low-elasticity rubber particles are added to the obtained material as resin particles. The adjustment of an amount of low-elasticity rubber added makes it possible to control the elastic modulus of the paste composition. Here, it is favorable that, for example, "HIMAL (trade name)", which is a polyetheramide resin manufactured by Hitachi Chemical Co., Ltd. be used as the base resin.

Further, a material obtained by adding a thermoplastic material such as a polyamide silicone copolymer or a polyimide-amide silicone copolymer, or a material obtained by combining the obtained material with another material may be used as the material of the filling resin portion 70.

<5. Method for Producing Solid-State Imaging Device According to Second Embodiment>

An example of a method for producing the solid-state imaging device 51 according to the second embodiment of the present technology is described with reference to FIGS. 14A, 14B, 15A, and 15B. The method for producing the solid-state imaging device 51 according to the present embodiment is different from the method for producing the solid-state imaging device 1 according to the first embodiment in including a process of forming the filling resin portion 70.

In other words, the method for producing the solid-state imaging device 51 according to the present embodiment is a method obtained by including, in the method for producing the solid-state imaging device 1 described above, a process of forming the filling resin portion 70 in the concave portion 20 by filling the concave portion 20 with a sealing resin 75 that is a thermoplastic resin, the filling resin portion 70 being deformed with the semiconductor substrate 6 that forms the image sensor 2, the process of forming the filling resin portion 70 being performed before a process of performing dicing to obtain separate chips.

Specifically, in the process of producing the solid-state imaging device 51 according to the present embodiment, the process of forming the filling resin portion 70 is performed after the process of forming the concave portion 20 is performed (refer to FIG. 6C), as illustrated in FIGS. 14A and 14B.

In this process, first, the sealing resin 75 that is the material of the filling resin portion 70 is printed using a printing machine including a squeegee 76, as illustrated in FIG. 14A. The sealing resin 75 is initially in the form of a paste and thus it is possible to perform printing. For example, a stencil 77 made of a nickel alloy is used as a mask for printing when the sealing resin 75 is printed using the printing machine. A patterning opening 77a that coincides the opening of the concave portion 20 is formed in the stencil 77.

The stencil 77 is set on the solder resist 57 in a state in which each patterning opening 77a is aligned to coincide a corresponding one of the concave portions 20. When the squeegee 76 moves on the set stencil 77, the sealing resin 75 is filled into the concave portion 20 through the patterning opening 77a, and a surface 75a of the sealing resin 75 is smoothed. Thereafter, the stencil 77 is removed, and then the printing of the sealing resin 75 is completed. Note that the method for printing the sealing resin 75 is not particularly limited, and any other methods can be used as appropriate.

After the sealing resin 75 is printed, baking is performed under a specified temperature condition such that the solvent evaporates from the paste sealing resin 75 and the sealing resin 75 is solidified. The temperature at which the baking is performed is set as appropriate according to the sealing resin 75 and a solvent contained in the sealing resin 75. Further, for example, a hot plate or an oven is appropriately selected and used as necessary as equipment used for baking. When baking is performed, the sealing resin 75 in the concave portion 20 is solidified, and the filling resin portion 70 is formed, as illustrated in FIG. 14B. Note that the method for forming the filling resin portion 70 may be a method other than printing.

Figure 15A:
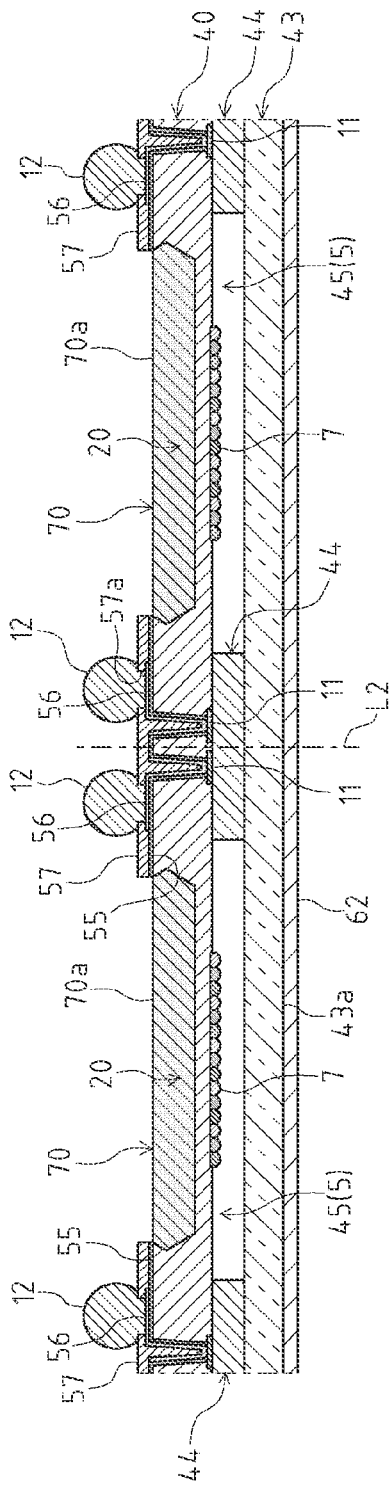
FIGS. 15A and 15B are diagrams describing the method for producing the solid-state imaging device according to the second embodiment of the present technology.
Figure 15B:
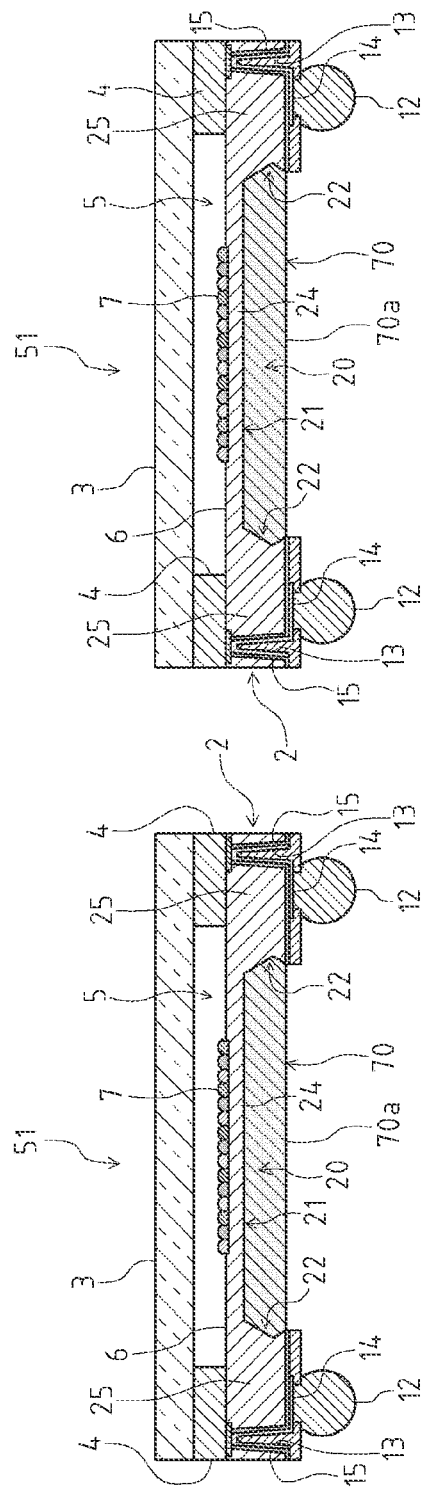

Thereafter, as in the first embodiment, the solder ball 12 is formed on the lower side of the solder resist 57 (on an upper side in FIG. 15A), as illustrated in FIG. 15A, and then dicing is performed along a specified dicing line L2. This results in obtaining a plurality of solid-state imaging devices 51 each having a package structure that includes the image sensor 2 including the concave portion 20 formed on the side of the back surface 2b, the glass 3, the partition wall 4, and the cavity 5 between the image sensor 2 and the glass 3, and further including the filling resin portion 70 in the concave portion 20, as illustrated in FIG. 15B.

The solid-state imaging device 51 according to the present embodiment and the method for producing the solid-state imaging device 51 as described above provide the following effects in addition to the effects provided by the solid-state imaging device 1 and the method for producing the solid-state imaging device 1 according to the first embodiment.

In other words, due to the solid-state imaging device 51 according to the present embodiment including, in the concave portion 20, the filling resin portion 70 made of a thermoplastic resin, it is possible to reinforce, at room temperature, the stiffness of a package structure that includes the image sensor 2 made thin due to the concave portion 20, and to suppress an excessive increase in cavity internal pressure at a high temperature, for example, upon reflow without interfering with a bending deformation of the image sensor 2 caused due to the concave portion 20. This results in being able to prevent the package structure from being damaged.

Figure 16:
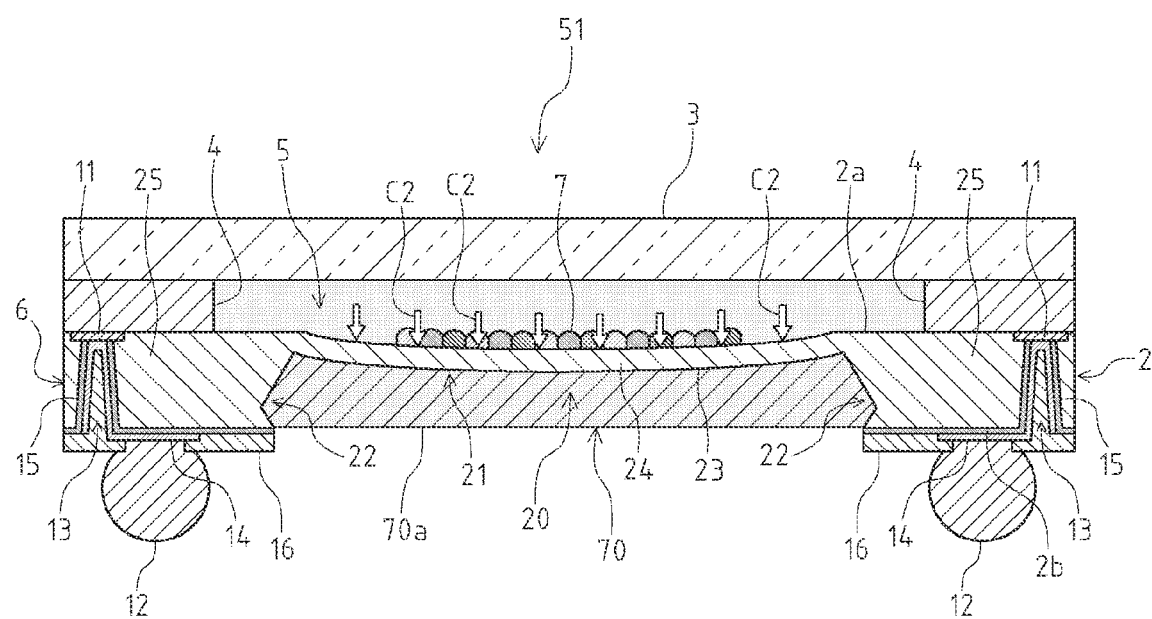
FIG. 16 is a diagram describing an action in the solid-state imaging device according to the second embodiment of the present technology.

Specifically, pressure is imposed on the side of the front surface 2a of the image sensor 2 when there is an increase in cavity internal pressure upon reflow, as illustrated in FIG. 16 (refer to an arrow C2). The thin plate portion 24 is a primary portion, in the image sensor 2, that serves as a diaphragm portion, and due to the imposed pressure, this portion is bent outward with an increase in the cavity internal pressure.

Here, the filling resin portion 70 has thermoplastic properties. Thus, the elastic modulus of the filling resin portion 70 is reduced due to an increase in temperature, and the filling resin portion 70 is deformed with a deformation of the image sensor 2. In other words, the filling resin portion 70 does not interfere with the deformation of the image sensor 2. Thus, due to the image sensor 2 being deformed to expand outward, it is possible to increase the cavity volume, and thus to suppress an excessive increase in cavity internal pressure that may cause the damage of the package structure.

Further, with respect to the bending deformation of the image sensor 2 at a high temperature, the filling resin portion 70 serves as a cushion to receive the bending deformation of the image sensor 2. Thus, stress applied to the thin plate portion 24 by the cavity internal pressure is relaxed, and this makes it possible to suppress, for example, breakage such as a crack produced in the thin plate portion 24 or unsticking of the partition wall 4.

Furthermore, even when the image sensor 2 is made thin by forming the concave portion 20 and processed into a diaphragm shape, it is possible to ensure a sufficient impact resistance due to a strong opposing strength of silicon itself. However, in the case of a high vibration environment of usage or the like, the thin plate portion 24 is vibrated by being affected by the vibration, and this may result in affecting the imaging characteristics. The filling resin portion 70 is a portion that supports the thin plate portion 24, a thin portion, from the side of a back surface of the thin plate portion 24. Thus, the filling resin portion 70 makes it possible to suppress vibration of the thin plate portion 24. This results in being able to effectively maintain the imaging characteristics. Further, the filling resin portion 70 makes it possible to prevent an external force applied to the thin plate portion 24 or an impact imposed from outside, and thus to protect the thin plate portion 24. In other words, the filling resin portion 70 makes it possible to improve an impact resistance of the thin plate portion 24.

Moreover, it is possible to keep the original outer size of the image sensor 2 since the filling resin portion 70 is provided in the concave portion 20, and thus to prevent the outer size of the package structure from becoming larger.

Further, in the solid-state imaging device 51 according to the present embodiment, the cavity internal pressure $P_P$ at a specified peak temperature $T_P$ upon reflow performed to melt the solder ball 12 is less than the breaking-limit pressure $P_D$ that causes a crack of a member that forms the cavity 5 or unsticking of the stuck members that form the cavity 5, as in the case of the solid-state imaging device 1 according to the first embodiment.

Further, in the solid-state imaging device 51 according to the present embodiment, the lateral face portion 22 serves as a stopper due to the bent shape of the lateral face portion 22 that is formed by the first inclined surface 31 and the second inclined surface 32, being adopted as a shape of the concave portion 20. This makes it possible to prevent the filling resin portion 70 from unsticking or falling off. In other words, according to the concave portion 20 that includes the lateral face portion 22 having a bent shape, a portion of the lateral face portion 22 that forms a sidewise V-shape in a cross-sectional view, in particular, an inwardly protruding portion that is formed by the first inclined surface 31 and the back surface 2b and included in an edge of an opening, serves as a portion that locks the filling resin portion 70, and thus the concave portion 20 holds therein the filling resin portion 70. This results in being able to effectively prevent the filling resin portion 70 from coming off or being separated from the concave portion 20.

Furthermore, in the present embodiment, in addition to the size of the thin plate portion 24 in the first embodiment, the degree of risk that the filling resin portion 70 may unstick or fall off is a factor necessary to determine the etching depth of the semi-concave portion 20X formed by the first etching process, in order to control a bent shape of the lateral face portion 22 of the concave portion 20 formed by anisotropic etching. In other words, if the etching depth of the semi-concave portion 20X is deeper, the width in the lateral direction is larger (a sidewise V-shape in a cross-sectional view is larger) when anisotropic etching is performed. This makes the filling resin portion 70 less likely to unstick or to fall off.

Moreover, in the solid-state imaging device 51 according to the present embodiment, it is possible to perform laser marking on the filling resin portion 70.

<6. Modification of Method for Producing Solid-State Imaging Device According to Second Embodiment>

A modification of the method for producing the solid-state imaging device 51 is described with reference to FIGS. 17A, 17B, 17C, 18A, 18B, 18C, 19A, 19B, and 19C. The production method according to the modification described below is different from the production method described above in that, first, the concave portion 20 and the filling resin portion 70 are formed, and then the copper wiring layer 56 and the like that form the through via 13 are formed.

Thus, as in the production method described above, in the production method according to the modification, first, the wall 44 that corresponds to the partition wall 4 is formed on the silicon wafer 40 on which the pixels 7 are formed, and the glass plate 43 that corresponds to the glass 3 is attached to the silicon wafer 40 (refer to FIG. 3A). Next, the protective sheet 50 is attached to the front surface 43a of the glass plate 43, and then the BG process of shaving off the silicon wafer 40 from the side of the back surface 40b is performed using the backgrinding foil 58 (refer to FIG. 3B). Then, the process of forming the first insulation film 52 such as a nitride film or an oxide film on the back surface 40b of the silicon wafer 40 is performed (refer to FIG. 3C). Subsequent processes are different from the production method described above.

In the following processes, first, patterning is performed on the first insulation film 52 by the photolithography process, as illustrated in FIG. 17A. In this process, patterning is performed using a photoresist 153. The first insulation film 52 is partially removed using a technology such as RIE, such that the opening 52b used to make the silicon wafer 40 thin to form the concave portion 20 is formed in the first insulation film 52. In the patterning process, the following processes are performed in a specified order: applying the photoresist 153 and drying the applied photoresist 153, performing partial removal, performing plasma cleaning, and the like, as described above. Here, with respect to the photoresist 153, a portion of an opening 153a that corresponds to the portion in which the concave portion 20 is formed, is removed. Note that it is favorable that the photoresist 153 have resistance to strong alkalis since a strong alkali solution is used when the concave portion 20 is formed.

Next, as in the production method described above, the process of forming the concave portion 20 on the side of the back surface 40b of the silicon wafer 40 is performed by the two-stage etching process including the first etching process and the second etching process.

In other words, the semi-concave portion 20X is formed by dry etching such as RIE, as illustrated in FIG. 17B. Thereafter, the protective sheet 62 is attached to the front surface 43a of the glass plate 43, as illustrated in FIG. 17C, and the concave portion 20 is formed by anisotropic etching using a strong alkali solution such as KOH. After the anisotropic etching is performed, an unnecessary portion of the photoresist 153 is removed.

Figure 18A:
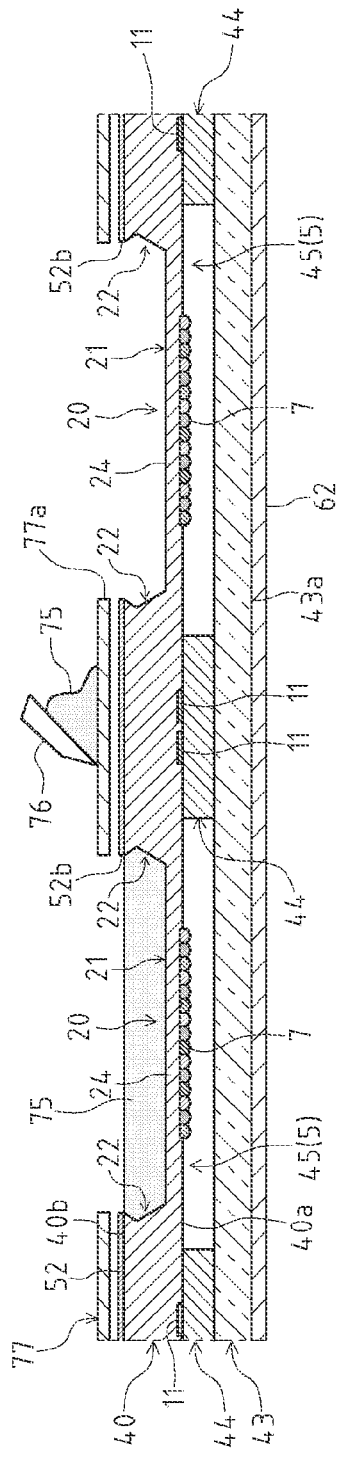
FIGS. 18A, 18B, and 18C are diagrams describing the modification of the method for producing the solid-state imaging device according to the second embodiment of the present technology.

Next, as in the production method described above, the process of forming the filling resin portion 70 is performed. In other words, first, using the stencil 77 including the patterning opening 77a, the paste sealing resin 75 is printed using the printing machine including the squeegee 76, as illustrated in FIG. 18A. Here, for example, the stencil 77 is set to be situated slightly away from the first insulation film 52, in order to protect the first insulation film 52. After the sealing resin 75 is printed, baking is performed to form the filling resin portion 70 in the concave portion 20, as illustrated in FIG. 18B.

Figure 18B:
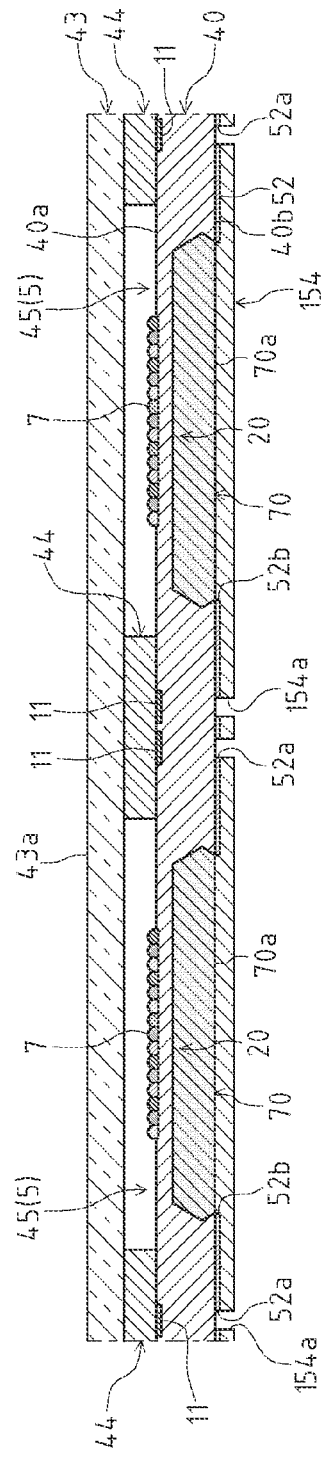

Next, patterning is performed on the first insulation film 52 by the photolithography process, as illustrated in FIG. 18B. In this process, patterning is performed using a photoresist 154. The first insulation film 52 is partially removed using a technology such as RIE, such that the opening 52a of a fine pattern is formed in the first insulation film 52, the opening 52a being used to open the through hole 40c (refer to FIG. 18C) for the through via 13 formed to pass through the silicon wafer 40 from the side of the back surface 40b of the silicon wafer 40 to the electrode pad 11. In other words, in this process, patterning is performed using a photolithography technology to form the photoresist 154 on the first insulation film 52, such that an opening 154a that is continuous with the opening 52a is formed.

Figure 18C:
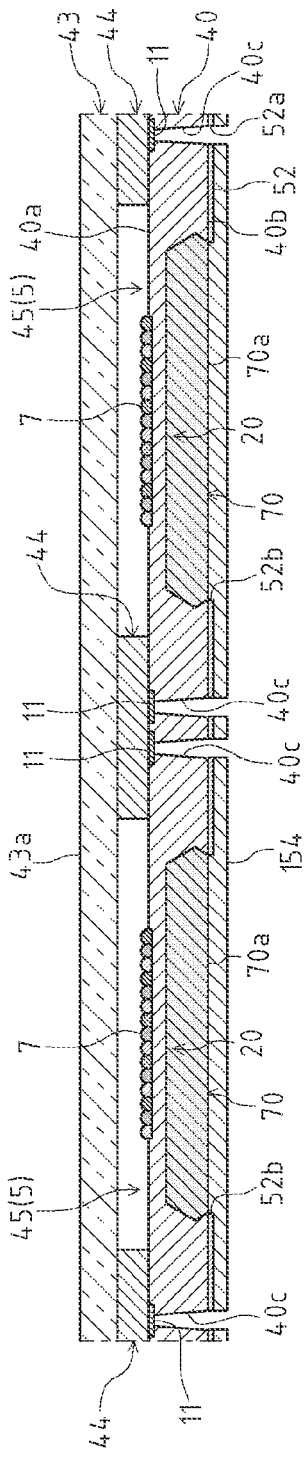

Thereafter, etching is performed to form the through hole 40c in the silicon wafer 40 through the opening 52a of the first insulation film 52 and the opening 154a of the photoresist 154, as illustrated in FIG. 18C. Here, DRIE is used as the etching, as described above. Thus, the photoresist 154 having a relatively high resistance to plasma is used. After the through hole 40c is formed, the photoresist 154 is removed.

Next, as in the production method described above, the second insulation film 55 corresponding to the insulation film 15 in the solid-state imaging device 51, the copper wiring layer 56 corresponding to the wiring layer 14 in the solid-state imaging device 51, and the solder resist 57 used to provide the solder ball 12 are formed in this order.

In other words, first, the second insulation film 55 that covers the inner surface of the through hole 40c and includes the contact hole 55a, and the opening 55b corresponding to the opening of the concave portion 20 is formed, as illustrated in FIG. 19A. Next, the copper wiring layer 56 that includes the in-hole wiring portion 56a, and the planar wiring portion 56b that is formed along the back surface 40b, is formed by electroplating, as illustrated in FIG. 19B. Next, the solder resist 57 that includes the land opening 57a is formed, as illustrated in FIG. 19C.

Then, as in the production method described above, the solder ball 12 is formed, and then dicing is performed along the specified dicing line L2 (refer to FIG. 15A). This results in forming the concave portion 20 in the solid-state imaging device 51, and in obtaining a plurality of solid-state imaging devices 51 each including the filling resin portion 70 in the concave portion 20 (refer to FIG. 15B).

<7. Configuration Example of Solid-State Imaging Device According to Third Embodiment>

A third embodiment of the present technology is described. Note that a structural component in common with the first and second embodiments is denoted by the same reference numeral as the first and second embodiments, and a description thereof is omitted as appropriate.

Figure 20:
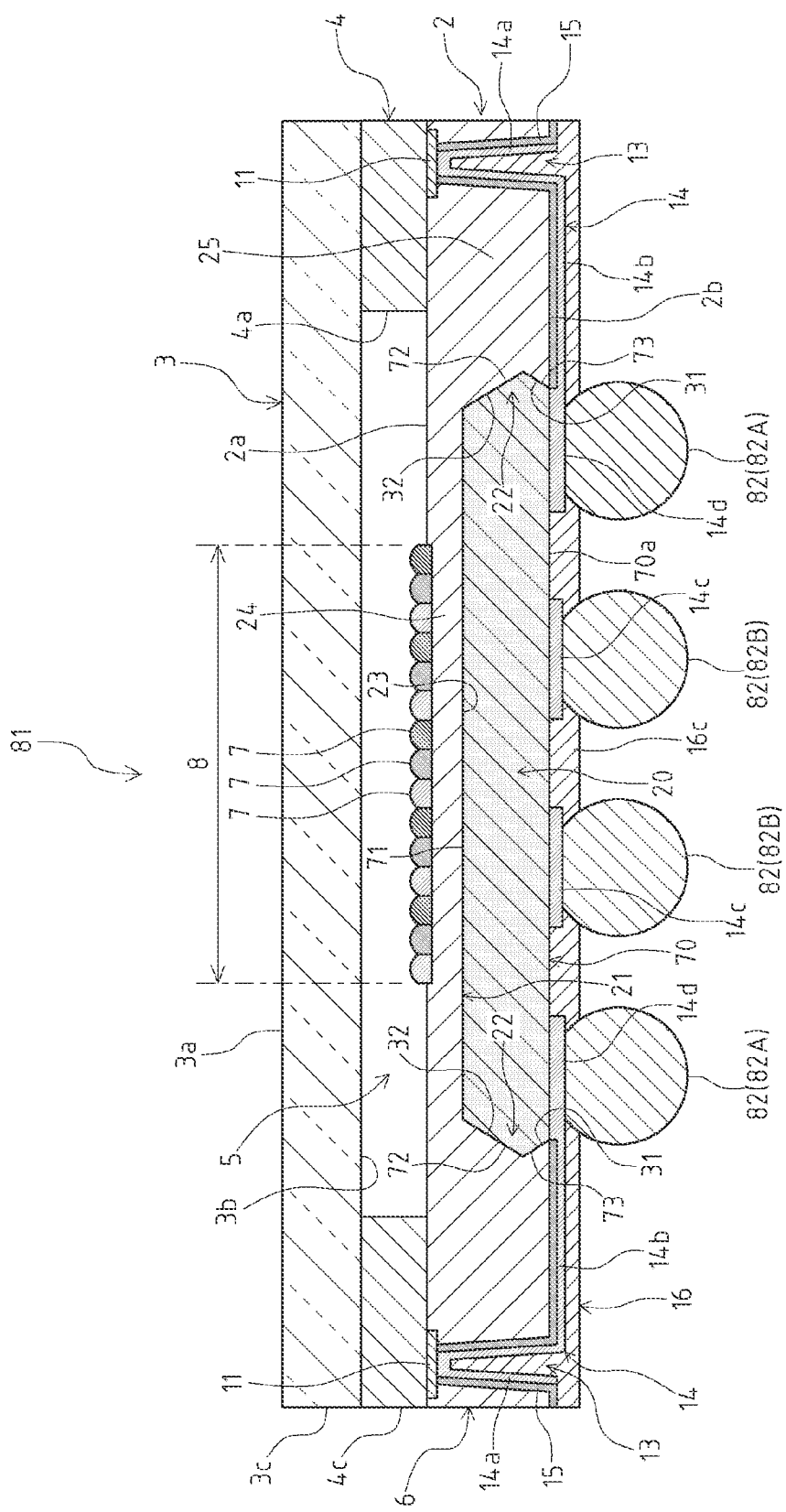
FIG. 20 is a cross-sectional view illustrating a configuration of a solid-state imaging device according to a third embodiment of the present technology.
Figure 21:
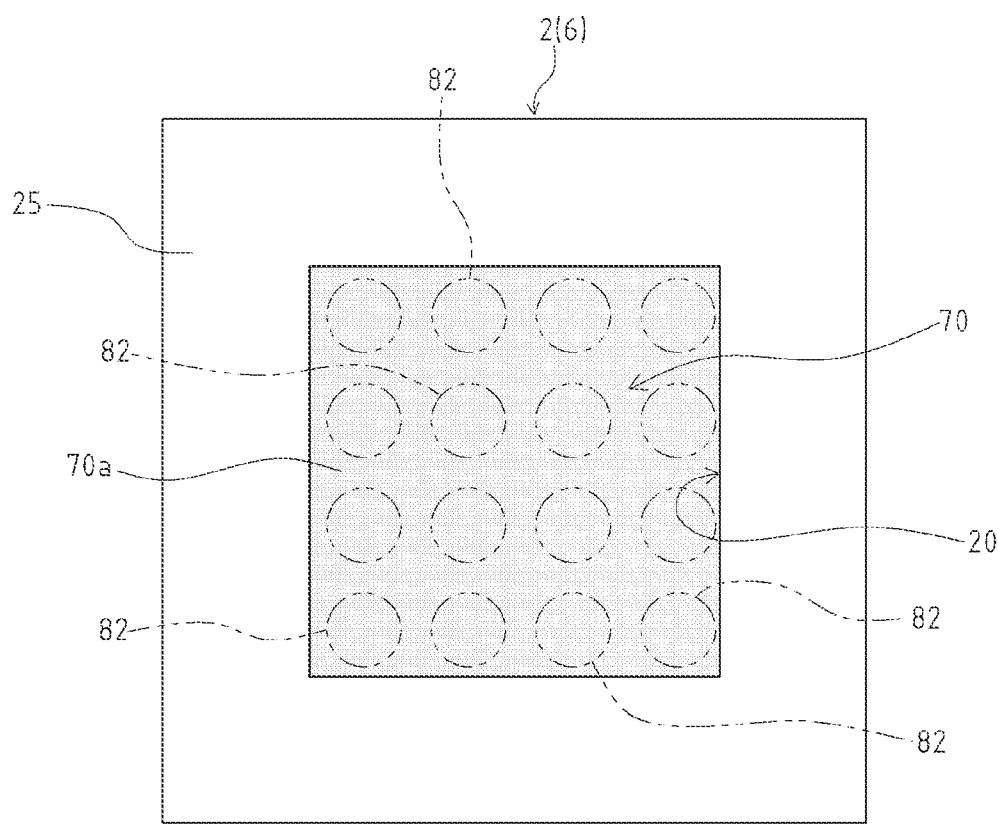
FIG. 21 illustrates the side of a back surface of a semiconductor substrate according to the third embodiment of the present technology.

As illustrated in FIGS. 20 and 21, a solid-state imaging device 81 according to the present embodiment includes a plurality of solder balls 82 provided on the side of a bottom surface 70a that is the surface of the filling resin portion 70. The solder ball 82 is a solder portion used to mount the image sensor 2.

In the present embodiment, the plurality of solder balls 82 is two-dimensionally arranged in an array on the side of the bottom surface 70a of the filling resin portion 70. In other words, compared with the solid-state imaging device 51 according to the second embodiment, the solid-state imaging device 81 according to the present embodiment includes the plurality of solder balls 82 arranged in an array on side of the surface of the filling resin portion 70, instead of the plurality of solder balls 12 arranged in the peripheral portion on the side of the back surface 2b of the image sensor 2. However, the plurality of solder balls 82 may be provided together with the plurality of solder balls 12. Further, FIG. 21 schematically illustrates the arrangement of the solder balls 82, and, in the example illustrated in FIG. 21, the solder balls 82 are provided in a matrix in an arrangement of four rows by four columns.

In order to provide the solder ball 82 on the side of the bottom surface 70a of the filling resin portion 70, there is a need to form, on the filling resin portion 70, the wiring layer 14 drawn from the electrode pad 11, the land portion used to place the solder ball 82, and the solder resist 16 used to define a position on which the solder ball 12 is placed, as in the case of the substrate portion of the semiconductor substrate 6. Further, when the solder ball 12 is provided on the surface of the semiconductor substrate 6, there is a need to form the insulation film 15 such as an oxide film or a nitride film, such that the wiring layer 14 is not in direct contact with the silicon substrate. It is possible to form the wiring layer 14 directly on the filling resin portion 70 since a thermoplastic resin of which the filling resin portion 70 is made naturally has good insulating properties.

Thus, in the solid-state imaging device 81 according to the present embodiment, an on-resin wiring portion 14c is provided on the bottom surface 70a of the filling resin portion 70 as a portion of the wiring layer 14. The on-resin wiring portion 14c is formed directly on the filling resin portion 70 without an insulation film such as an oxide film or a nitride film. For example, the on-resin wiring portion 14c is formed in a grid pattern correspondingly to the layout of the solder balls 82 arranged in an array. Specifically, in a cross-sectional view illustrated in FIG. 1, the solid-state imaging device 81 includes a solder ball 82A and a solder ball 82B as the solder ball 82, the solder ball 82A being provided on an extension portion 14d of the planar wiring portion 14b that extends to be provided on the filling resin portion 70, the solder ball 82B being provided on the on-resin wiring portion 14c existing on the filling resin portion 70 as an independent portion in the cross-sectional view.

Further, the solid-state imaging device 81 according to the present embodiment includes, in the solder resist 16, a resin covering portion 16c that is formed to cover the bottom surface 70a of the filling resin portion 70.

The solid-state imaging device 81 according to the present embodiment described above is formed as a WCSP structure having the following configuration. In other words, the solid-state imaging device 81 includes the semiconductor substrate 6, the filling resin portion 70, the wiring layer 14, the solder ball 82, the partition wall 4, and the glass 3. The concave portion 20 is formed on the side of the back surface of the semiconductor substrate 6, and the image sensor element is formed on the side of the front surface of the semiconductor substrate 6. The filling resin portion 70 is filled into the concave portion 20 and formed to be flush with the back surface 2b. Due to the formation of the filling resin portion 70, the semiconductor substrate 6 has the same size as its original outer size. The wiring layer 14 is connected to the electrode pad 11 and provided to extend onto the filling resin portion 70. On the filling resin portion 70, the solder ball 82 is formed on the wiring layer 14 through the land portion (of which an illustration is omitted). The partition wall 4 is formed to surround the image sensor element of the semiconductor substrate 6, and isolates, from the outside and as the cavity 5, the space situated above the portion in which the image sensor element is formed. The glass 3 is bonded on the partition wall 4.

<8. Method for Producing Solid-State Imaging Device According to Third Embodiment>

An example of a method for producing the solid-state imaging device 81 according to the third embodiment of the present disclosure is described with reference to FIGS. 22A, 22B, 23A, and 23B. The method for producing the solid-state imaging device 81 according to the present embodiment is different from the above-described modification of the method for producing the solid-state imaging device 51 according to the second embodiment in including a process of providing the solder ball 82 on the filling resin portion 70.

In other words, the method for producing the solid-state imaging device 81 according to the present embodiment includes a process of placing the solder ball 82 on the side of the surface (the side of the bottom surface 70a) of the filling resin portion 70, the solder ball 82 being used to mount the image sensor 2, the process of placing the solder ball 82 being performed before a process of performing dicing to obtain separate chips.

With respect to the processes up to the process of forming the second insulation film 55 that covers the inner surface of the through hole 40c and includes the contact hole 55a, and the opening 55b corresponding to the opening of the concave portion 20, the method for producing the solid-state imaging device 81 according to the present embodiment is the same as the modification of the method for producing the solid-state imaging device 51 according to the second embodiment described above.

Figure 22A:
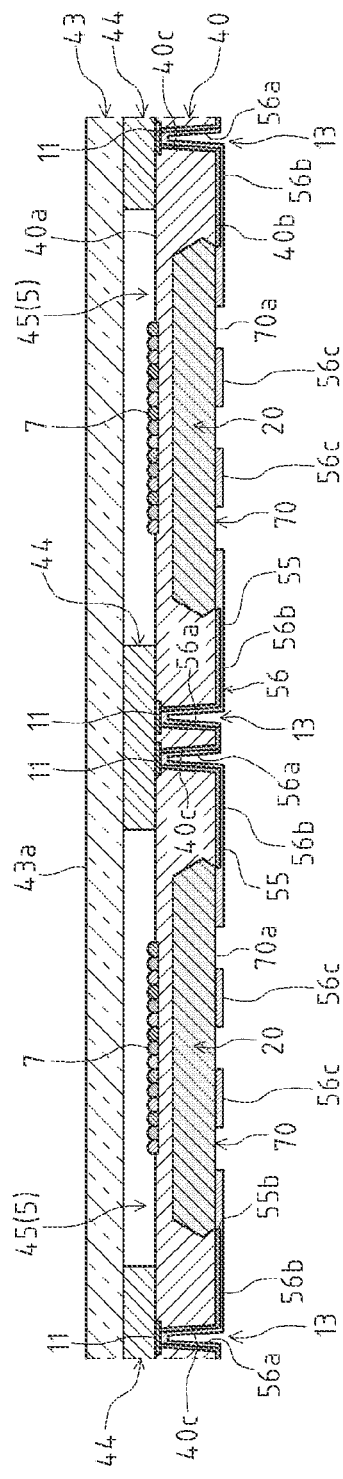
FIGS. 22A and 22B are diagrams describing a method for producing the solid-state imaging device according to the third embodiment of the present technology.

After the second insulation film 55 is formed, the copper wiring layer 56 corresponding to the wiring layer 14 in the solid-state imaging device 81 is formed on the side of the back surface 40b of the silicon wafer 40, as illustrated in FIG. 22A. The copper wiring layer 56 is used to form the solder ball 82 on the side of the back surface 40b of the silicon wafer 40 in a WCSP structure.

In other words, in the solid-state imaging device 81 according to the present embodiment, the copper wiring layer 56 extends from the back surface of the electrode pad 11 to pass through the through hole 40c, and the solder ball 82 is connected to the extension portion of the copper wiring layer 56. The copper wiring layer 56 includes the in-hole wiring portion 56a that corresponds to the in-hole wiring portion 14a (refer to FIG. 20), the planar wiring portion 56b that is formed along the back surface 40b and corresponds to the planar wiring portion 14b including the extension portion 14d (refer to FIG. 20), and an on-resin wiring portion 56c that corresponds to the on-resin wiring portion 14c (refer to FIG. 20), in order to provide the solder ball 82 on the lower side of the filling resin portion 70. The copper wiring layer 56 is formed by, for example, electroplating as described above.

Figure 22B:
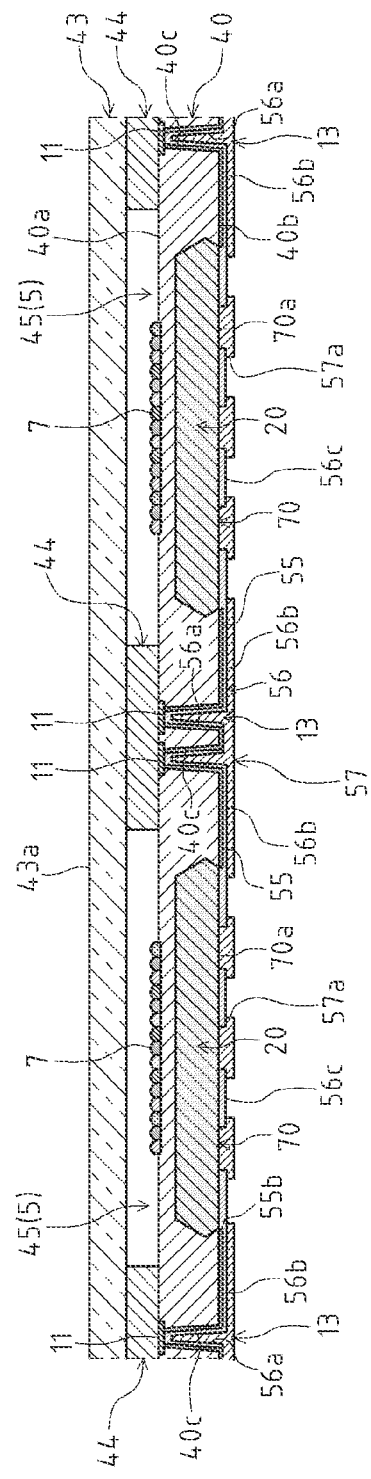

Next, the process of forming the solder resist 57 including the land opening 57a is performed, as illustrated in FIG. 22B. The solder resist 57 is formed to prevent a short circuit caused in wiring of the copper wiring layer 56 and to define a position on which the solder ball 82 is placed. In the solder resist 57, the land opening 57a from which the copper wiring layer 56 is exposed is formed in a portion on which the solder ball 82 is placed, such that the land opening 57a fits the size of the solder ball 82.

In the present embodiment, the solder resist 57 is also formed on the bottom surface 70a of the filling resin portion 70 such that a portion that corresponds to the resin covering portion 16c in the solder resist 16 of the solid-state imaging device 81 is formed. The land openings 57a are formed at positions corresponding to the respective on-resin wiring portions 56c.

Figure 23A:
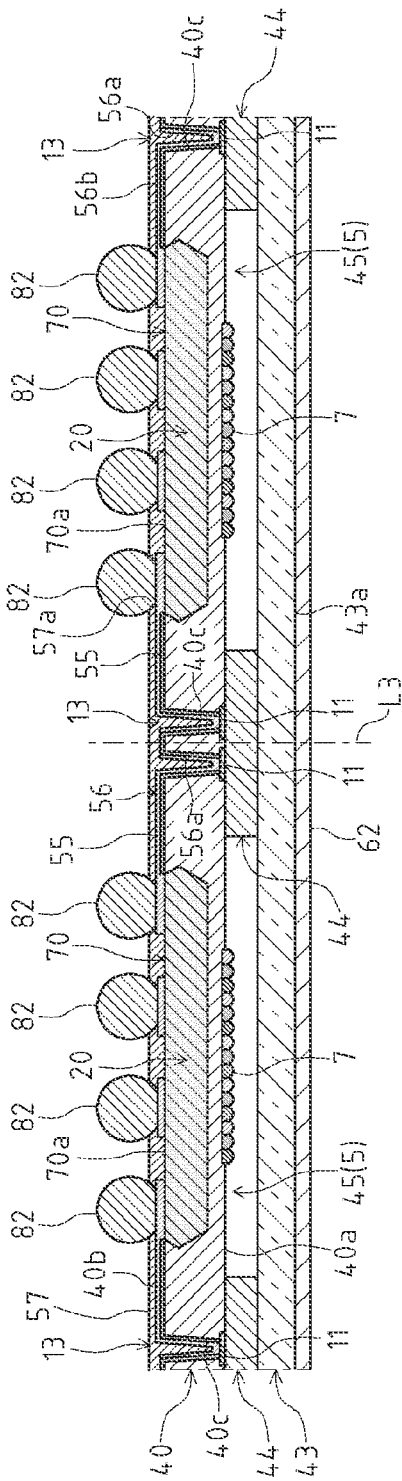
FIGS. 23A and 23B are diagrams describing the method for producing the solid-state imaging device according to the third embodiment of the present technology.

Thereafter, correspondingly to the planar wiring portion 56b and the on-resin wiring portion 56c, the solder ball 82 is formed in a region that is situated on the filling resin portion 70 on a lower side of the solder resist 57 (on an upper side in-A of FIG. 23A), as illustrated in FIG. 23A. The solder ball 82 is formed in a similar manner to that of the solder ball 12 in the production method described above.

Figure 23B:
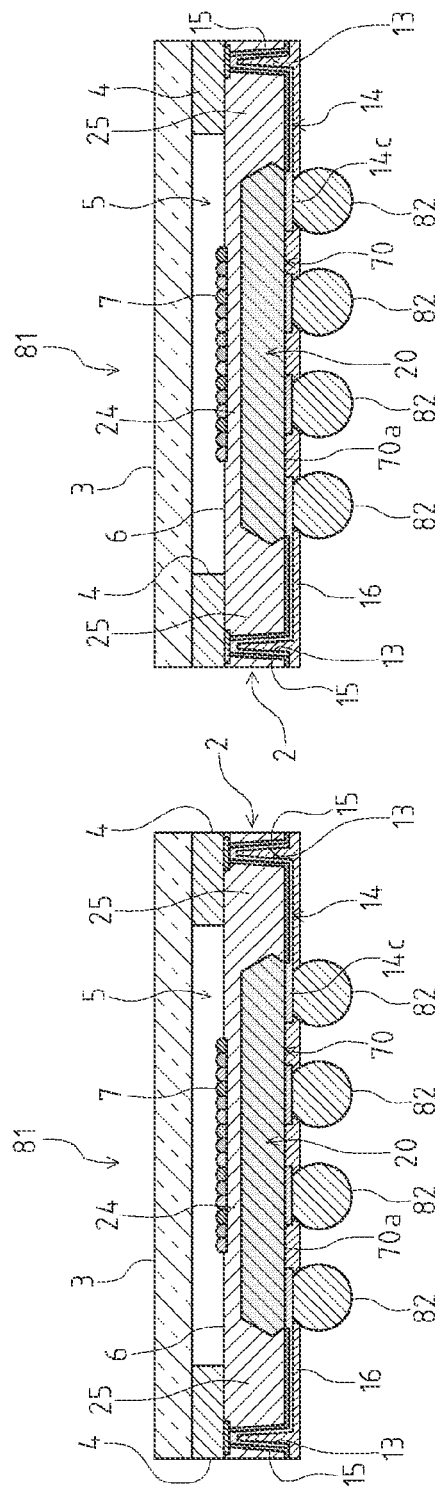

After the solder ball 82 is formed, dicing is performed along a specified dicing line L3. This results in obtaining a plurality of solid-state imaging devices 81 each having a package structure that includes the image sensor 2 including the concave portion 20 formed on the side of the back surface 2b, the glass 3, the partition wall 4, and the cavity 5 between the image sensor 2 and the glass 3, and further including, in the concave portion 20, the filling resin portion 70 on which the solder ball 82 is placed, as illustrated in FIG. 23B.

The solid-state imaging device 81 according to the present embodiment and the method for producing the solid-state imaging device 81 as described above provide the following effects in addition to the effects provided by the solid-state imaging device 1 and the method for producing the solid-state imaging device 1 according to the first embodiment.

In other words, due to the solid-state imaging device 81 according to the present embodiment including, in the concave portion 20, the filling resin portion 70 made of a thermoplastic resin, it is possible to reinforce a package structure at room temperature and to suppress an excessive increase in cavity internal pressure at a high temperature, as in the case of the solid-state imaging device 51 according to the second embodiment.

Figure 24:
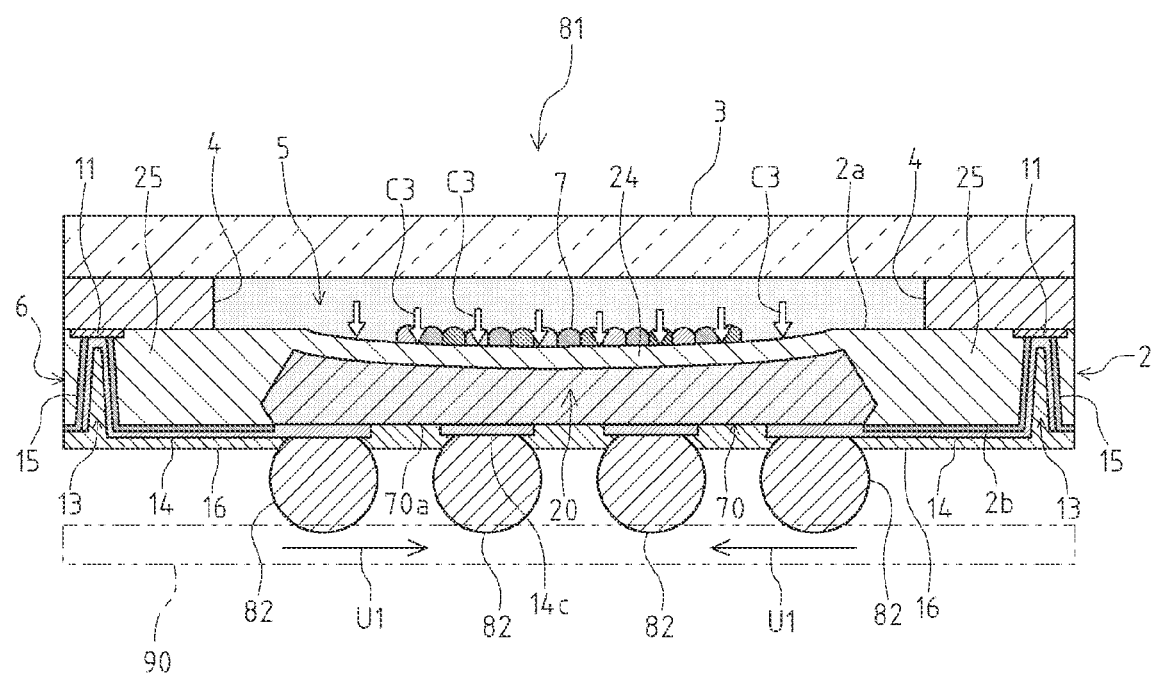

Specifically, pressure is imposed on the side of the front surface 2a of the image sensor 2 when there is an increase in cavity internal pressure upon reflow (refer to an arrow C3), and the thin plate portion 24 is a primary portion, in the image sensor 2, that is bent outward with an increase in the cavity internal pressure, as illustrated in FIG. 24. Here, the thermoplastic properties of the filling resin portion 70 make it possible to increase the cavity volume without interfering with the deformation of the image sensor 2, and thus to suppress an excessive increase in cavity internal pressure that may cause the damage of the package structure.

Further, in the solid-state imaging device 81 according to the present embodiment, the cavity internal pressure $P_P$ at a specified peak temperature $T_P$ upon reflow performed to melt the solder ball 82 is less than the breaking-limit pressure $P_D$ that causes a crack of a member that forms the cavity 5 or unsticking of the stuck members that form the cavity 5, as in the case of the solid-state imaging device 1 according to the first embodiment.

Furthermore, recent image sensors tend to deal with a larger number of signals due to the speed of a signal becoming faster and due to the signal having multiple functions. The solid-state imaging device 81 according to the present embodiment makes it possible to, for example, arrange the solder balls 82 in an array on the filling resin portion 70, and thus to easily ensure quantity of solder balls 82.

Moreover, the solid-state imaging device 81 according to the present embodiment makes it possible to relieve stress caused under temperature cycling related to mounting of the solid-state imaging device 81 on a substrate, since the solder ball 82 is arranged on the filling resin portion 70 formed of a thermoplastic resin. This results in being able to prevent a fatigue failure of the solder ball 82, and to suppress a connection failure caused in a region situated around the solder ball 82. In other words, it is expected that the effect of extending the life of junction produced using the solder ball 82 since the filling resin portion 70 serves as a stress buffer layer under temperature cycling, and this makes it possible to improve the reliability regarding the mounting of the solid-state imaging device 81.

In general, a stress buffer layer is formed by the stress buffer layer of a thickness of, for example, about 50 to 80 μm overlapping a chip of the image sensor 2. This results in increasing the thickness of a package structure, and thus in preventing the package structure from being thinner. In this regard, the solid-state imaging device 81 according to the present embodiment enables the filling resin portion 70 to serve as a stress buffer layer for stress applied to the solder ball 82 without increasing the thickness of the image sensor 2.

An improvement in mounting reliability that is provided due to the solid-state imaging device 81 according to the present embodiment is described in detail with reference to FIG. 24. The following is a phenomenon that may be caused under temperature cycling: a thermal strain caused due to a difference in linear expansion coefficient between a package structure of the solid-state imaging device 81 and a mounting substrate 90 on which the solid-state imaging device 81 is mounted using the solder ball 82, is concentrated on the solder ball 82, and this may result in causing a fatigue failure in a junction produced using the solder ball 82. Here, the mounting substrate 90 is made of, for example, an organic material such as plastic, ceramics, or the like. Specifically, for example, the mounting substrate 90 has a structure in which copper wiring is provided to glass epoxy.

First, upon reflow, a linear expansion coefficient of a package itself of the solid-state imaging device 81 is considered constant. On the other hand, in general, a linear expansion coefficient of the mounting substrate 90 is larger than that of silicon, and the mounting substrate 90 greatly expands at a high temperature, since the mounting substrate 90 is made of an organic material.

After the solid-state imaging device 81 is mounted on the mounting substrate 90, the mounting substrate 90 tries to return to its original state. Thus, a residual stress is caused in a direction in which the mounting substrate 90 shrinks (refer to an arrow U1). Here, stress applied to a region situated around the solder ball 82 is reduced by being partially absorbed by the filling resin portion 70 that serves as a stress buffer layer.

Further, the mounting substrate 90 tries to further shrink in a mounting state in a low-temperature environment. Thus, the residual stress is increased. In this case, stress is also absorbed by the filling resin portion 70 serving as a stress buffer layer. On the other hand, the mounting substrate 90 tries to expand in the mounting state in a high-temperature environment. Thus, the residual stress is reduced.

As described above, stress applied to a region situated around the solder ball 82 in each state is primarily a residual stress caused due to a package itself of the solid-state imaging device 81 and the mounting substrate 90. According to the solid-state imaging device 81 of the present embodiment, stress caused under temperature cycling propagates from the mounting substrate 90 to the filling resin portion 70 through the solder ball 82 and the land portion, and is eventually absorbed by the filling resin portion 70. Thus, it is possible to prevent a fatigue failure of the solder ball 82, and to improve the mounting reliability of the solid-state imaging device 81.

<9. Configuration Example of Electronic Apparatus>

Figure 25:
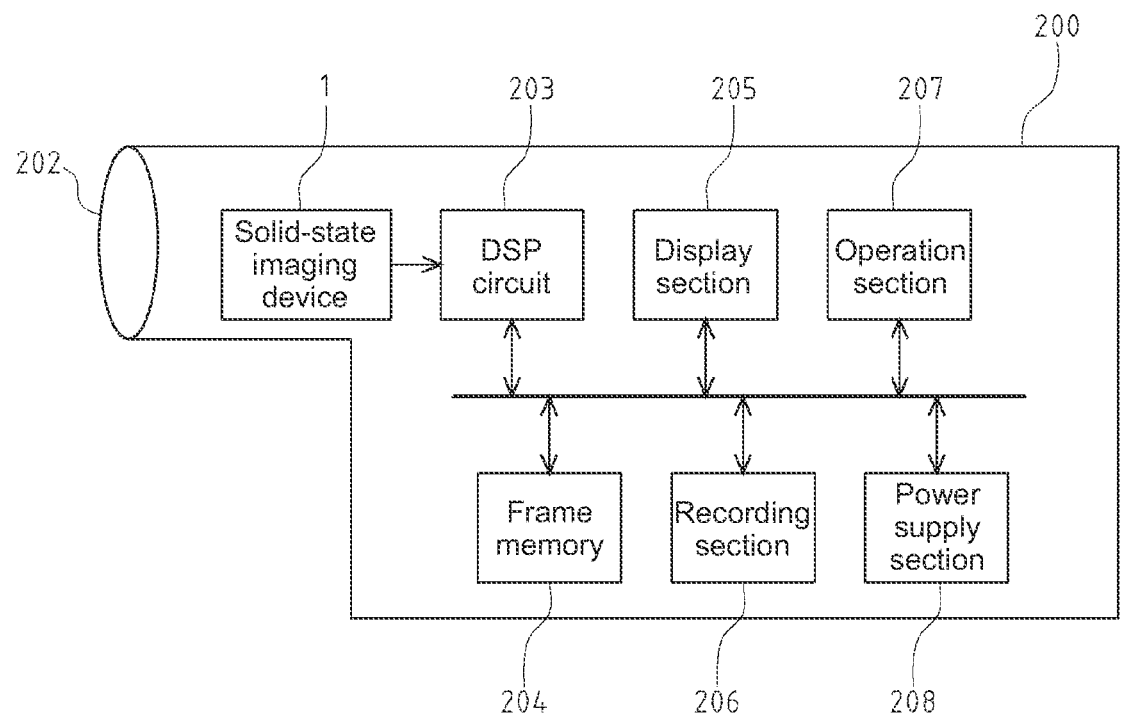

An example of applying the solid-state imaging device according to the embodiments described above to an electronic apparatus is described using FIG. 25. Note that, here, an example of applying the solid-state imaging device 1 according to the first embodiment is described.

The solid-state imaging device 1 is generally applicable to an electronic apparatus using a solid-state imaging element for an image-capturing section (a photoelectric converter), such as an image-capturing apparatus such as a digital still camera or a video camera, a portable terminal apparatus including an imaging function, and a copying machine using a solid-state imaging element for an image reader. The solid-state imaging element may be formed into a one-chip, or may be in the form of a module that includes an imaging function and in which an imaging section and a signal processor or an optical system are packaged together.

As illustrated in FIG. 25, an image-capturing apparatus 200 that is an electronic apparatus includes an optical section 202, the solid-state imaging device 1, a digital signal processor (DSP) circuit 203 that is a camera signal processing circuit, a frame memory 204, a display section 205, a recording section 206, an operation section 207, and a power supply section 208. The DSP circuit 203, the frame memory 204, the display section 205, the recording section 206, the operation section 207, and the power supply section 208 are connected to each other through a bus line 209.

The optical section 202 includes a plurality of lenses, and captures incident light from a subject (image light) to form an image of the incident light on an imaging surface of the solid-state imaging device 1. The solid-state imaging device 1 converts, per pixel and into an electric signal, an amount of the incident light of which the image is formed on the imaging surface by the optical section 202, and outputs the electric signal as a pixel signal.

The display section 205 is, for example, a panel display apparatus such as a liquid crystal panel or an organic electroluminescence (EL) panel, and displays thereon a moving image or a still image captured by the solid-state imaging device 1. On a recording medium such as a hard disk or a semiconductor memory, the recording section 206 records the moving image or the still image captured by the solid-state imaging device 1.

The operation section 207 issues an operation command for various functions of the image-capturing apparatus 200 in response to an operation performed by a user. The power supply section 208 supplies power to each of the DSP circuit 203, the frame memory 204, the display section 205, the recording section 206, and the operation section 207 as appropriate, the supplied power being used to operate these supply targets.

The image-capturing apparatus 200 described above makes it possible to prevent, in the solid-state imaging device 1, damage such as a crack of a structural member and unsticking of the stuck structural members from being caused due to an increase in cavity internal pressure, for example, upon reflow. This results in being able to obtain a high-quality captured image.

The descriptions of the embodiments described above are examples of the present technology, and the present technology is not limited to the embodiments described above. Thus, of course, various modifications may be made depending on the design and the like without departing from the technical idea according to the present disclosure even in the case of an embodiment other than the embodiments described above. Further, the effects described in the present disclosure are not limitative but are merely illustrative, and other effects may be provided. Furthermore, the modifications described in the respective embodiments described above may be combined as appropriate in an embodiment other than the respective embodiments described above.

In the embodiments described above, the package structure including the image sensor 2 has been described as an example. However, the present technology is applicable to any configuration having a hollow package structure. In other words, the application of the present technology to an apparatus configuration having a hollow package structure makes it possible to obtain an inexpensive, highly reliable package structure without changing the original package size.

Note that the present technology may take the following configurations.

(1) A solid-state imaging device, including:
a solid-state imaging element that includes a semiconductor substrate and of which a light-receiving side is a side of one of plate surfaces of the semiconductor substrate;
a translucent cover member that is provided on the light-receiving side of the solid-state imaging element to be spaced from the solid-state imaging element at a specified interval; and
a support that is provided on the light-receiving side of the solid-state imaging element, and supports the cover member on the solid-state imaging element to form a cavity between the solid-state imaging element and the cover member, the semiconductor substrate including a concave portion that is formed on another of the plate surfaces of the semiconductor substrate, the semiconductor substrate having a thickness partially reduced due to the formation of the concave portion.

(2) The solid-state imaging device according to (1), further including
a filling resin portion that is made of a thermoplastic resin and provided to be filled into the concave portion, the filling resin portion being deformed with the semiconductor substrate.

(3) The solid-state imaging device according to (2), further including
a solder portion that is provided on a side of a surface of the filling resin portion and used to mount the solid-state imaging element.

(4) The solid-state imaging device according to (2) or (3), in which
the thermoplastic resin is a paste composition that contains, as a primary component, one of a polyetherimide resin, a polyetheramide resin, and a polyetheramide-imide resin.

(5) The solid-state imaging device according to (2) or (3), in which
the thermoplastic resin is a paste composition obtained by adding a segment having plastic properties to one of a polyimide resin, a polyamide resin, and a polyamide-imide resin.

(6) The solid-state imaging device according to (2) or (3), in which
the thermoplastic resin is a paste composition that contains, as a primary component, one of a polyimide resin, a polyamide resin, and a polyamide-imide resin, and further contains thermoplastic resin particles.

(7) The solid-state imaging device according to any one of (1) to (6), in which
the concave portion includes a bottom face portion that is substantially parallel to the plate surface of the semiconductor substrate, and a lateral face portion that forms an inner surface of the concave portion, and
the lateral face portion includes a first inclined surface and a second inclined surface, the first inclined surface being inclined in a specified direction with respect to the plate surface of the semiconductor substrate, the second inclined surface forming a bent shape with the first inclined surface in a cross-sectional view of the semiconductor substrate.

(8) The solid-state imaging device according to any one of (1) to (6), in which
the concave portion includes a bottom face portion that is substantially parallel to the plate surface of the semiconductor substrate, and a lateral face portion that forms an inner surface of the concave portion, and
the lateral face portion includes a (111) plane or an equivalent plane of crystal of the semiconductor substrate.

(9) The solid-state imaging device according to any one of (1) to (8), further including
a solder portion that is provided on the other of the plate surfaces of the semiconductor substrate and used to mount the solid-state imaging element, in which
an internal pressure in the cavity at a specified peak temperature upon reflow performed to melt the solder portion is less than an internal pressure that causes a crack of a member that forms the cavity or unsticking of the stuck members that form the cavity.

(10) An electronic apparatus, including
a solid-state imaging device that includes a solid-state imaging element that includes a semiconductor substrate and of which a light-receiving side is a side of one of plate surfaces of the semiconductor substrate,
a translucent cover member that is provided on the light-receiving side of the solid-state imaging element to be spaced from the solid-state imaging element at a specified interval, and
a support that is provided on the light-receiving side of the solid-state imaging element, and supports the cover member on the solid-state imaging element to form a cavity between the solid-state imaging element and the cover member, the semiconductor substrate including a concave portion that is formed on another of the plate surfaces of the semiconductor substrate, the semiconductor substrate having a thickness partially reduced due to the formation of the concave portion.

(11) A method for producing a solid-state imaging device, the method including:
providing, thorough a wall, a translucent plate material on a side of one of plate surfaces of a semiconductor wafer to be spaced from the semiconductor wafer at a specified interval, the semiconductor wafer being a semiconductor wafer on which a group of pixels is formed on the side of the one of the plate surfaces of the semiconductor wafer, the semiconductor wafer being a semiconductor wafer in which a plurality of portions each being a solid-state imaging element is formed in a specified arrangement, the wall being formed along the specified arrangement to surround the group of pixels;
forming a concave portion on another of the plate surfaces of the semiconductor wafer correspondingly to the solid-state imaging element, the semiconductor wafer having a thickness partially reduced due to the formation of the concave portion; and
cutting a set of the semiconductor wafer, the wall, and the plate material into pieces such that the set is divided along the specified arrangement into portions that correspond to the respective solid-state imaging elements.

(12) The method for producing a solid-state imaging device according to (11), in which
the forming the concave portion includes
performing first etching including forming a semi-concave portion by removing a portion corresponding to the concave portion from the semiconductor wafer using dry etching, and
after the first etching, performing second etching including forming the concave portion by etching down into the semi-concave portion using anisotropic etching.

(13) The method for producing a solid-state imaging device according to (11) or (12), further including
before the cutting the set into pieces, forming a filling resin portion in the concave portion by filling the concave portion with a thermoplastic resin, the filling resin portion being deformed with a semiconductor substrate that forms the solid-state imaging element.

(14) The method for producing a solid-state imaging device according to (13), further including
before the cutting the set into pieces, placing a solder portion on a side of a surface of the filling resin portion, the solder portion being used to mount the solid-state imaging element.

REFERENCE SIGNS LIST 1 solid-state imaging device
2 image sensor (solid-state imaging element)
2a front surface
2b back surface
3 glass (cover member)
4 partition wall (support)
5 cavity
6 semiconductor substrate
7 pixel
8 pixel region
14 wiring layer
20 concave portion
20X semi-concave portion
21 bottom face portion
22 lateral face portion
31 first inclined surface
32 second inclined surface
40 silicon wafer (semiconductor wafer)
43 glass plate (plate material)
44 wall
51 solid-state imaging device
70 filling resin portion
70a bottom surface
75 sealing resin
81 solid-state imaging device
82 solder ball (solder portion)
200 image-capturing apparatus (electronic apparatus)

The invention claimed is:
1. A solid-state imaging device, comprising:
a solid-state imaging element having a light-receiving side, wherein:
the solid-state imaging element includes:
a semiconductor substrate, and
an image sensor element on a first plate surface of plate surfaces of the semiconductor substrate, and
the light-receiving side of the solid-state imaging element is a side of the first plate surface;
a translucent cover member on the light-receiving side of the solid-state imaging element, wherein the translucent cover member is spaced apart from the solid-state imaging element at a specified interval;
a support on the light-receiving side of the solid-state imaging element, wherein:
the support is configured to support the translucent cover member on the solid-state imaging element to form a cavity between the solid-state imaging element and the translucent cover member,
the semiconductor substrate includes:
a concave portion on a side of a second plate surface of the plate surfaces of the semiconductor substrate,
a first plate portion different from the image sensor element, and
a second plate portion that has a thickness greater than a thickness of the first plate portion in a direction perpendicular to the first plate surface, and
the side of the second plate surface is different from the light-receiving side of the solid-state imaging element; and
a filling resin portion that includes a thermoplastic resin, wherein:
the filling resin portion contacts the first plate portion and second plate portion in the concave portion.

2. The solid-state imaging device according to claim 1, further comprising a solder portion on a side of a surface of the filling resin portion and used to mount the solid-state imaging element.

3. The solid-state imaging device according to claim 1, wherein the thermoplastic resin is a paste composition that contains, as a primary component, one of a polyetherimide resin, a polyetheramide resin, or a polyetheramide-imide resin.

4. The solid-state imaging device according to claim 1, wherein the thermoplastic resin is a paste composition obtained by addition of a segment that has plastic properties to one of a polyimide resin, a polyamide resin, or a polyamide-imide resin.

5. The solid-state imaging device according to claim 1, wherein:
the thermoplastic resin is a paste composition that contains, as a primary component, one of a polyimide resin, a polyamide resin, or a polyamide-imide resin, and
the paste composition further contains thermoplastic resin particles.

6. The solid-state imaging device according to claim 1, wherein:
the concave portion includes a bottom face portion that is substantially parallel to the first plate surface of the semiconductor substrate, and a lateral face portion that forms an inner surface of the concave portion,
the lateral face portion includes a first inclined surface and a second inclined surface,
the first inclined surface is inclined in a specified direction with respect to the first plate surface of the semiconductor substrate, and
the second inclined surface forms a bent shape with the first inclined surface in a cross-sectional view of the semiconductor substrate.

7. The solid-state imaging device according to claim 1, wherein:
the concave portion includes a bottom face portion that is substantially parallel to the first plate surface of the semiconductor substrate, and a lateral face portion that forms an inner surface of the concave portion, and
the lateral face portion includes a (111) plane or an equivalent plane of crystal of the semiconductor substrate.

8. An electronic apparatus, comprising:
a solid-state imaging device that includes:
a solid-state imaging element having a light-receiving side, wherein:
the solid-state imaging element includes:
a semiconductor substrate, and
an image sensor element on a first plate surface of plate surfaces of the semiconductor substrate, and
the light-receiving side of the solid-state imaging element is a side of the first plate surface;
a translucent cover member on the light-receiving side of the solid-state imaging element, wherein the translucent cover member is spaced apart from the solid-state imaging element at a specified interval;
a support on the light-receiving side of the solid-state imaging element, wherein:
the support is configured to support the translucent cover member on the solid-state imaging element to form a cavity between the solid-state imaging element and the translucent cover member,
the semiconductor substrate includes:
a concave portion on a side of a second plate surface of the plate surfaces of the semiconductor substrate,
a first plate portion different from the image sensor element, and
a second plate portion that has a thickness greater than a thickness of the first plate portion in a direction perpendicular to the first plate surface, and the side of the second plate surface is different from the light-receiving side of the solid-state imaging element; and
a filling resin portion that includes a thermoplastic resin, wherein:
the filling resin portion contacts the first plate portion and second plate portion in the concave portion.

9. A solid-state imaging device, comprising:
a solid-state imaging element having a light-receiving side, wherein:
the solid-state imaging element includes:
a semiconductor substrate, and
an image sensor element on a first plate surface of plate surfaces of the semiconductor substrate, and
the light-receiving side of the solid-state imaging element is a side of the first plate surface;
a translucent cover member on the light-receiving side of the solid-state imaging element, wherein the translucent cover member is spaced apart from the solid-state imaging element at a specified interval;
a support on the light-receiving side of the solid-state imaging element, wherein:
the support supports the translucent cover member on the solid-state imaging element to form a cavity between the solid-state imaging element and the translucent cover member, and
the semiconductor substrate includes:
a concave portion on a side of a second plate surface of the plate surfaces of the semiconductor substrate,
a first plate portion different from the image sensor element, and
a second plate portion that has a thickness greater than a thickness of the first plate portion in a direction perpendicular to the first plate surface;
a filling resin portion that includes a thermoplastic resin, wherein:
the filling resin portion contacts the first plate portion and second plate portion in the concave portion, and
the filling resin portion is deformable with the semiconductor substrate; and
a solder portion on a side of a surface of the filling resin portion and used to mount the solid-state imaging element.

10. The solid-state imaging device according to claim 1, further comprising:
a wiring layer in a hole that passes through the plate surfaces of the semiconductor substrate; and
a solder portion on the side of the second plate surface of the semiconductor substrate, wherein the solder portion is electrically connected to a terminal of the solid-state imaging element via the wiring layer.

11. The solid-state imaging device according to claim 1, wherein the filling resin portion is deformable with the semiconductor substrate.

* * * * *